US012677476B2

(12) United States Patent
Lin et al.

(10) Patent No.: US 12,677,476 B2
(45) Date of Patent: Jul. 7, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Ta-Chun Lin, Hsinchu (TW); Jhon-Jhy Liaw, Zhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 452 days.

(21) Appl. No.: 18/182,766

(22) Filed: Mar. 13, 2023

(65) Prior Publication Data

US 2024/0312992 A1 Sep. 19, 2024

(51) Int. Cl.
| | |
|---|---|
| *H10D 84/85* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 62/17* | (2025.01) |
| *H10D 64/01* | (2025.01) |
| *H10D 84/01* | (2026.01) |
| *H10D 84/03* | (2025.01) |

(52) U.S. Cl.
CPC ........... *H10D 84/85* (2025.01); *H10D 30/014* (2025.01); *H10D 30/43* (2025.01); *H10D 30/6735* (2025.01); *H10D 62/121* (2025.01); *H10D 62/151* (2025.01); *H10D 62/292*

(2025.01); *H10D 64/017* (2025.01); *H10D 84/0167* (2025.01); *H10D 84/017* (2025.01); *H10D 84/038* (2025.01)

(58) Field of Classification Search
CPC .. H10D 64/017; H10D 64/518; H10D 30/014; H10D 30/43; H10D 30/6735; H10D 30/6757; H10D 84/0128; H10D 84/0142; H10D 84/83
USPC ......................................................... 257/351
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |

(Continued)

*Primary Examiner* — Fazli Erdem
(74) *Attorney, Agent, or Firm* — Cooper Legal Group, LLC

(57) ABSTRACT

Semiconductor structures and methods for manufacturing the same are provided. The semiconductor structure includes first channel layers formed over a substrate along a first direction, and second channel layers adjacent to the first channel layers and over the substrate. The semiconductor structure includes a first gate structure formed over the first channel layers along a second direction. The semiconductor structure also includes a first gate spacer layer formed adjacent to the first gate structure, and a first thickness of the first channel layers directly below the first gate structure is smaller than a second thickness of the second channel layers directly below the first gate spacer layer

20 Claims, 73 Drawing Sheets

(56) References Cited

U.S. PATENT DOCUMENTS

| | | | |
|---|---|---|---|
| 9,536,738 | B2 | 1/2017 | Huang et al. |
| 9,576,814 | B2 | 2/2017 | Wu et al. |
| 9,608,116 | B2 | 3/2017 | Ching et al. |
| 2017/0170331 | A1* | 6/2017 | Liang ..................... H10B 10/18 |
| 2020/0168715 | A1* | 5/2020 | Wu ................... H01L 21/30604 |
| 2021/0043727 | A1* | 2/2021 | Frougier ............... H10D 30/43 |
| 2021/0098455 | A1* | 4/2021 | Yu ..................... H10D 84/0177 |
| 2021/0184001 | A1* | 6/2021 | Trivedi ............. H10D 30/6757 |
| 2022/0302275 | A1* | 9/2022 | Yu ..................... H10D 30/6757 |
| 2023/0317784 | A1* | 10/2023 | Lee .................. H01L 21/02304 |
| | | | 257/288 |
| 2025/0107159 | A1* | 3/2025 | Jeong .................. H10D 62/116 |

* cited by examiner

SEMICONDUCTOR STRUCTURE AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 3A-2 to 3O-2 illustrate cross-sectional representations of various stages of manufacturing the semiconductor structure shown along line B-B', C-C; and D-D' in FIGS. 1E, 2A and 2B, in accordance with some embodiments.

FIGS. 3A-3 to 3O-3 illustrate cross-sectional representations of various stages of manufacturing the semiconductor structure shown along line $E_1$-$E_1$', $E_2$-$E_2$' and $E_3$-$E_3$' in FIGS. 1E, 2A and 2B, in accordance with some embodiments.

FIGS. 3N-4 to 3O-4 illustrate cross-sectional representations of various stages of manufacturing the semiconductor structure shown along line F-F' and line G-G' in FIGS. 1E and 2A, in accordance with some embodiments.

FIGS. 4 and 5 illustrate cross-sectional representations of various stages of manufacturing a semiconductor structure, in accordance with some embodiments.

FIGS. 7A-1 to 7B-1 illustrate cross-sectional representations of various stages of manufacturing the semiconductor structure shown along line A-A' in FIG. 6A and in FIG. 6B, in accordance with some embodiments.

FIGS. 7A-2 to 7B-2 illustrate cross-sectional representations of various stages of manufacturing the semiconductor structure shown along line B-B' and line C-C' in FIG. 6A and in FIG. 6B, in accordance with some embodiments.

FIGS. 7A-3 to 7B-3 illustrate cross-sectional representations of various stages of manufacturing the semiconductor structure shown along line $E_1$-$E_1$' and $E_2$-$E_2$' in FIG. 6A and in FIG. 6B, in accordance with some embodiments.

DETAILED DESCRIPTION

Figure 1A:
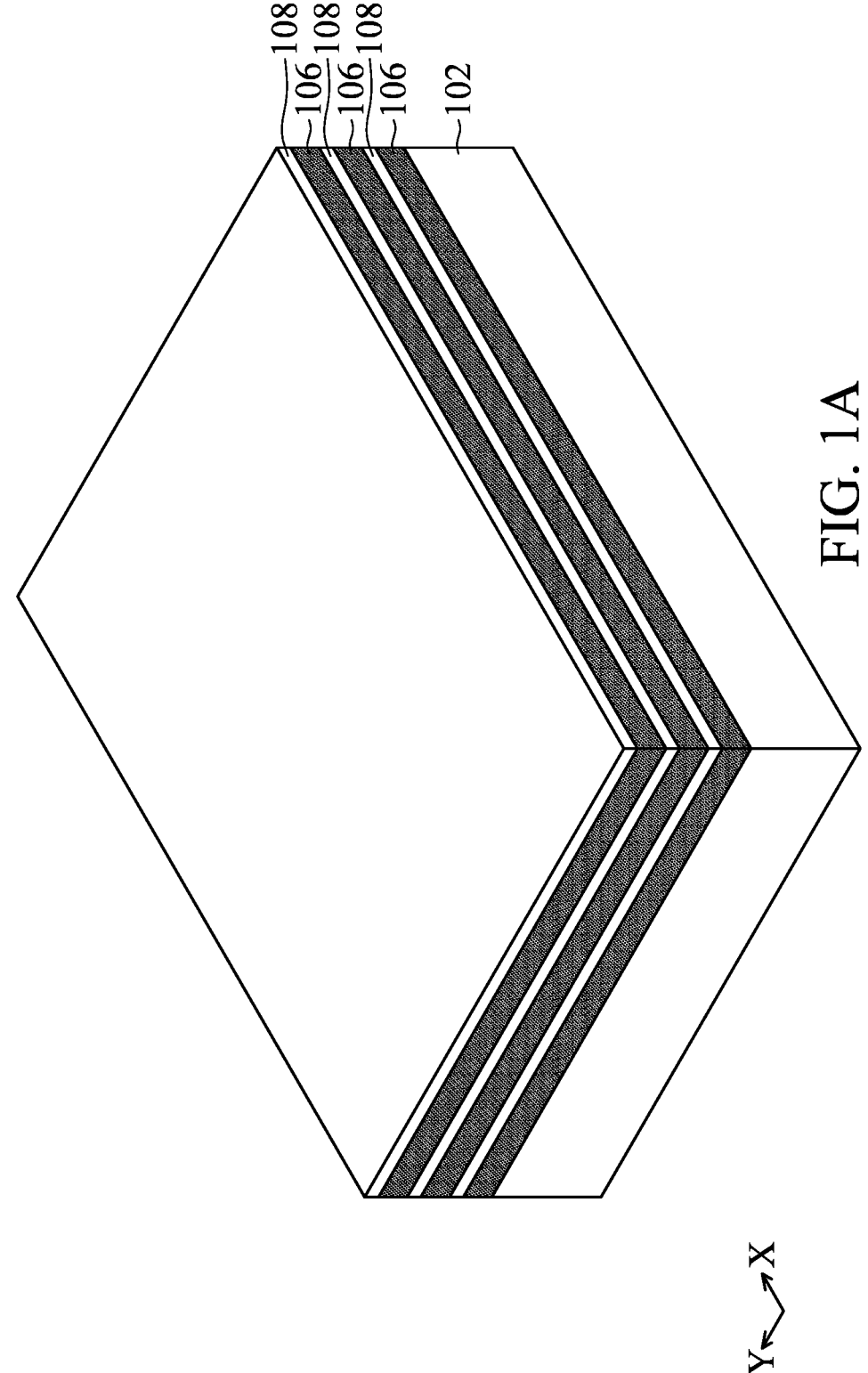
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a first fin structure and a second fin structure formed over a substrate. The first fin structure includes first nanostructures, and the second fin structure includes second nanostructures along a first direction (e.g. x-axis). A first gate structure formed over the first nanostructures and a first S/D structure adjacent to the first gate structure. A second gate structure formed over the second nanostructures along the second direction (e.g. y-axis). A gate spacer layer is adjacent to the gate structure. One of the first nanostructures has a first thickness directly below the first gate structure along a vertical direction, and one of the second nanostructures has a second thickness directly below the second gate structure along the vertical direction. The first thickness is smaller than the second thickness. In addition, the first width of the first nanostructures along the second direction is smaller than the second width of the second nanostructures along the second direction. In order to fulfill different needs in different regions, the first gate structure is formed for power efficiency, and the second gate structure is formed for high speed performance. The first gate structure and second gate structure co-exist to achieve multi-nanostructures for speed performance and power efficiency. Therefore, the performance of the semiconductor structure is improved. The source/drain(S/D) structure or region(s) may refer to a source or a drain, individually or collectively dependent upon the context.

FIGS. 1A to 1E illustrate perspective views of intermediate stages of manufacturing a semiconductor structure 100a, in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers 108. In some embodiments, the thickness of each of the first semiconductor material layers 106 is substantially equal to the thickness of each of the second semiconductor material layers 108.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
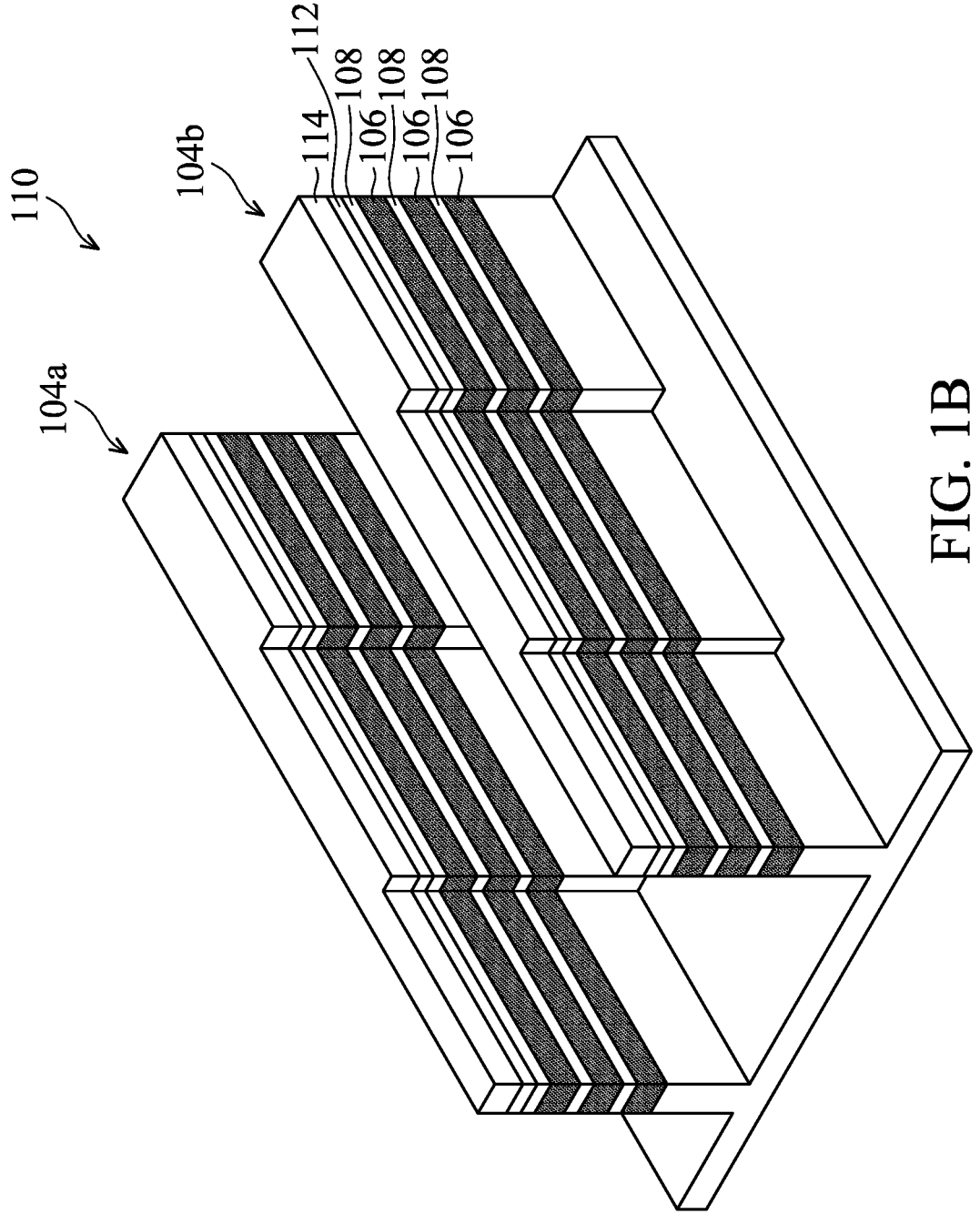

Afterwards, as shown in FIG. 1B, after the first semiconductor material layers 106 and the second semiconductor material layers 108 are formed as a semiconductor material stack over the substrate 102, the semiconductor material stack is patterned to form a first fin structure 104a and a second fin structure 104b, in accordance with some embodiments. In some embodiments, each of the first fin structure 104a and a second fin structure 104b includes a base fin structure 105 and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or chemical vapor deposition (CVD), and the nitride layer 114 may be made of silicon nitride, which is formed by chemical vapor deposition (CVD), such as low-temperature chemical vapor deposition (LPCVD) or plasma-enhanced CVD (PECVD).

Figure 1C:
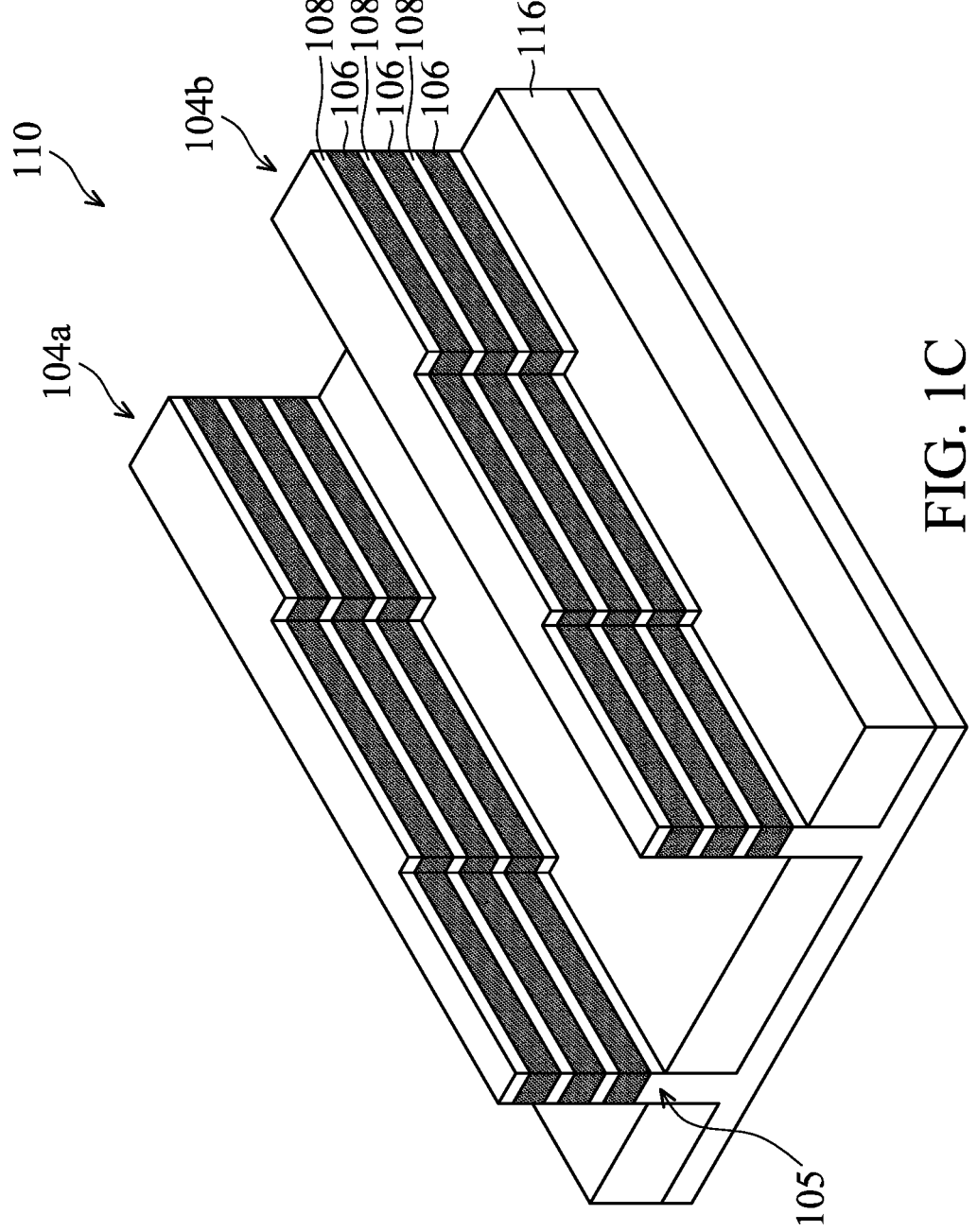

Next, as shown in FIG. 1C, after the first fin structure 104a and the second fin structure 104b is formed, an isolation structure 116 is formed around first fin structure 104a and the second fin structure 104b, and the mask structure 110 is removed, in accordance with some embodiments. The isolation structure 116 is configured to electrically isolate active regions (e.g. the first fin structure 104a and the second fin structure 104b) of the semiconductor structure 100a and is also referred to as shallow trench isolation (STI) feature in accordance with some embodiments.

The isolation structure 116 may be formed by depositing an insulating layer over the substrate 102 and recessing the insulating layer so that the first fin structure 104a and the second fin structure 104b is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
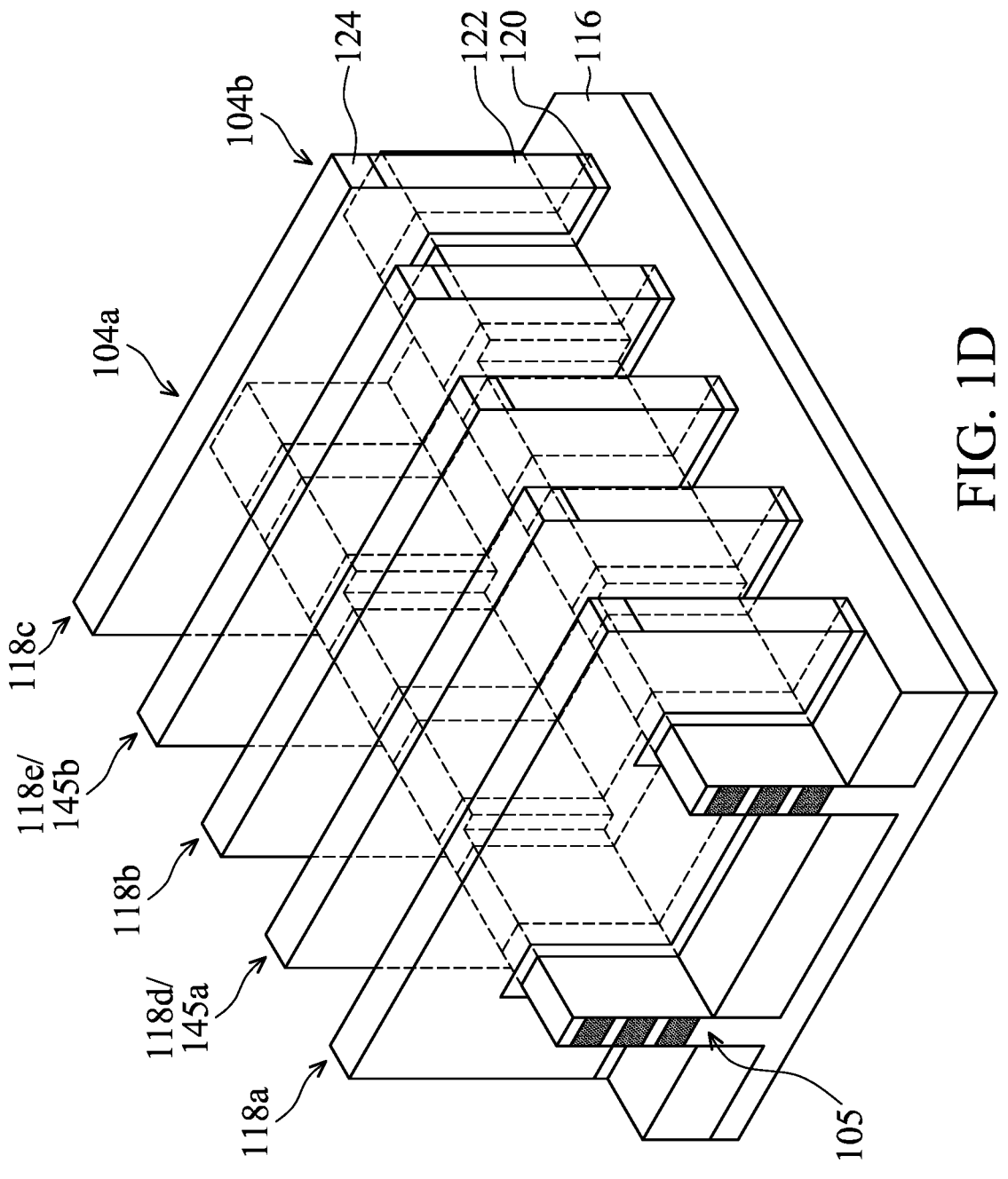

Afterwards, as shown in FIG. 1D, after the isolation structure 116 is formed, a first dummy gate structure 118a, a second dummy gate structure 118b, a third dummy gate structure 118c, a fourth dummy gate structure 118d and a fifth dummy gate structure 118e are formed across the first fin structure 104a and the second fin structure 104b and extend over the isolation structure 116, in accordance with some embodiments.

In some embodiments, each of the first dummy gate structure 118a, the second dummy gate structures 118b, the third dummy gate structure 118c, the fourth dummy gate structure 118d and the fifth dummy gate structure 118e includes dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1E:
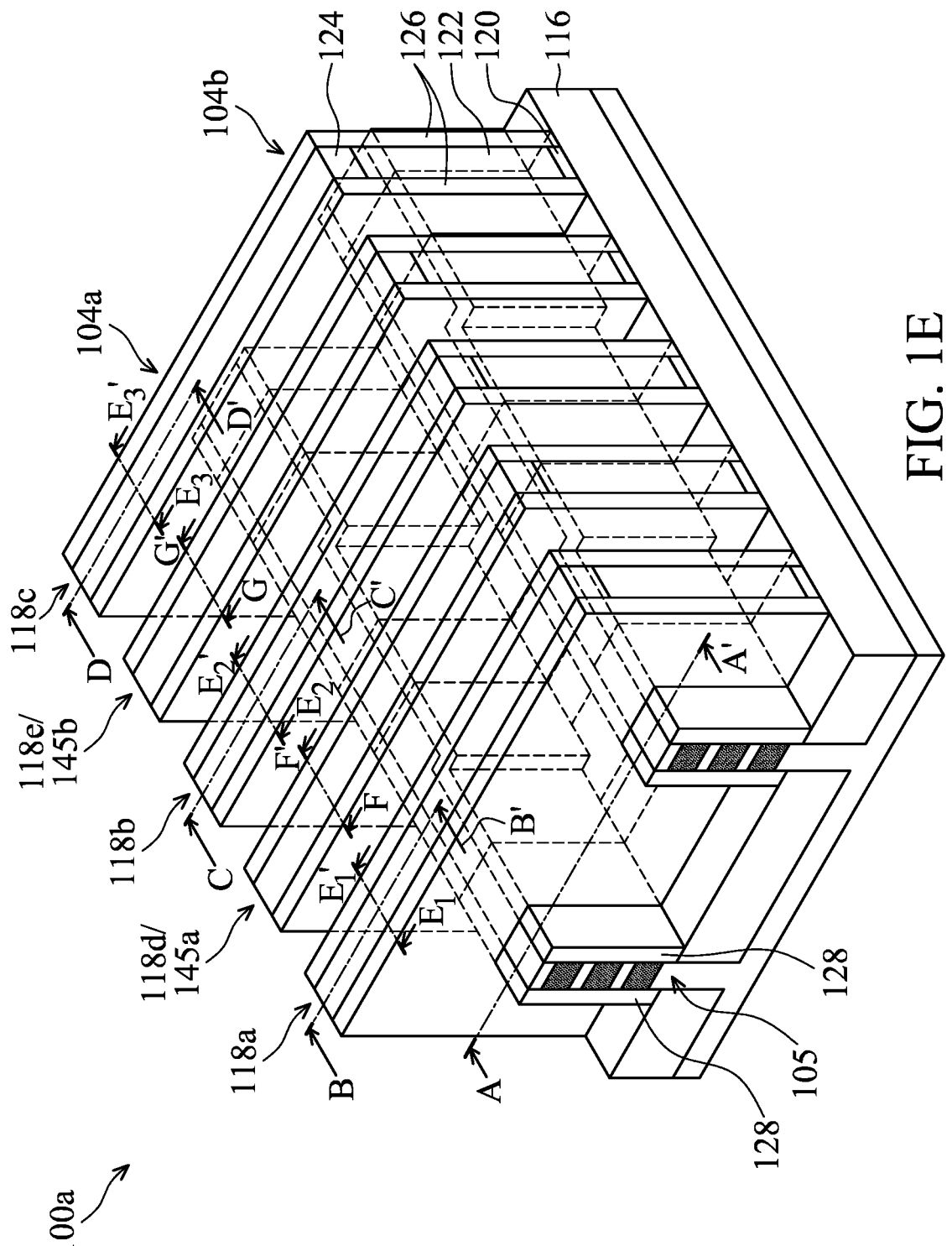

Next, as shown in FIG. 1E, after the dummy gate structures 118a, 118b, 118c, 118d, 118e are formed, gate spacer layers 126 are formed along and covering opposite sidewalls of the dummy gate structure 118 and fin spacer layers 128 are formed along and covering opposite sidewalls of the source/drain regions of the fin structure 104, in accordance with some embodiments.

The gate spacer layers 126 may be configured to separate source/drain (S/D) structures from the first dummy gate structure 118a, the second dummy gate structures 118b and support the first dummy gate structure 118a, the second dummy gate structures 118b. The fin space layers 128 may be configured to constrain a lateral growth of subsequently formed source/drain structure and support the first fin structure 104a and the second fin structure 104b.

In some embodiments, the gate spacer layers 126 and the fin spacer layers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacer layers 126 and the fin spacer layers 128 may include conformally depositing a dielectric material covering the first dummy gate structure 118a, the second dummy gate structure 118b, the first fin structure 104a, the second fin structure 104b and the isolation structure 116 over the substrate 102, and performing an anisotropic etching process, such as dry plasma etching, to remove the dielectric layer covering the top surfaces of the first dummy gate structure 118a, the second dummy gate structure 118b, the first fin structure 104a, the second fin structure 104b, and portions of the isolation structure 116.

Figure 2A:
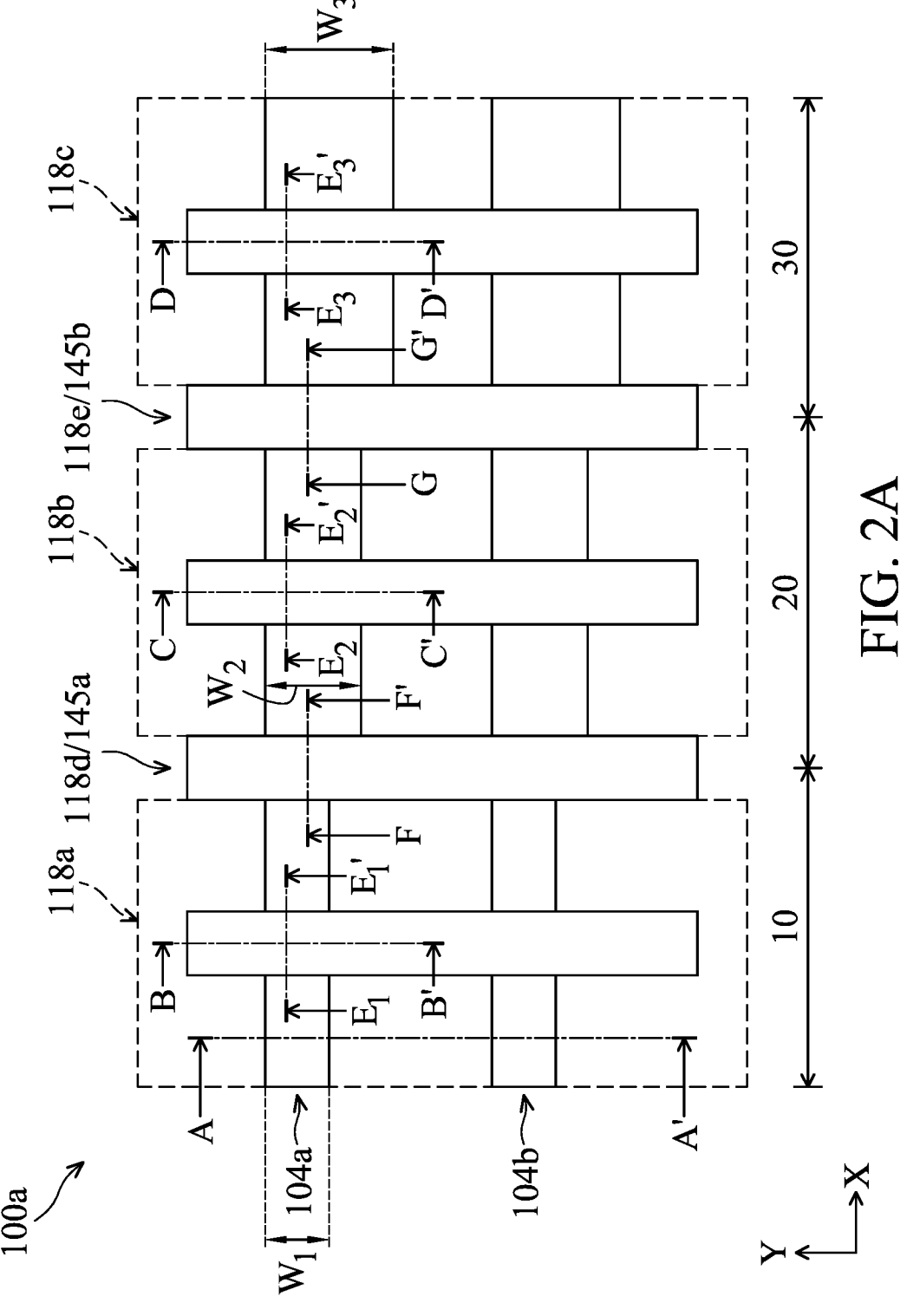
FIG. 2A shows a top-view representation of a semiconductor structure, in accordance with some embodiments.

FIG. 2A shows a top-view representation of the semiconductor structure 100a, in accordance with some embodiments. As shown in FIG. 2A, the substrate 102 includes a first region 10, a second region 20 and a third region 30. The first fin structure 104a is formed along a first direction (e.g. X-axis), and the second fin structure 104b is also formed along the first direction (e.g. X-axis). The first fin structure 104a is a continuous structure which extends from the first region 10 to the third region 30. The second fin structure 104b is a continuous structure which extends from the first region 10 to the third region 30.

The first fin structure 104a has different widths in different regions. The first fin structure 104a has a first width $W_1$ in the first region 10, a second width $W_2$ in the second region 20 and a third width $W_3$ in the third region 30. The second fin structure 104b has a first width $W_1$ in the first region 10, a second width $W_2$ in the second region 20 and a third width $W_3$ in the third region 30. In some embodiments, the first width $W_1$ is smaller than the second width $W_2$, and the second width $W_2$ is smaller than the third width $W_3$. In some embodiments, a ratio of the second width $W_2$ to the first width $W_1$ is in a range from about 1.1 to about 3. In some embodiments, a ratio of the third width $W_3$ to the second width $W_2$ is in a range from about 1.1 to about 3.

The first dummy gate structure 118a, the second dummy gate structure 118b, the third dummy gate structure 118c, the fourth dummy gate structure 118d and the fifth dummy gate structure 118e are formed along a second direction (e.g. Y-axis). The first dummy gate structure 118a, the second dummy gate structure 118b, the third dummy gate structure 118c, the fourth dummy gate structure 118d and the fifth dummy gate structure 118e are formed across the first fin structure 104a and the second fin structure 104b. The fourth dummy gate structure 118d will be replaced with a first dielectric structure 145a in the following steps, and fifth dummy gate structure 118e will be replaced with a second dielectric structure 145b in the following steps.

Figure 2B:
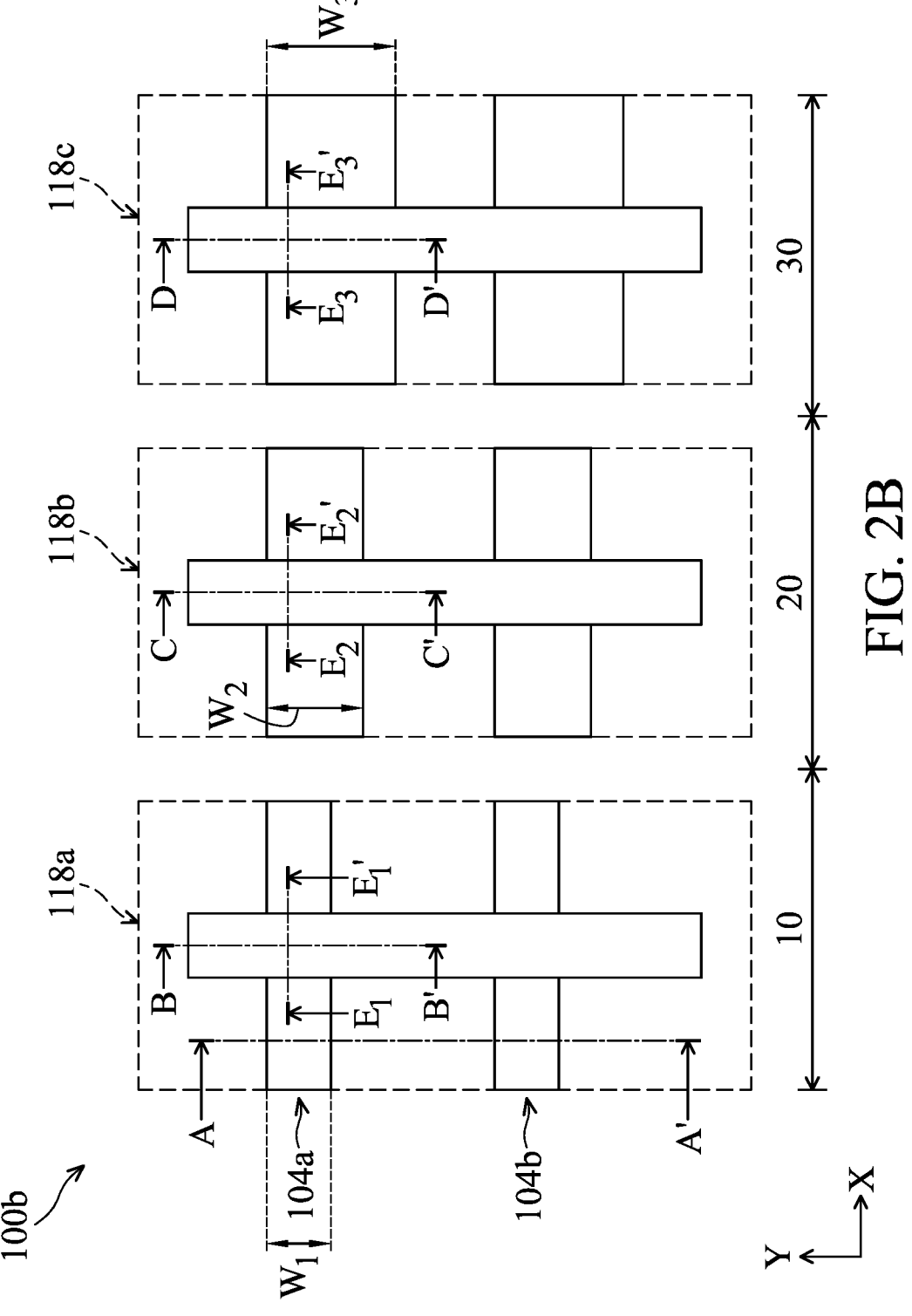
FIG. 2B shows a top-view representation of a semiconductor structure, in accordance with some embodiments.

FIG. 2B shows a top-view representation of a semiconductor structure 100b, in accordance with some embodiments. The semiconductor structure 100b of FIG. 2B includes elements that are similar to, or the same as, elements of the semiconductor structure 100a of FIG. 2A. The difference between the FIG. 2B and FIG. 2A is that the first region 10, the second region 20 and the third region 30 are separated from each other. The first fin structure 104a is divided into three different and isolated parts. In addition, the second fin structure 104b is also divided into three different and isolated parts. Furthermore, no dielectric structure is between the first dummy gate structure 118a and the second dummy gate structure 118b, and no dielectric structure is between the second dummy gate structure 118b and the third dummy gate structure 118c.

Figures 1, 3A:
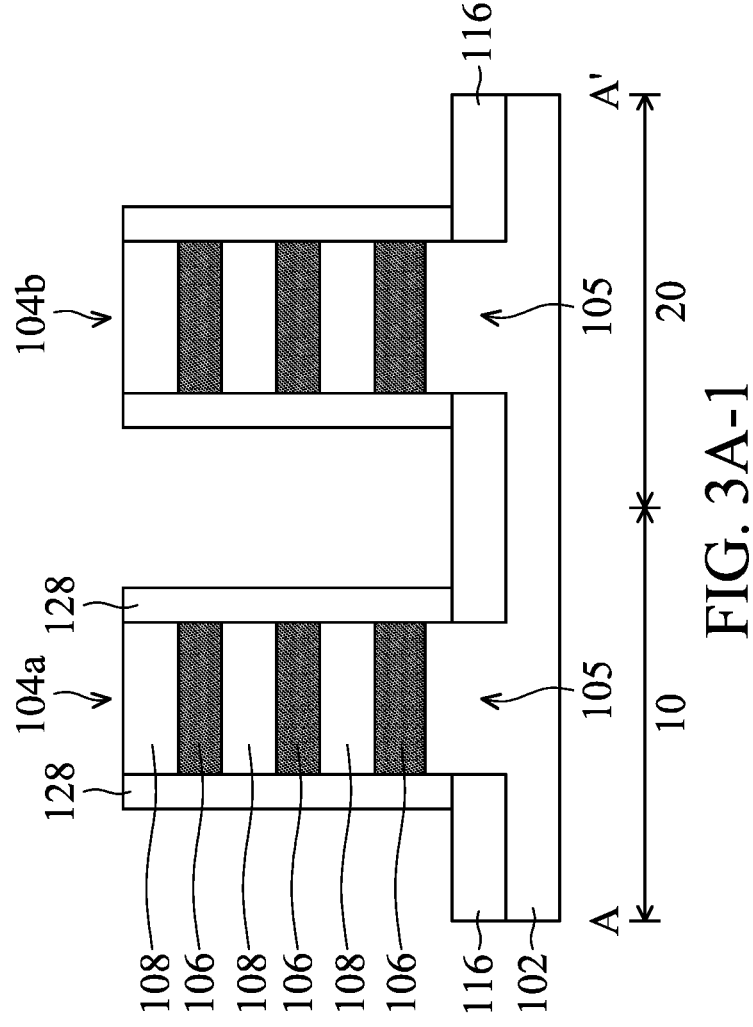
FIGS. 3A-1 to 3O-1 illustrate cross-sectional representations of various stages of manufacturing the semiconductor structure shown along line A-A' in FIGS. 1E, 2A and 2B, in accordance with some embodiments.
Figures 2, 3A:
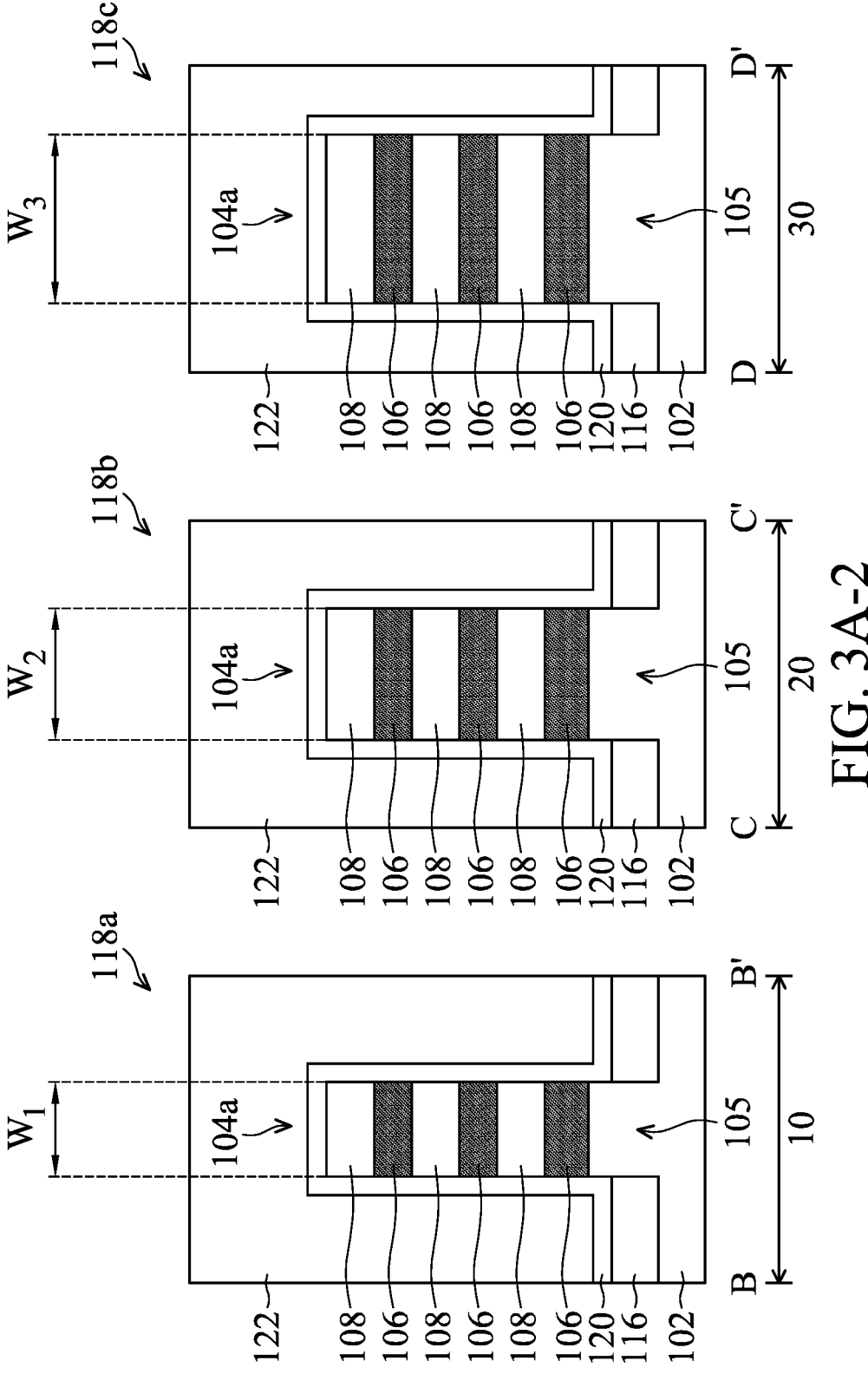
Figures 3, 3A:
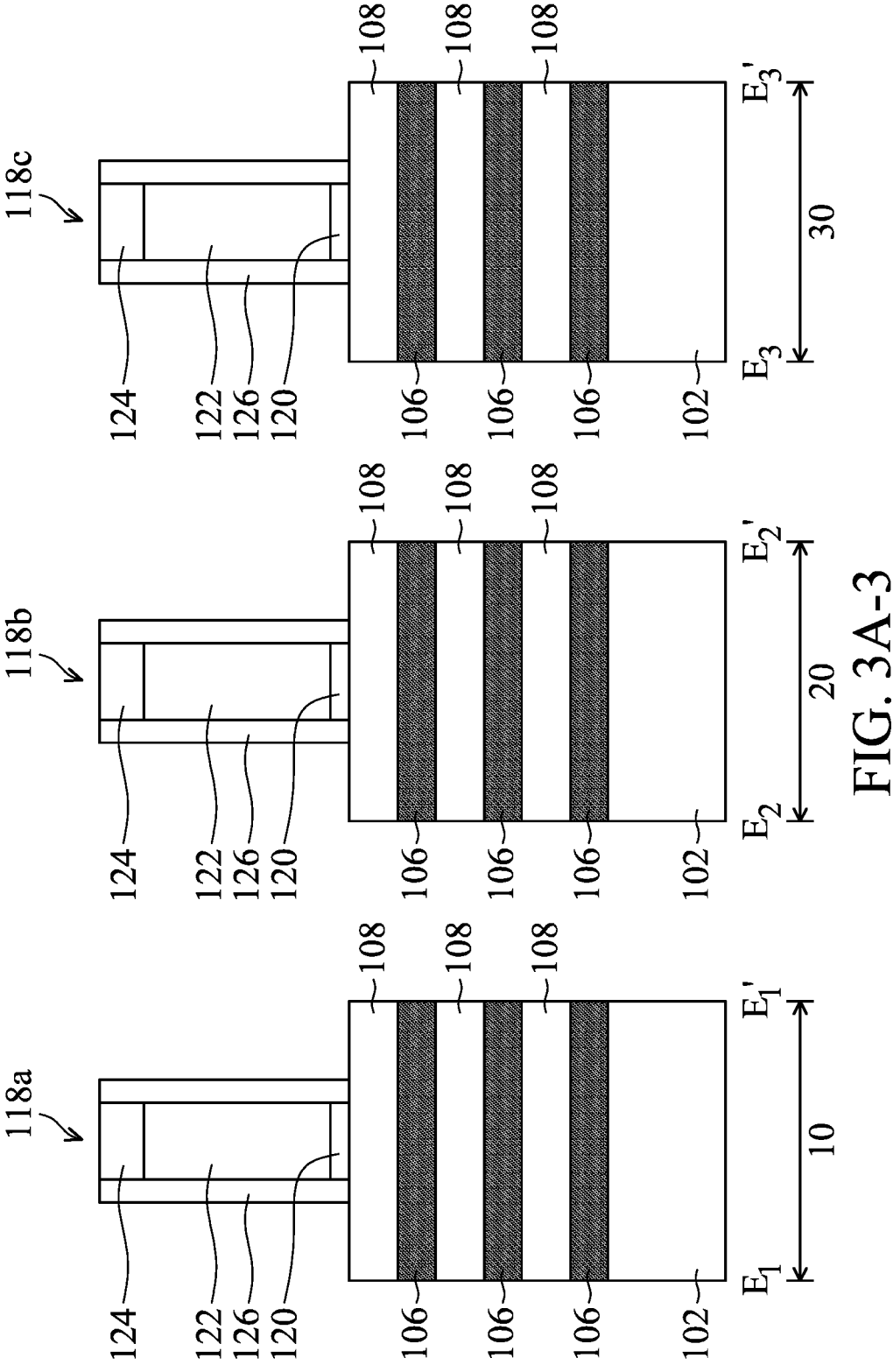
Figures 1, 3B:
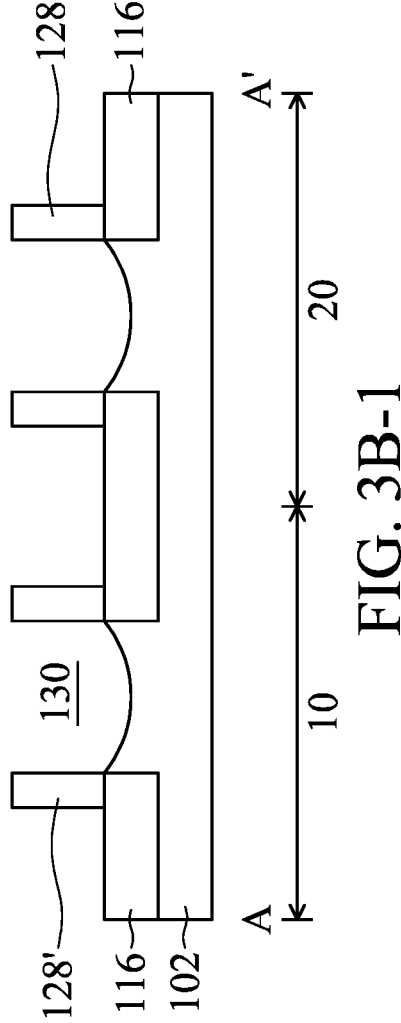
Figures 2, 3B:
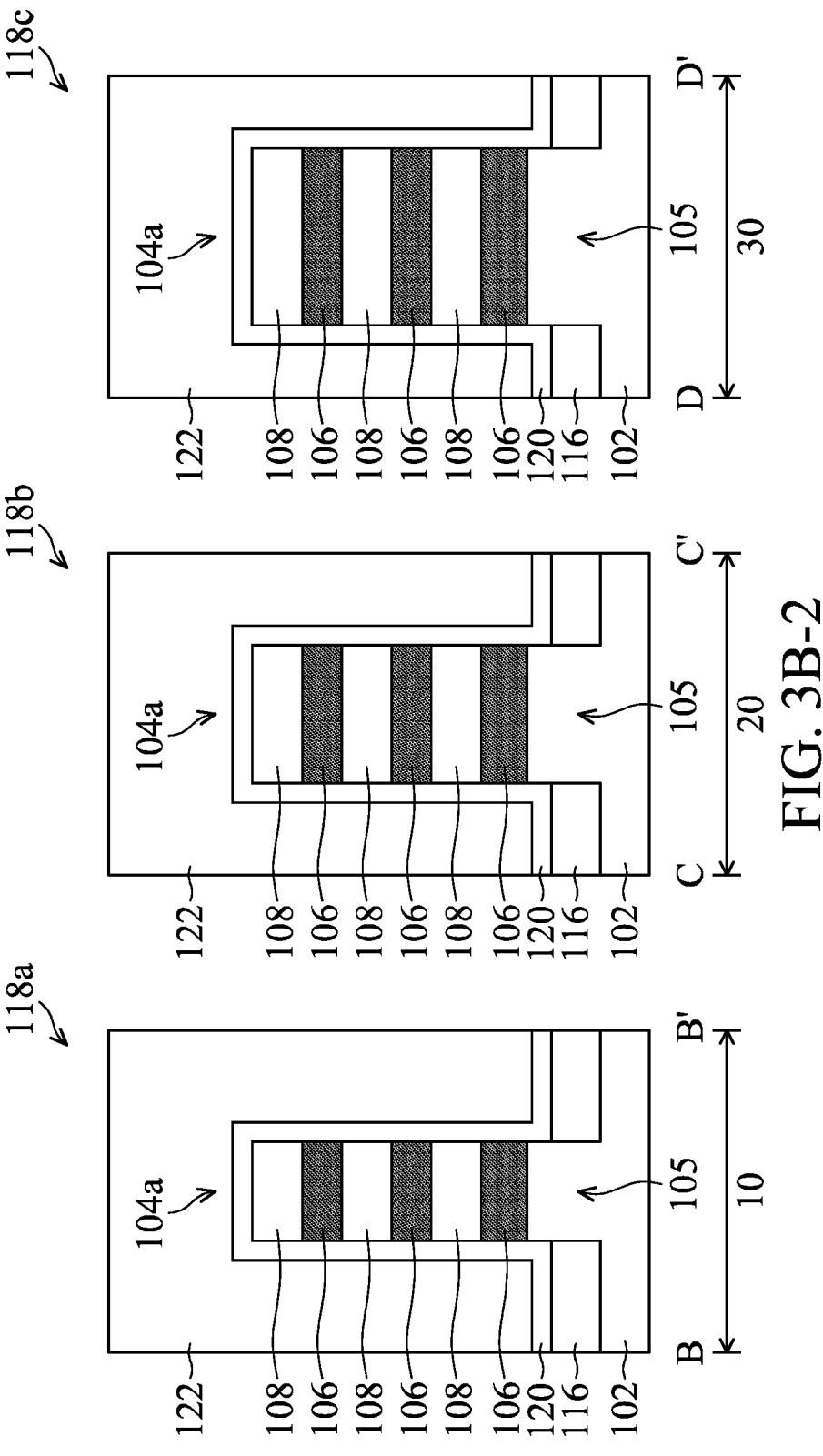
Figures 3, 3B:
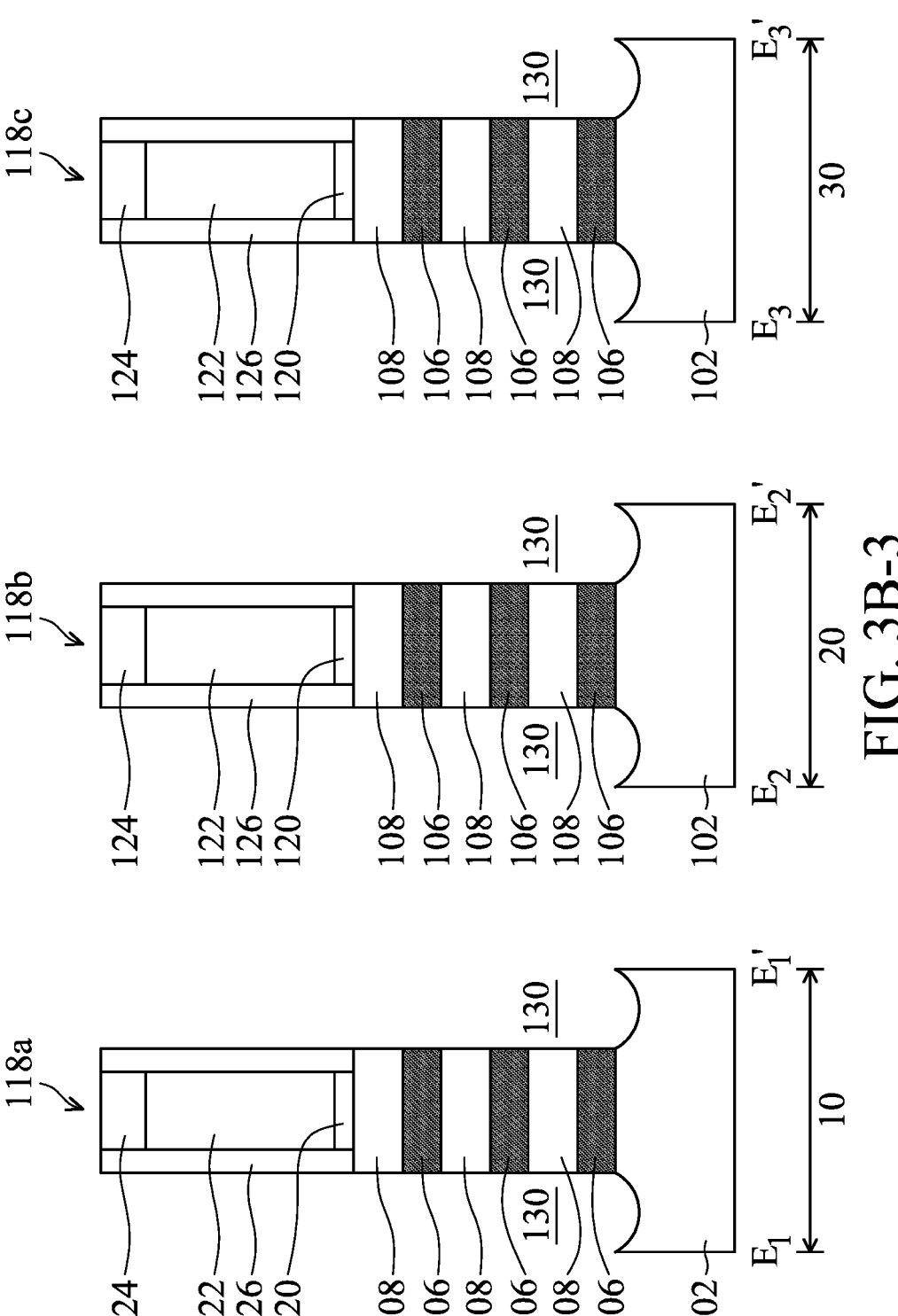
Figures 1, 3C:
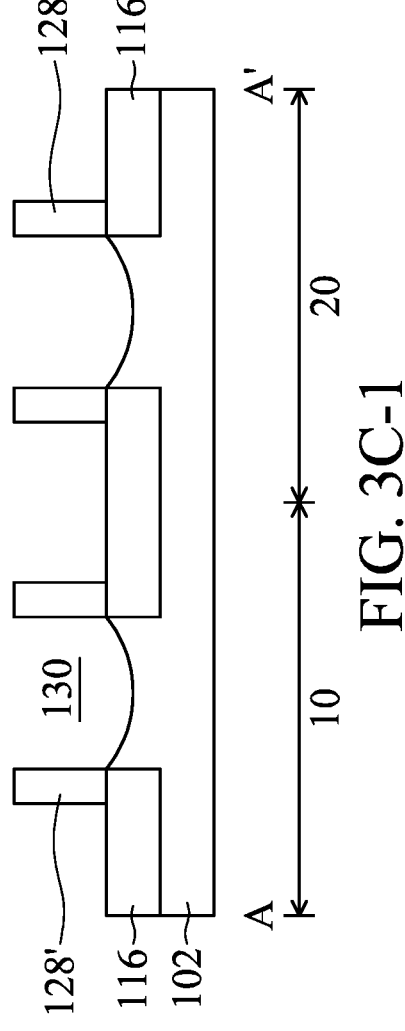
Figures 2, 3C:
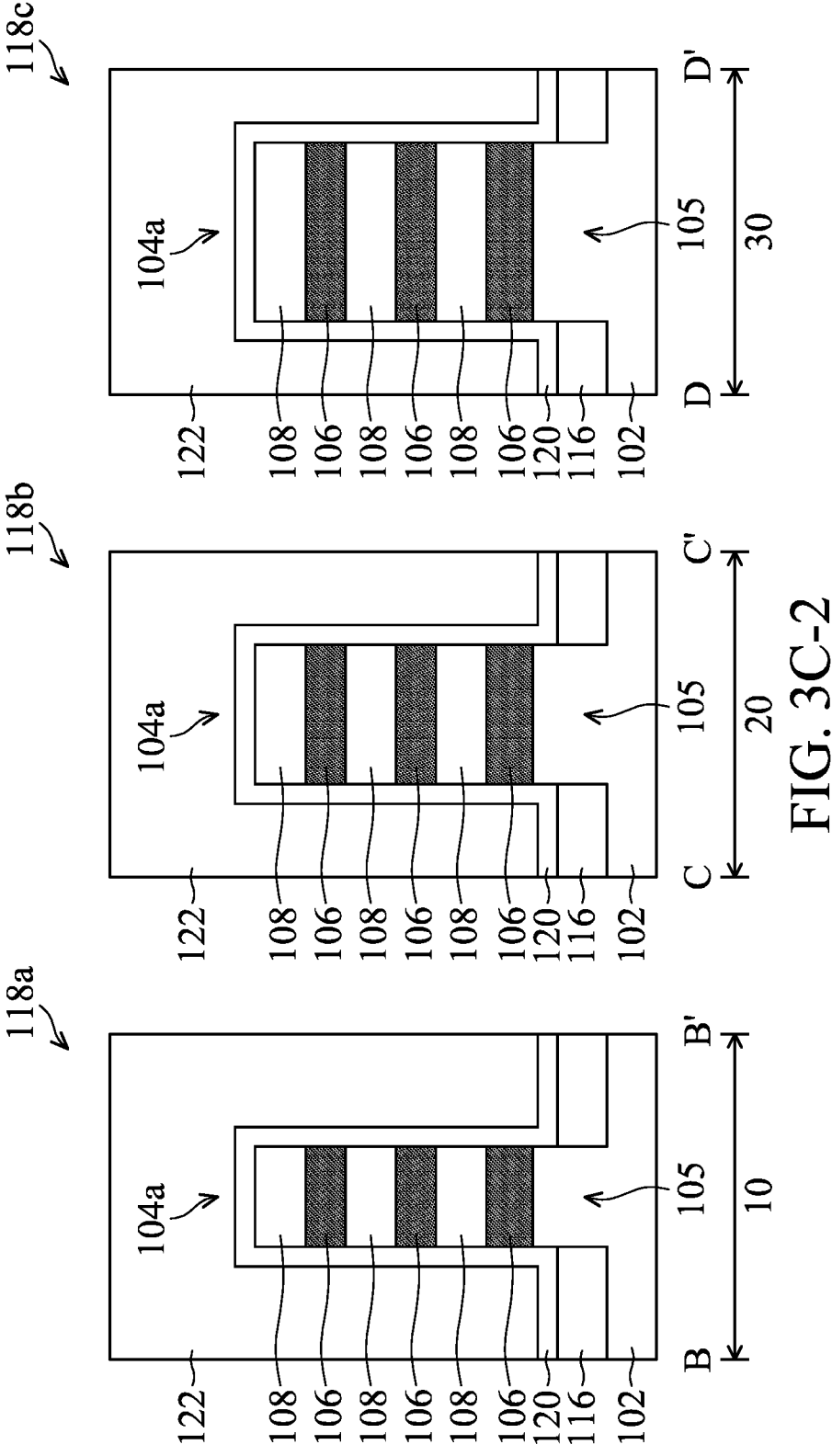
Figures 3, 3C:
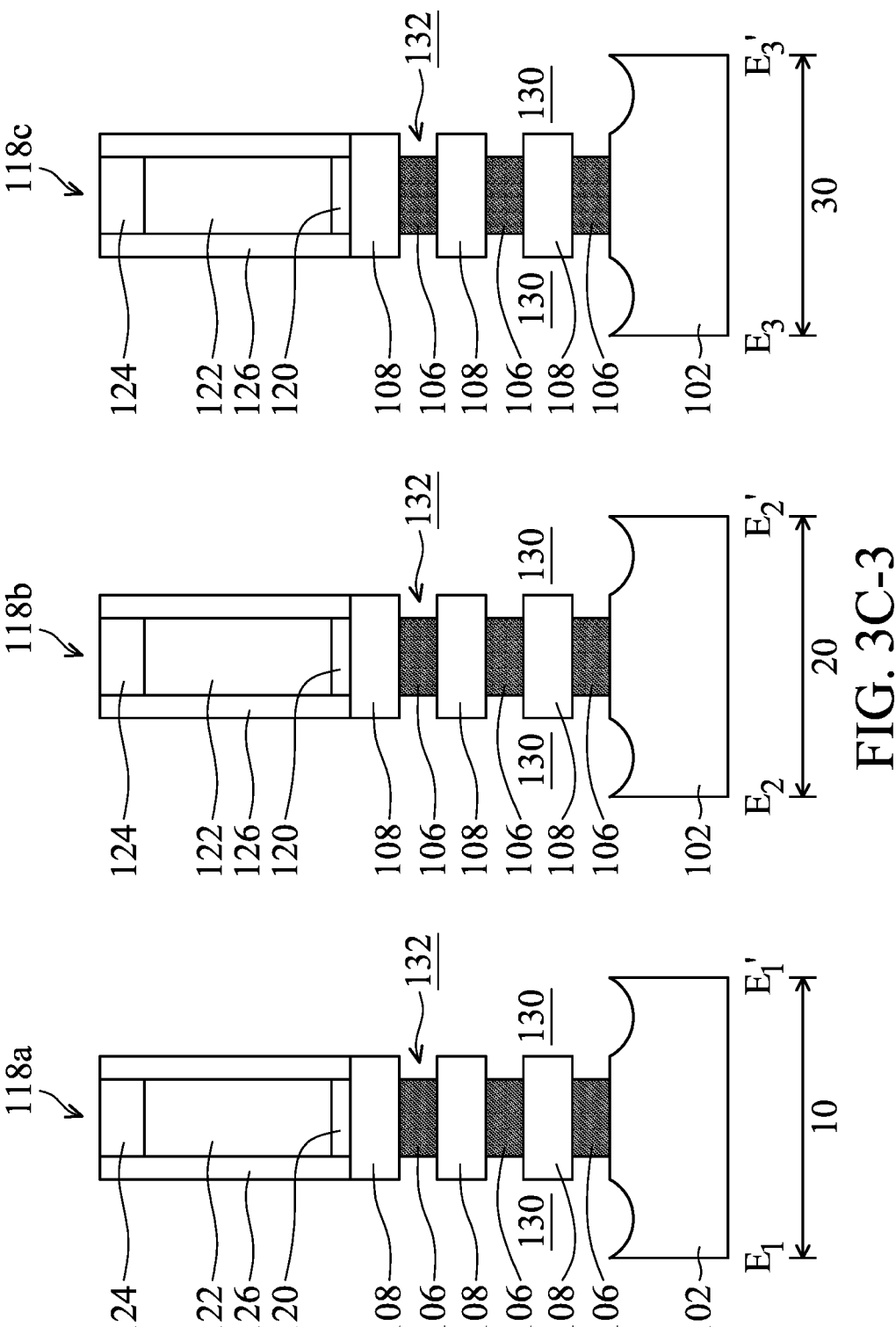
Figures 1, 3D:
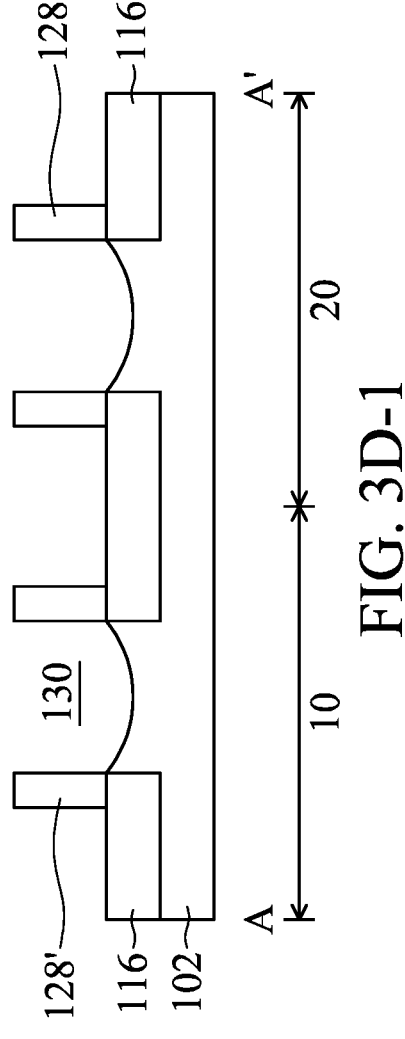
Figures 2, 3D:
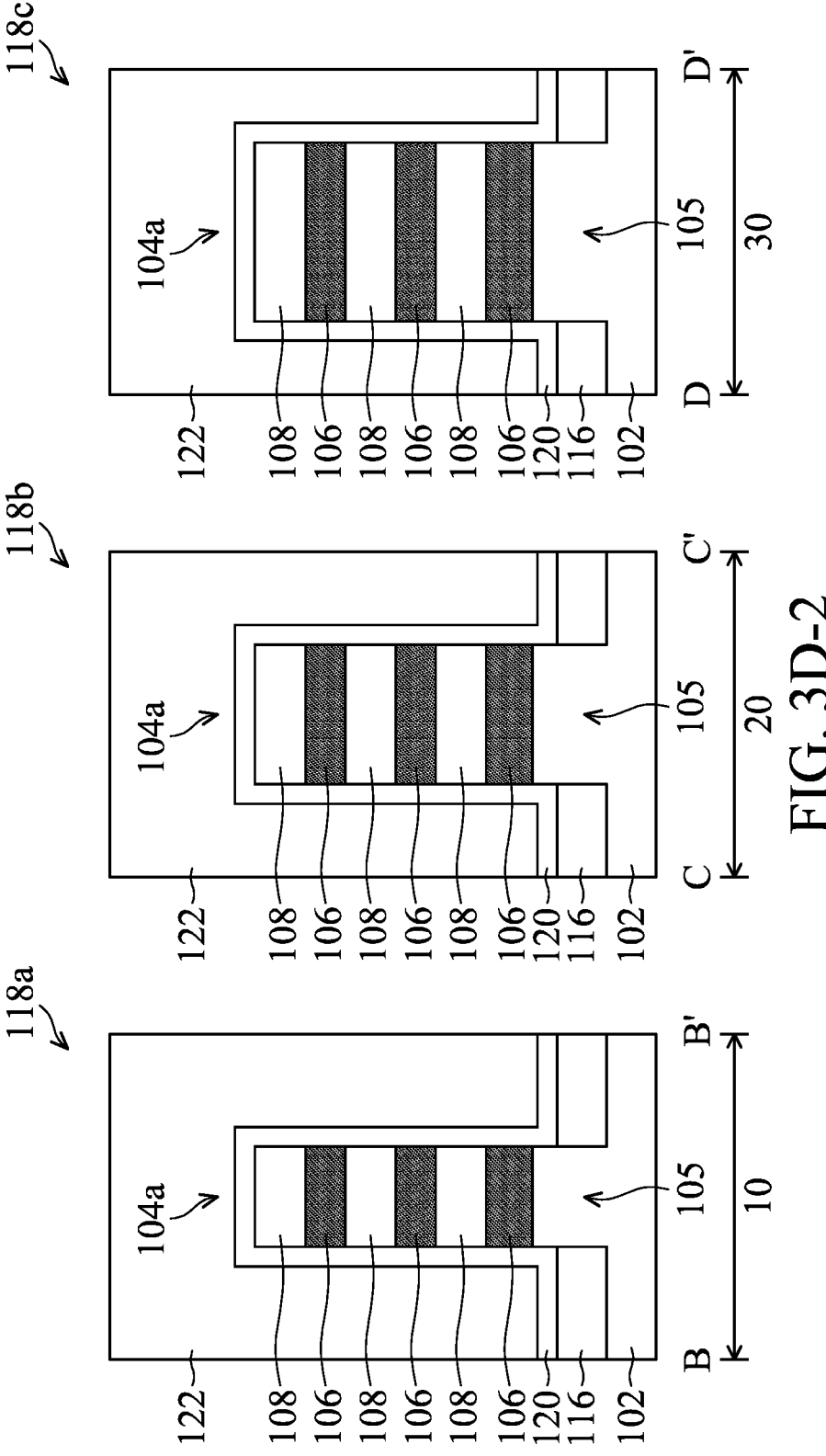
Figures 3, 3D:
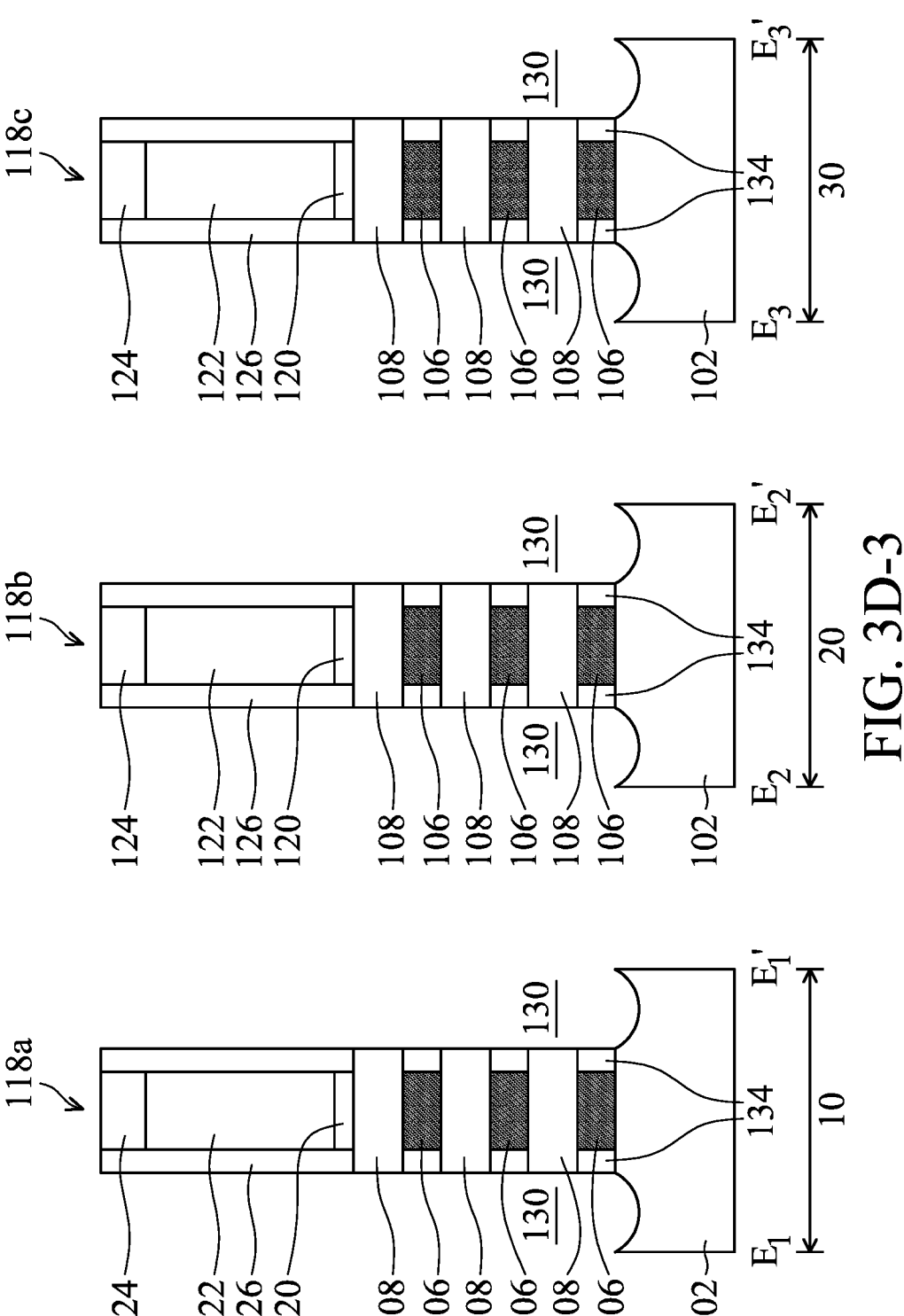
Figures 1, 3E:
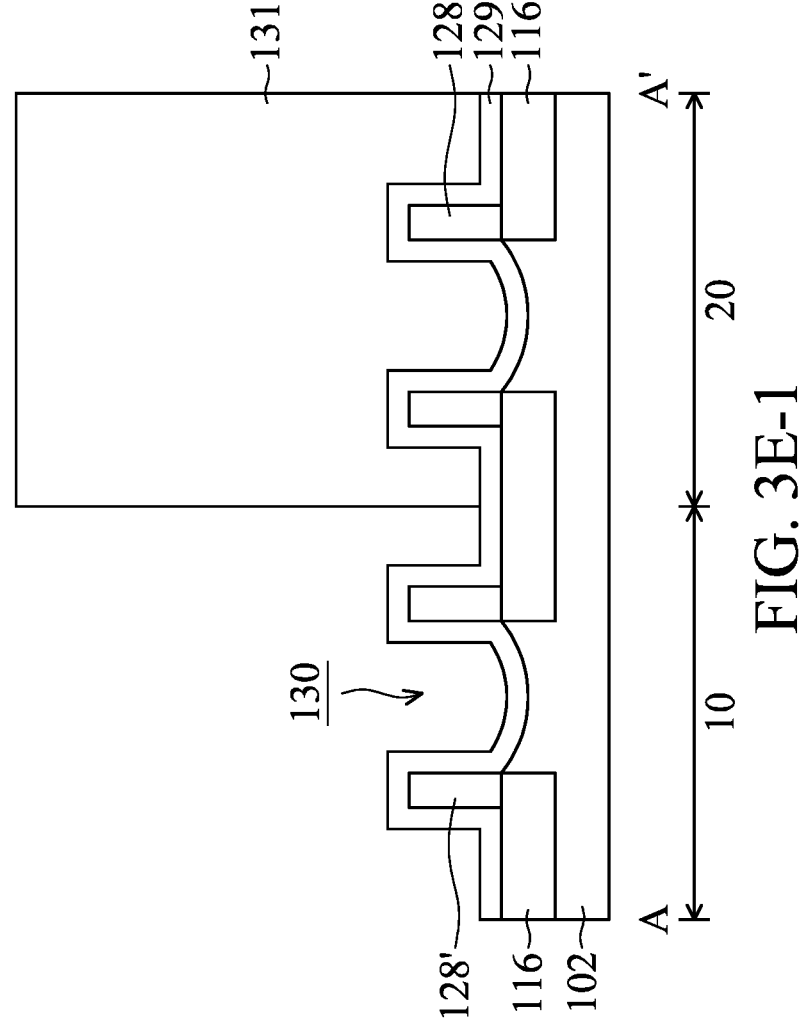
Figures 2, 3E:
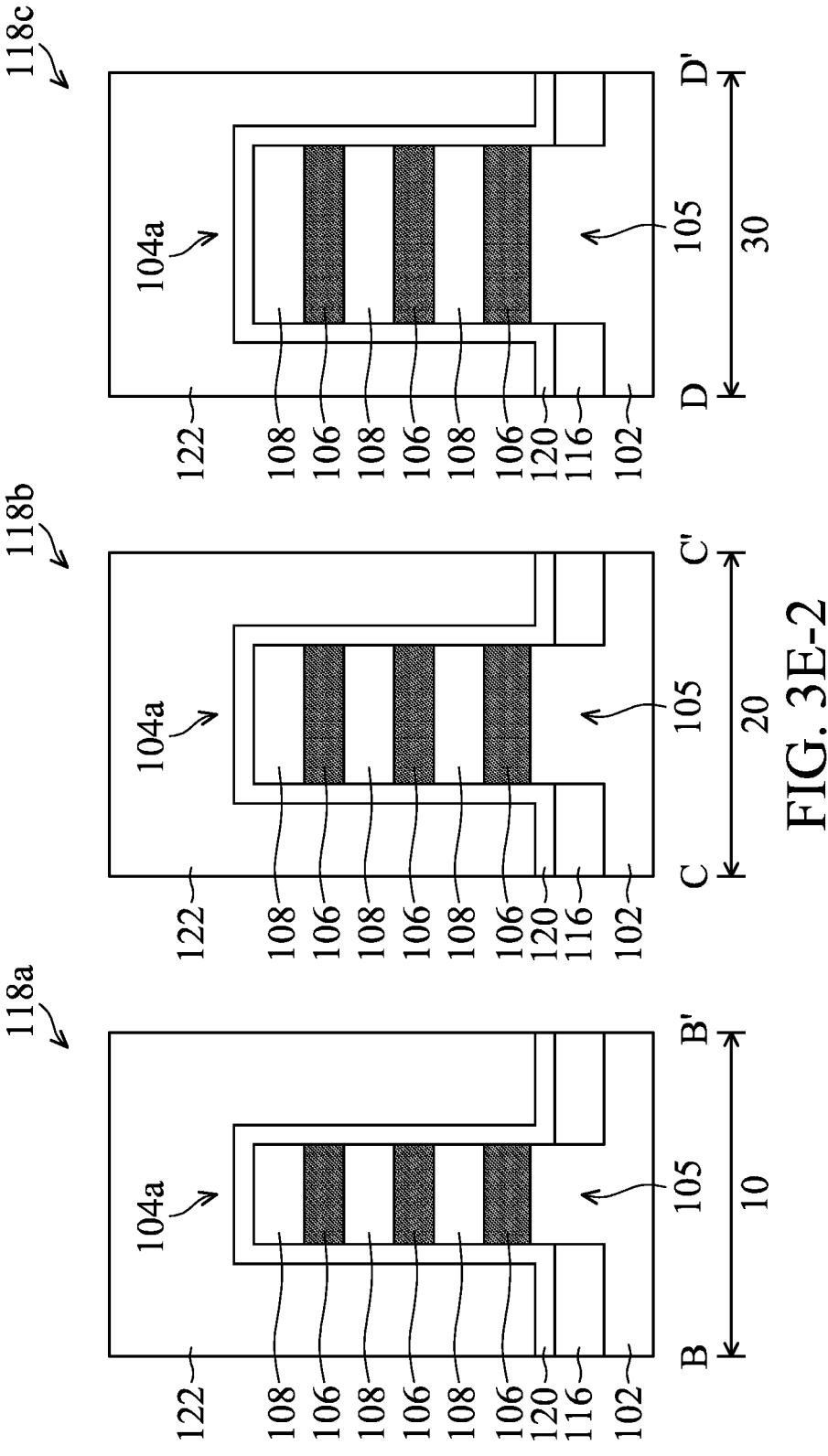
Figures 3, 3E:
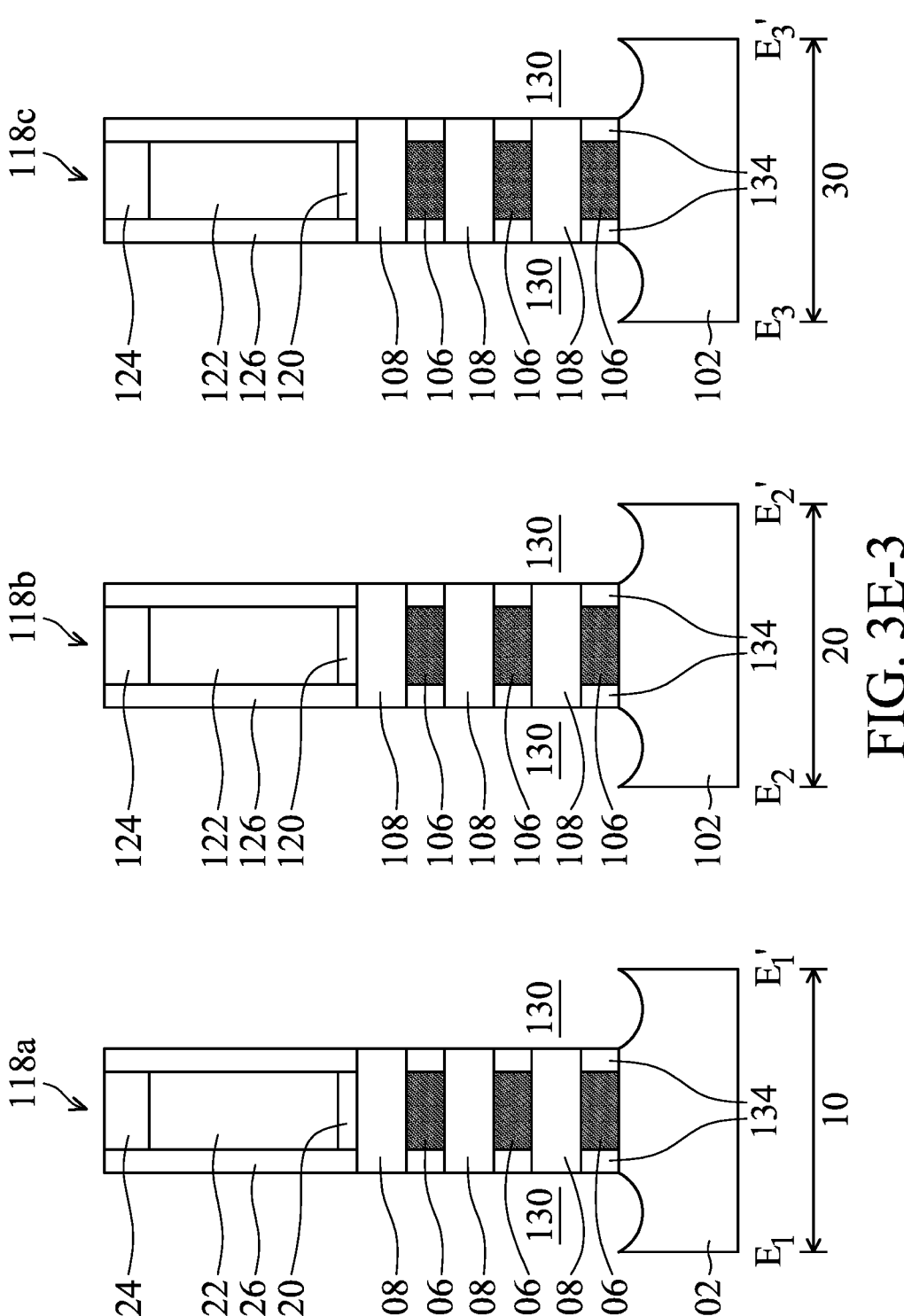
Figures 1, 3F:
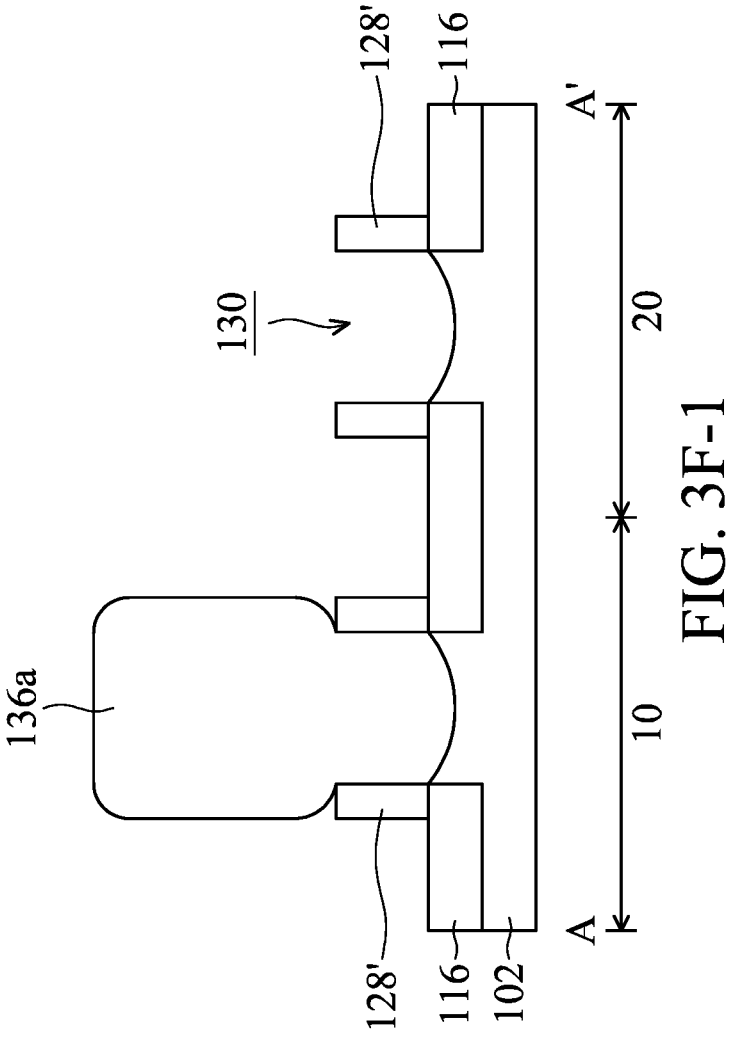
Figures 2, 3F:
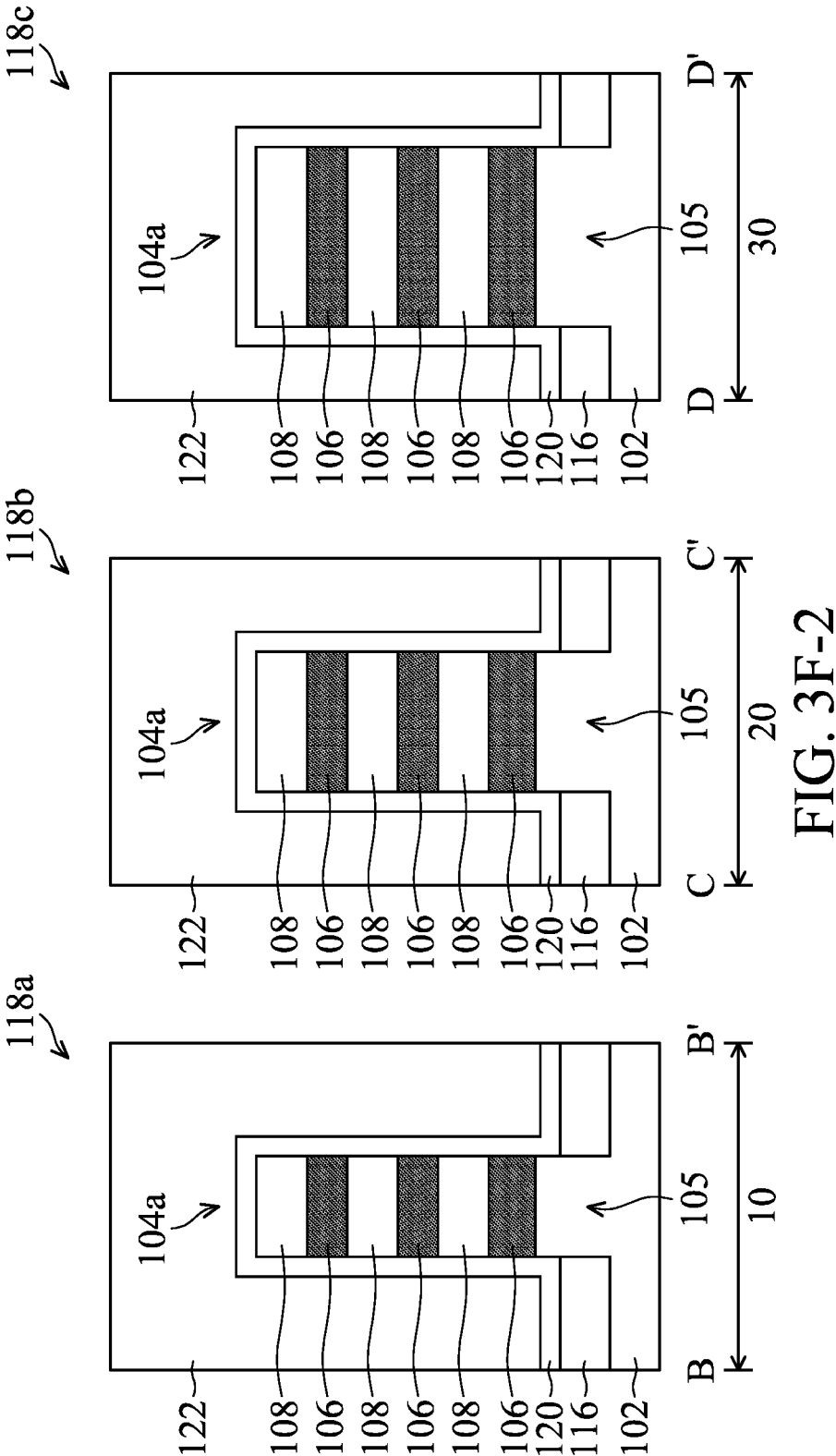
Figures 3, 3F:
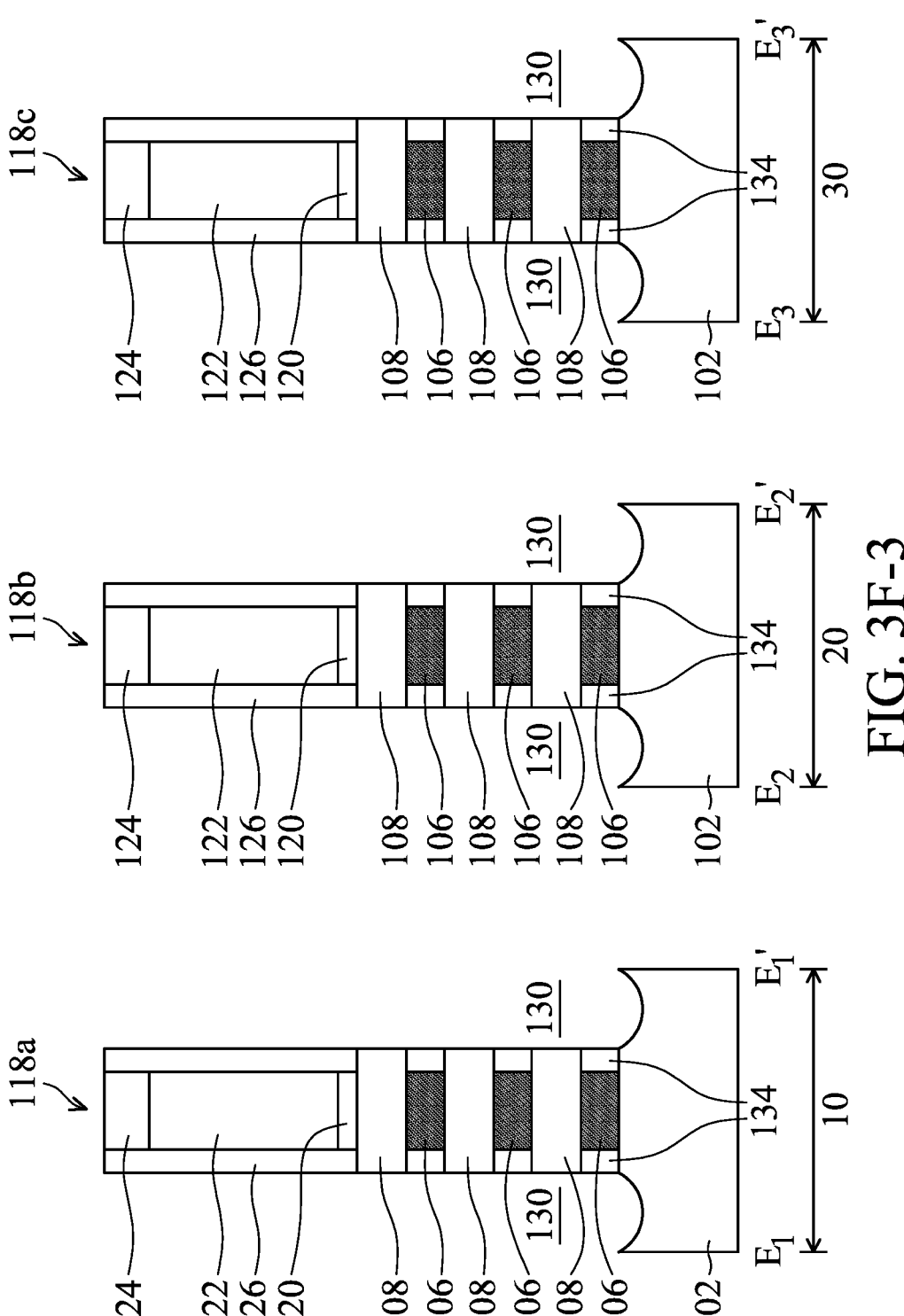
Figures 1, 3G:
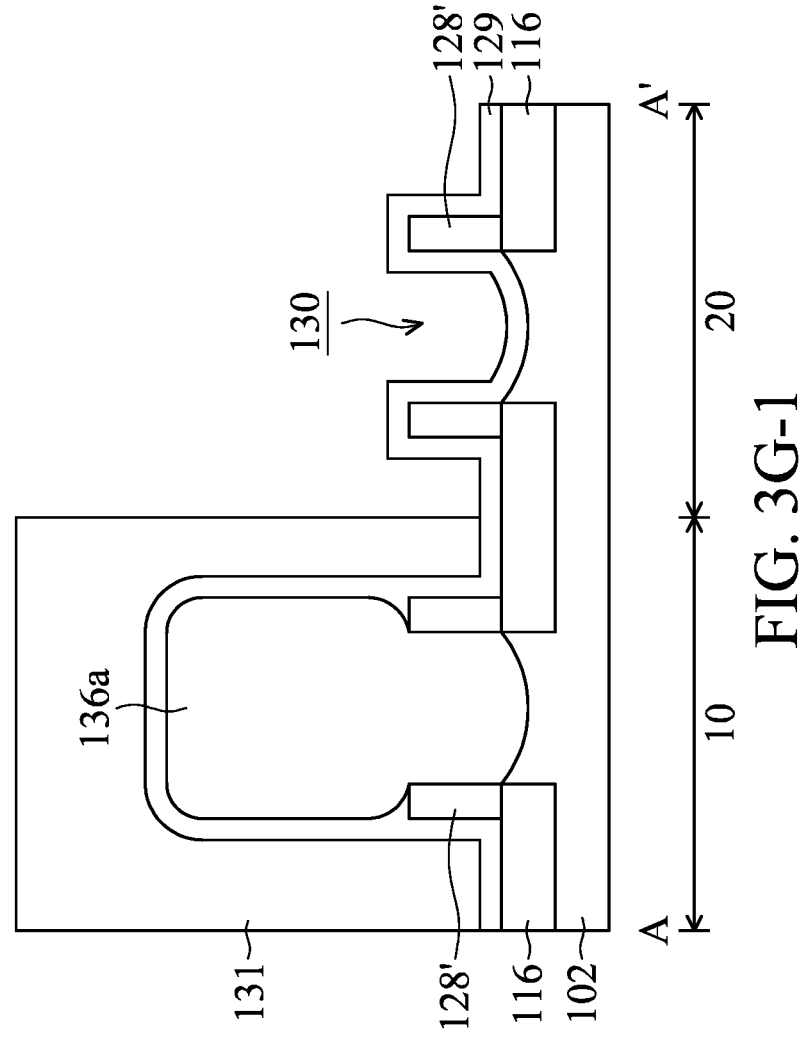
Figures 2, 3G:
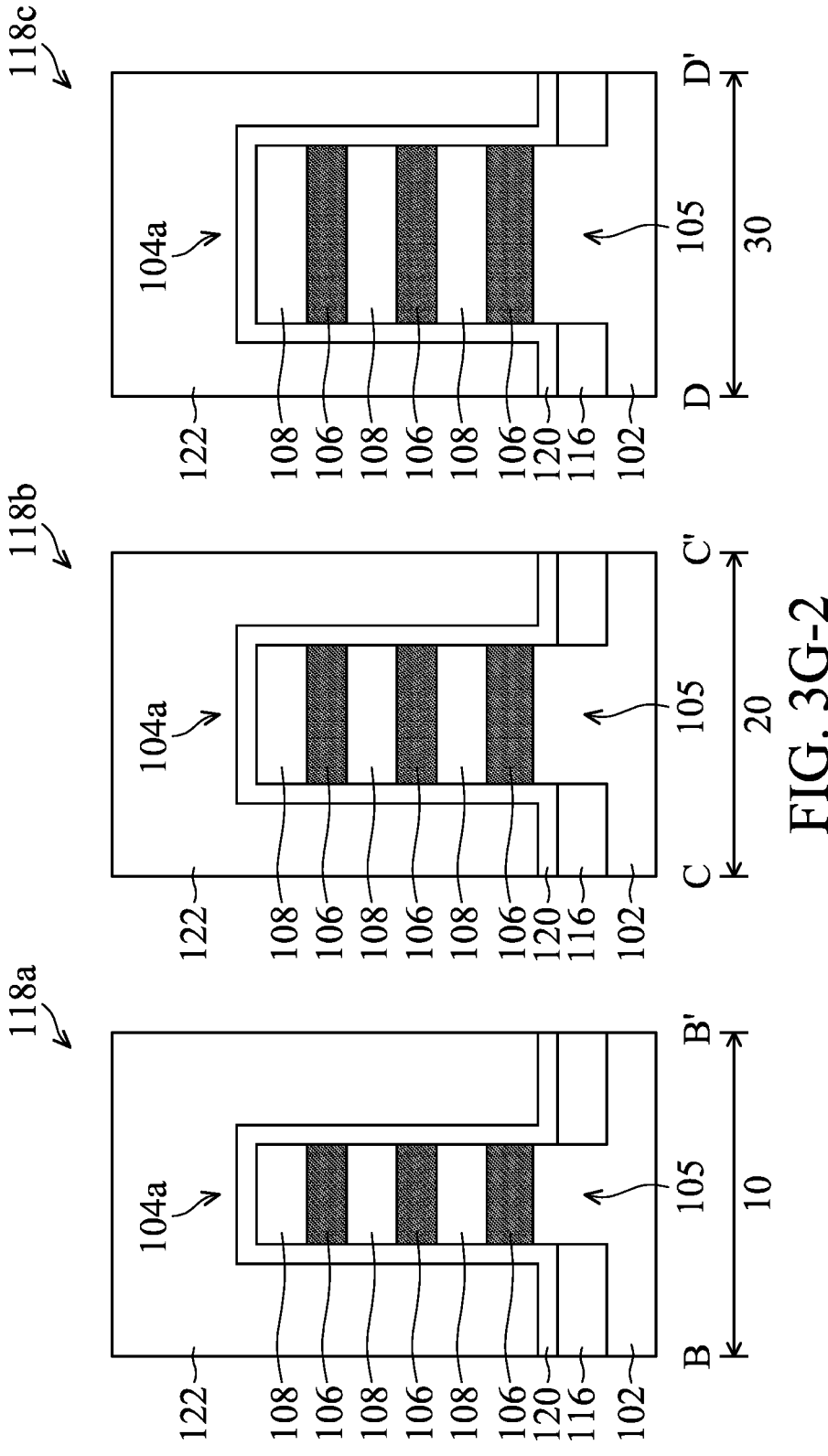
Figures 3, 3G:
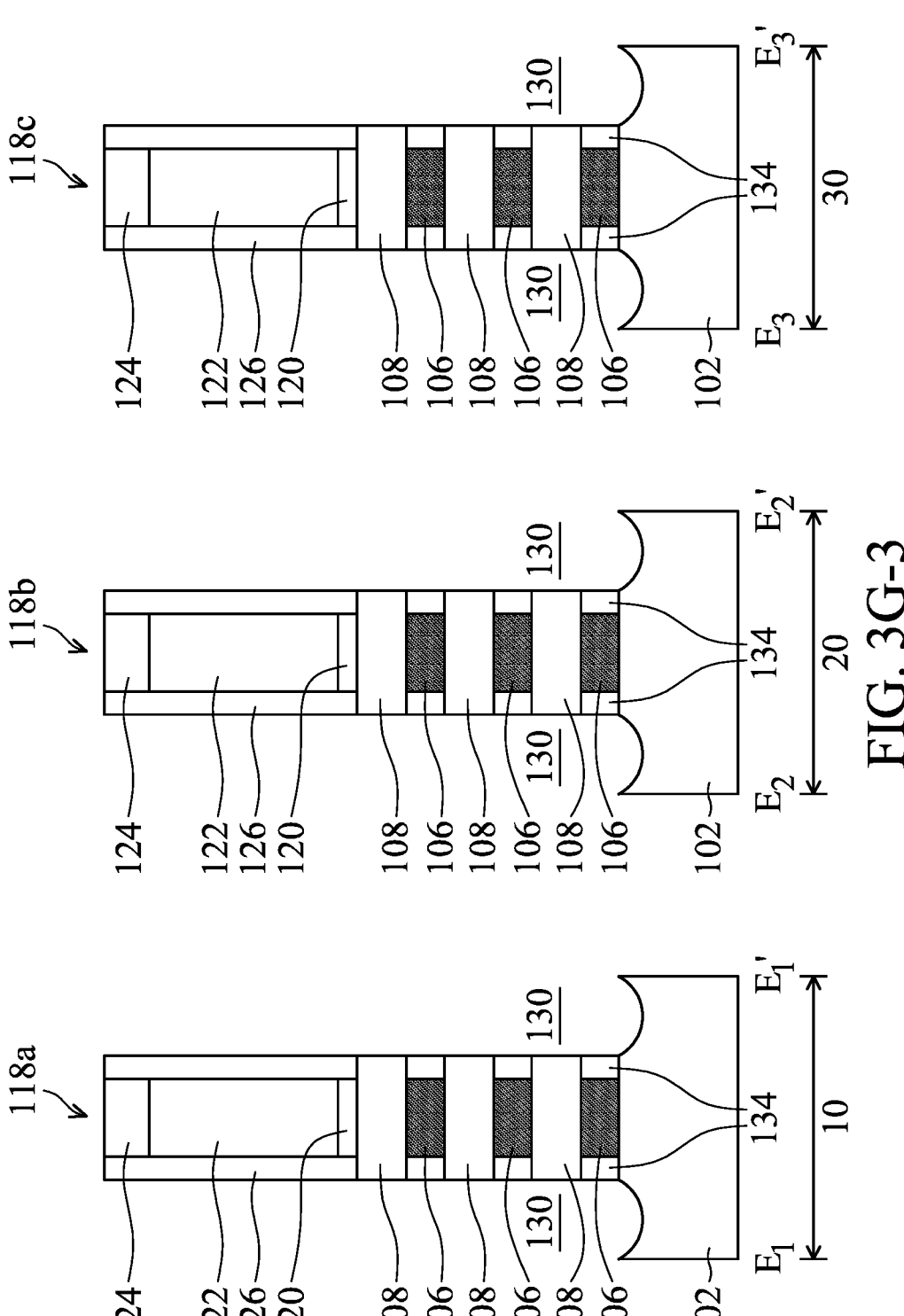
Figures 1, 3H:
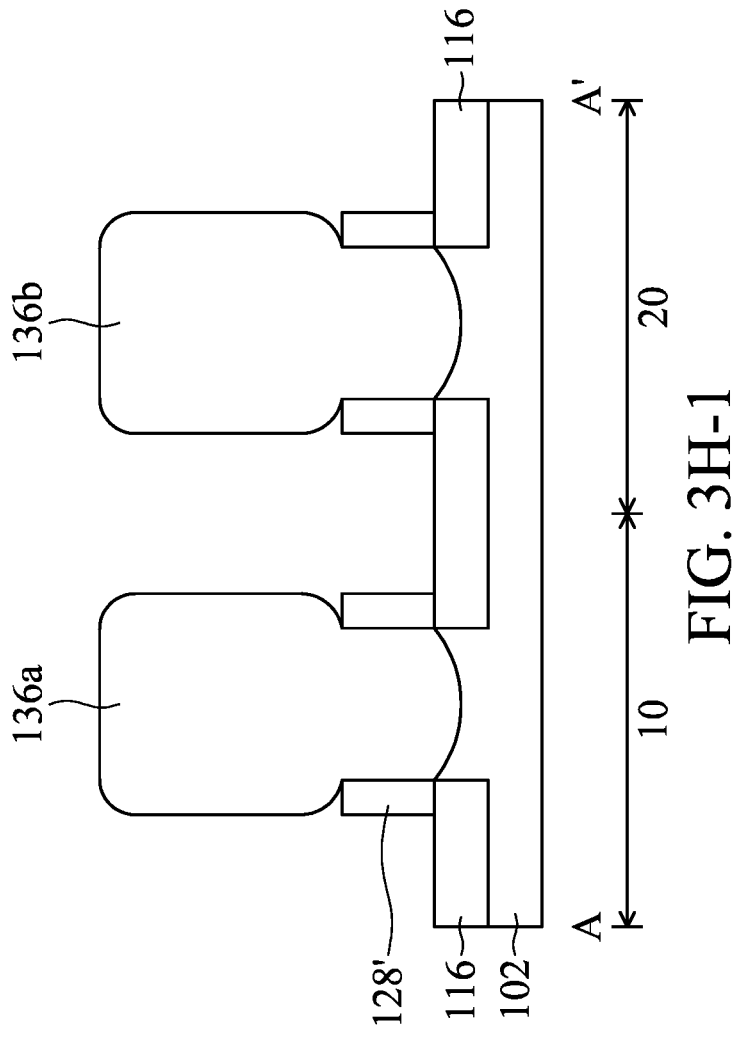
Figures 2, 3H:
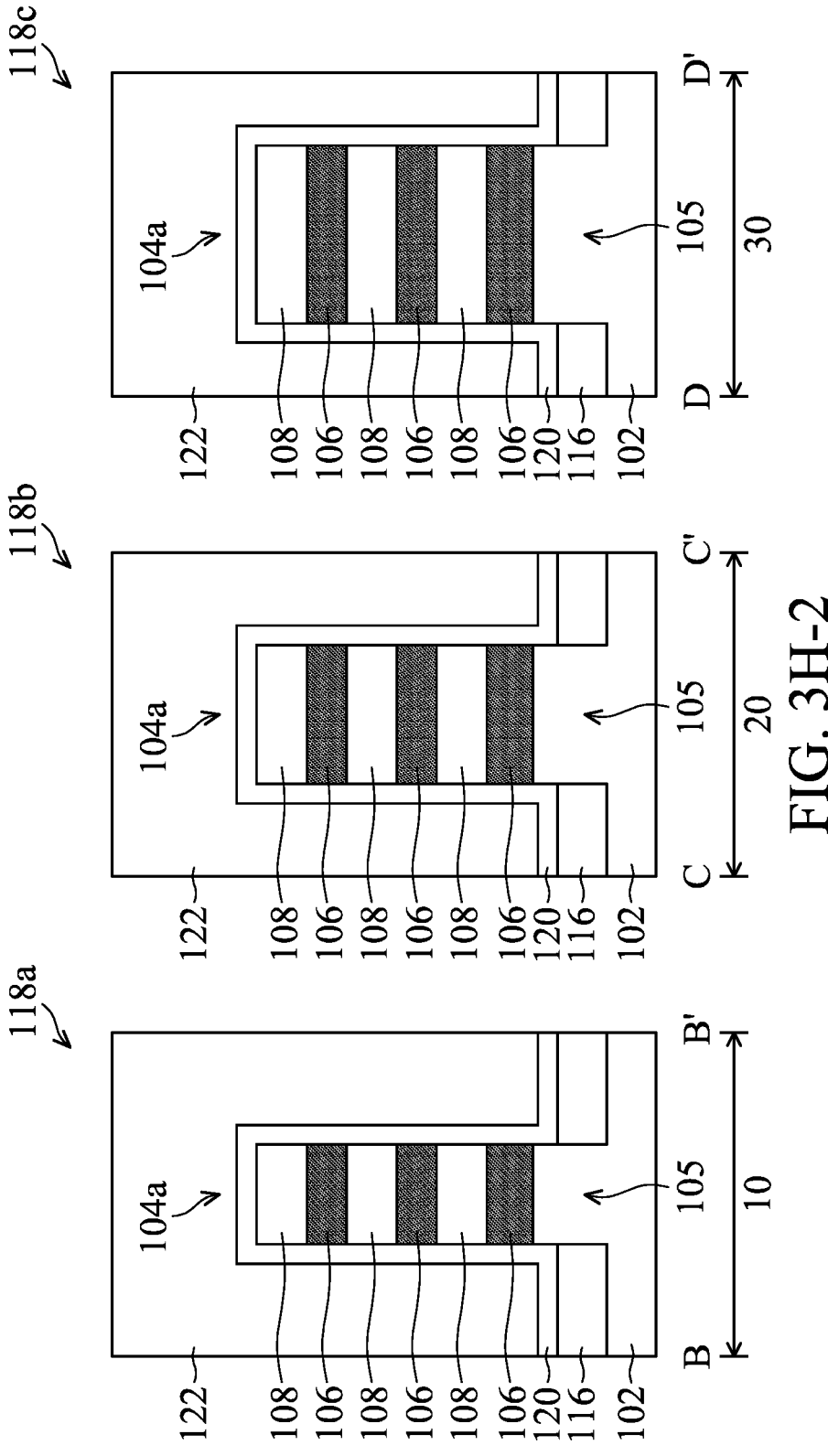
Figures 3, 3H:
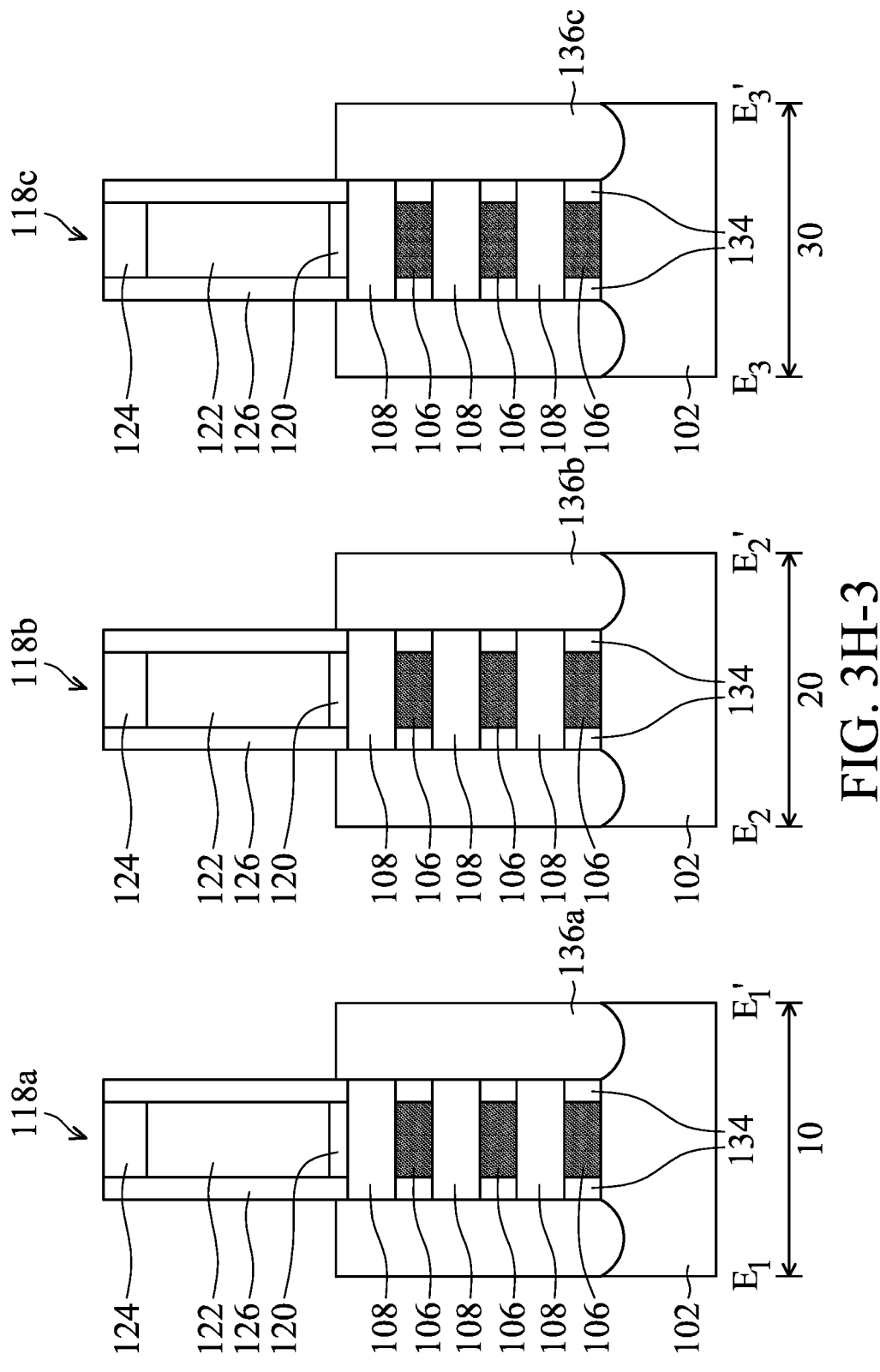
Figures 1, 3I:
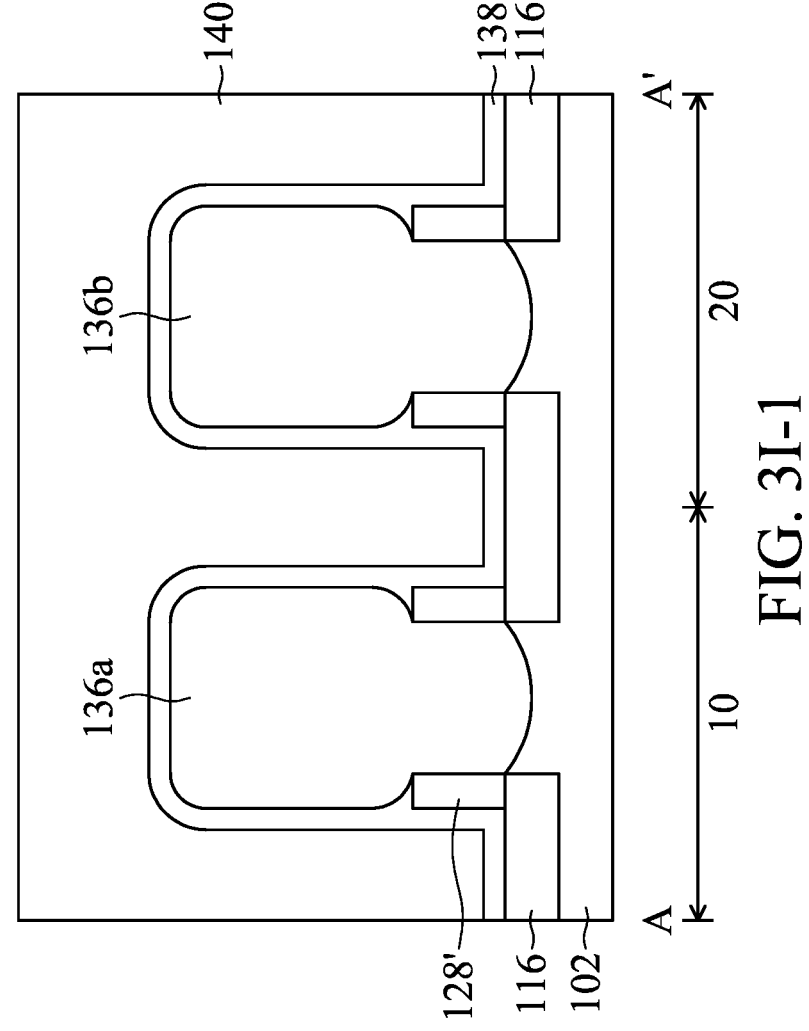
Figures 2, 3I:
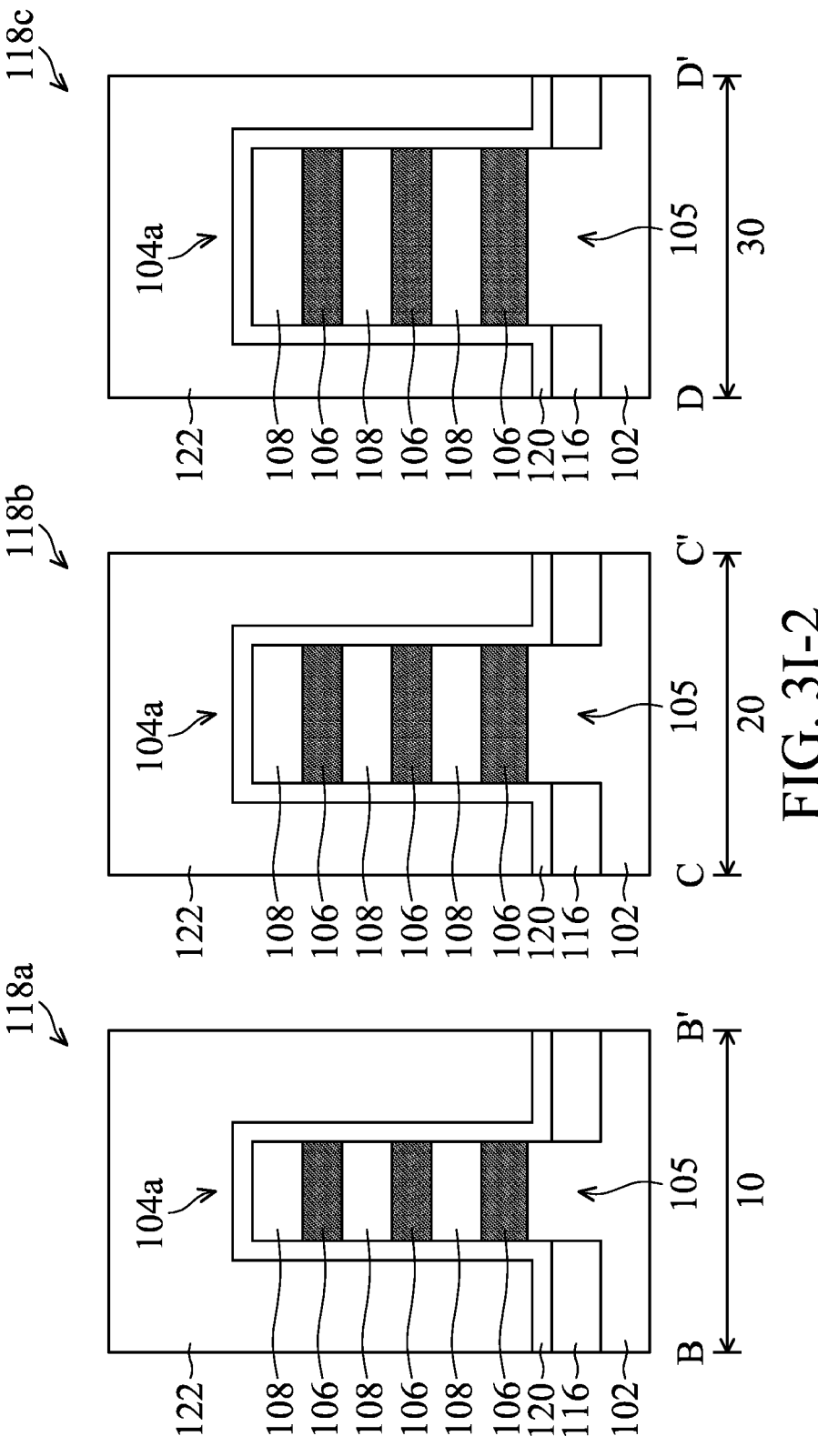
Figures 3, 3I:
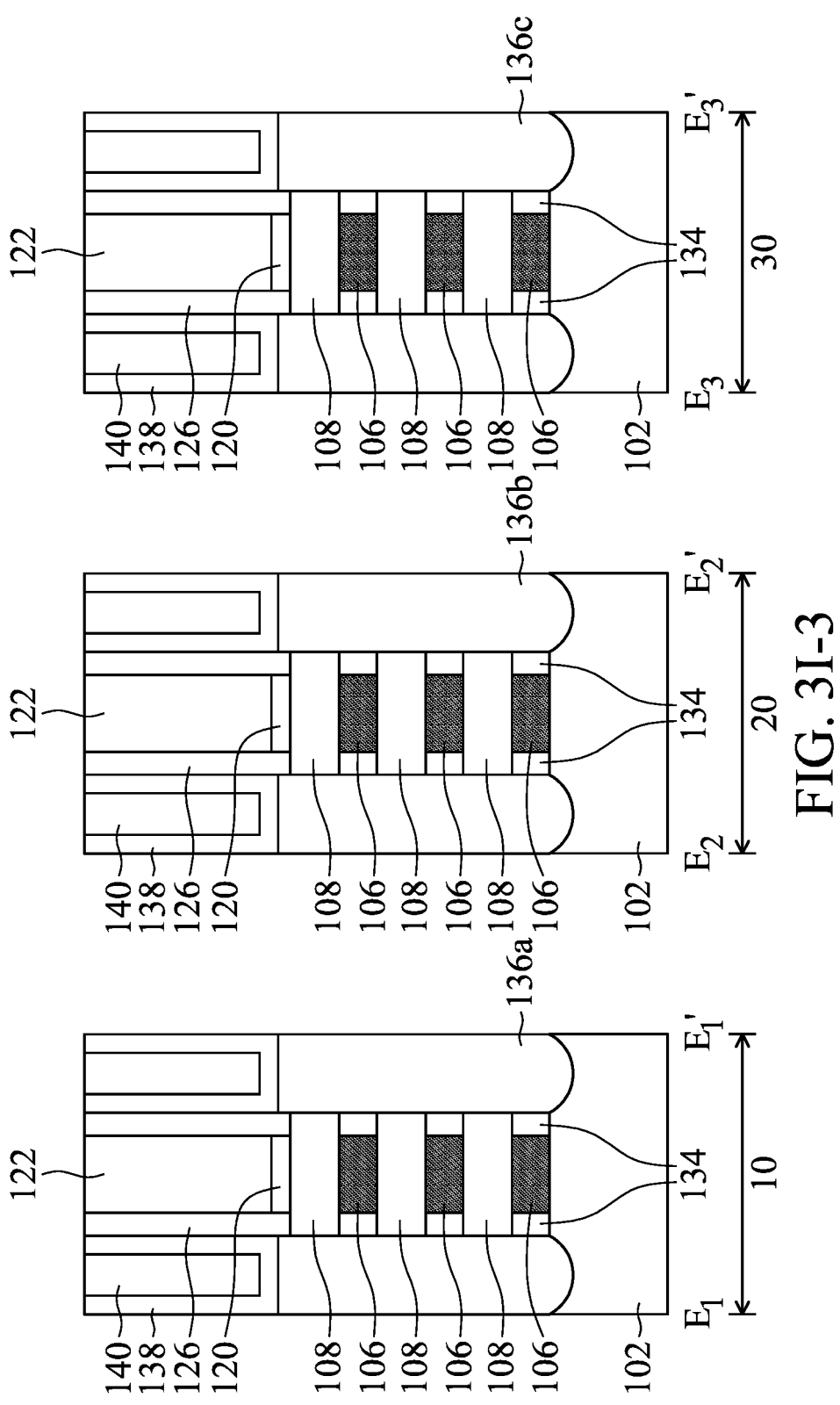
Figures 1, 3J:
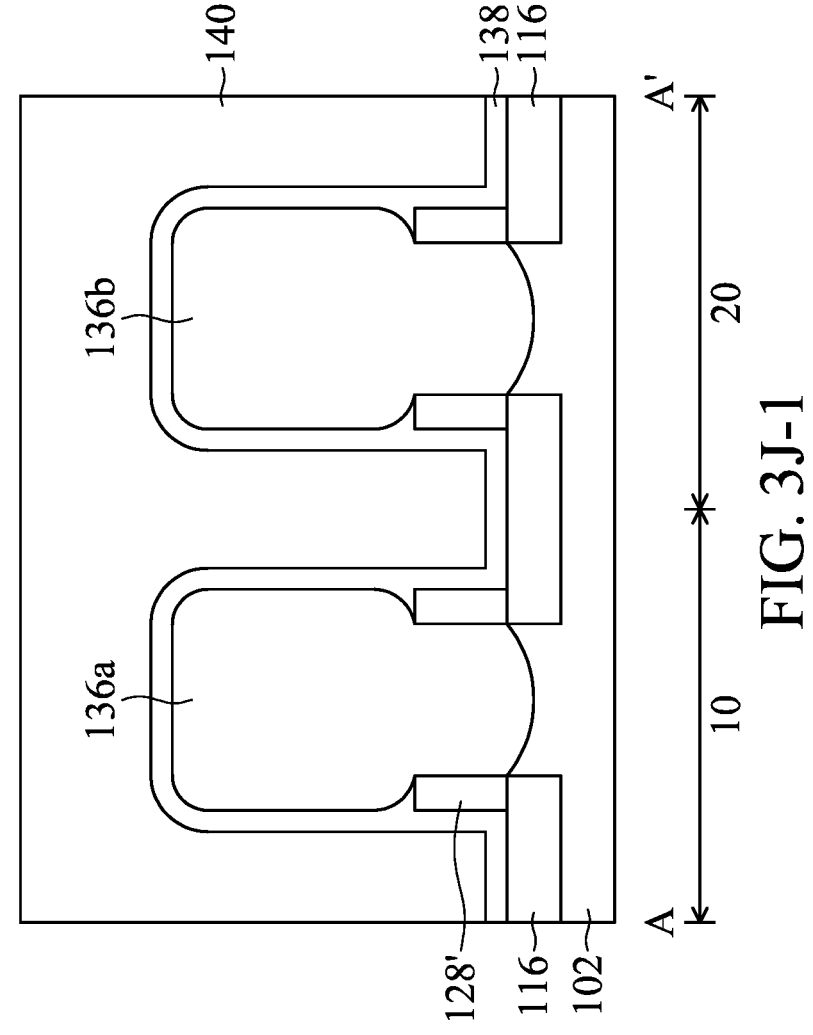
Figures 2, 3J:
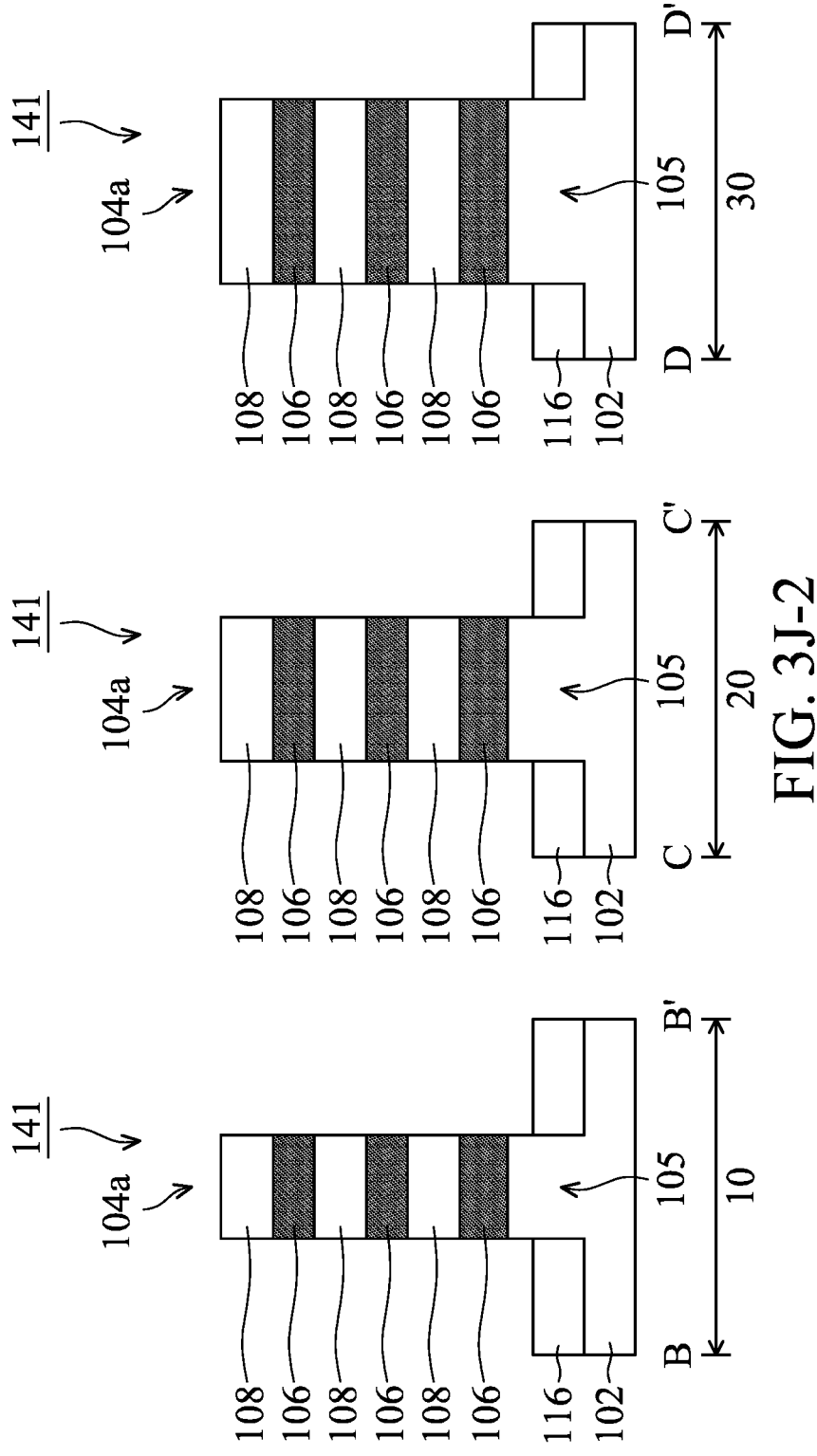
Figures 3, 3J:
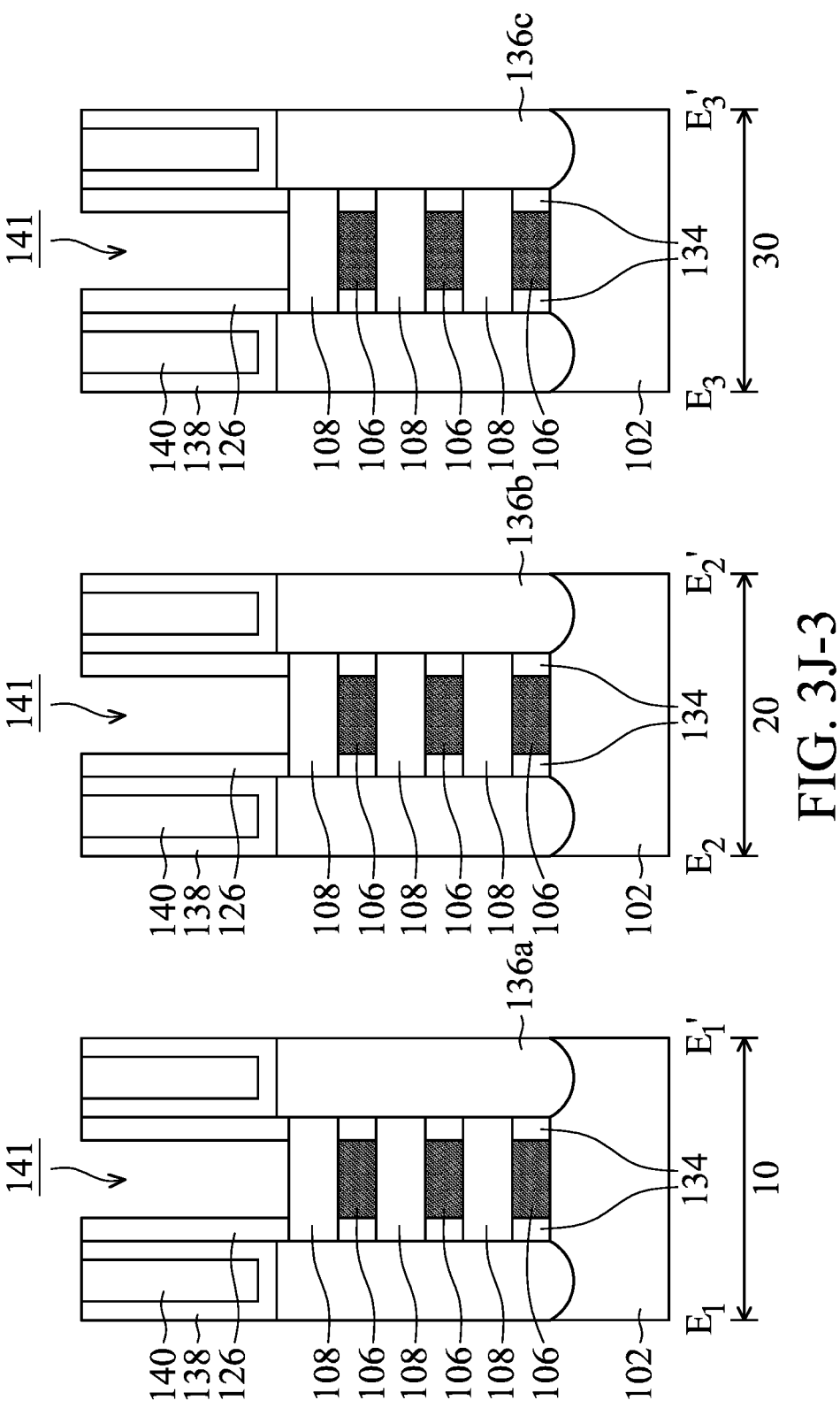
Figures 1, 3K:
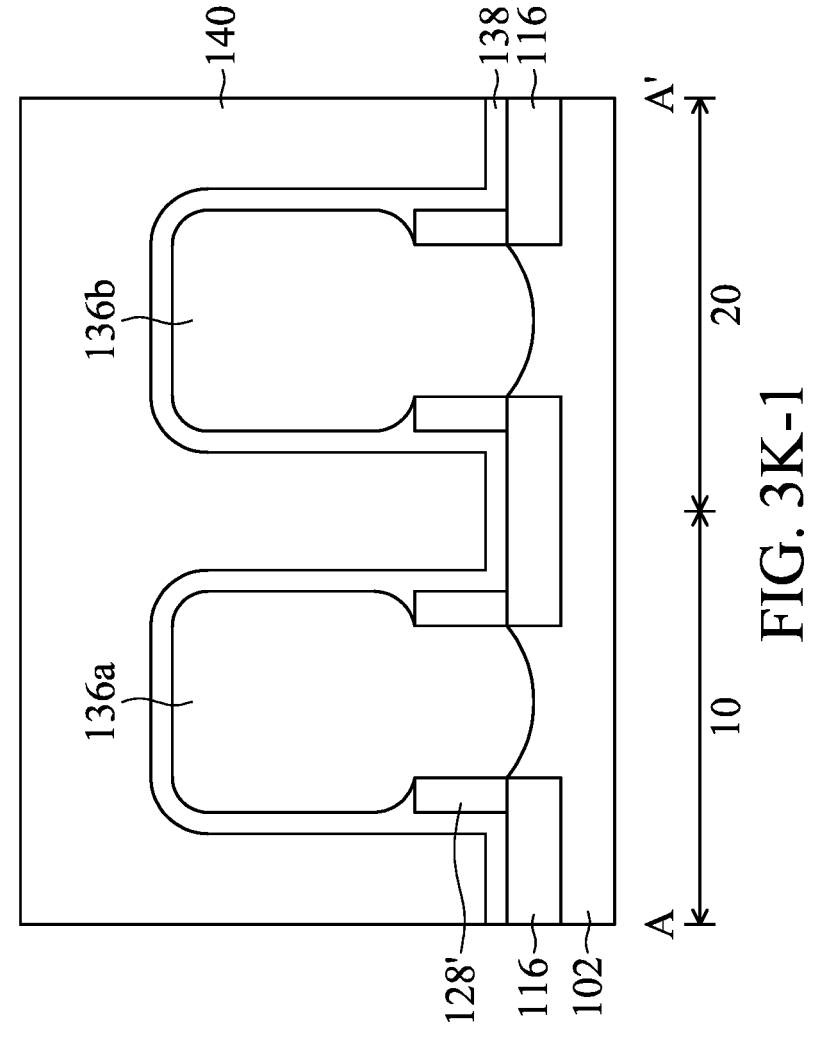
Figures 2, 3K:
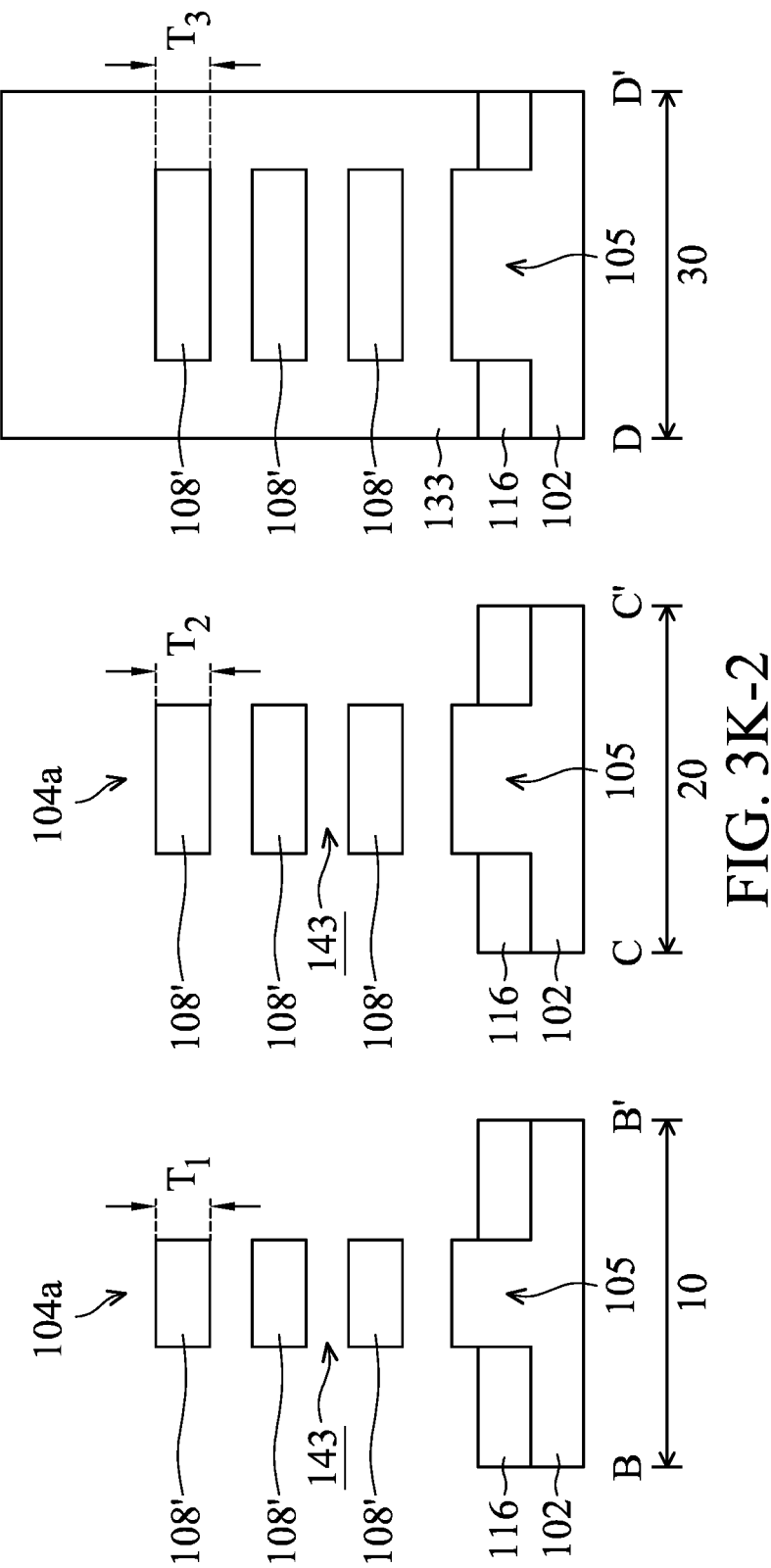
Figures 3, 3K:
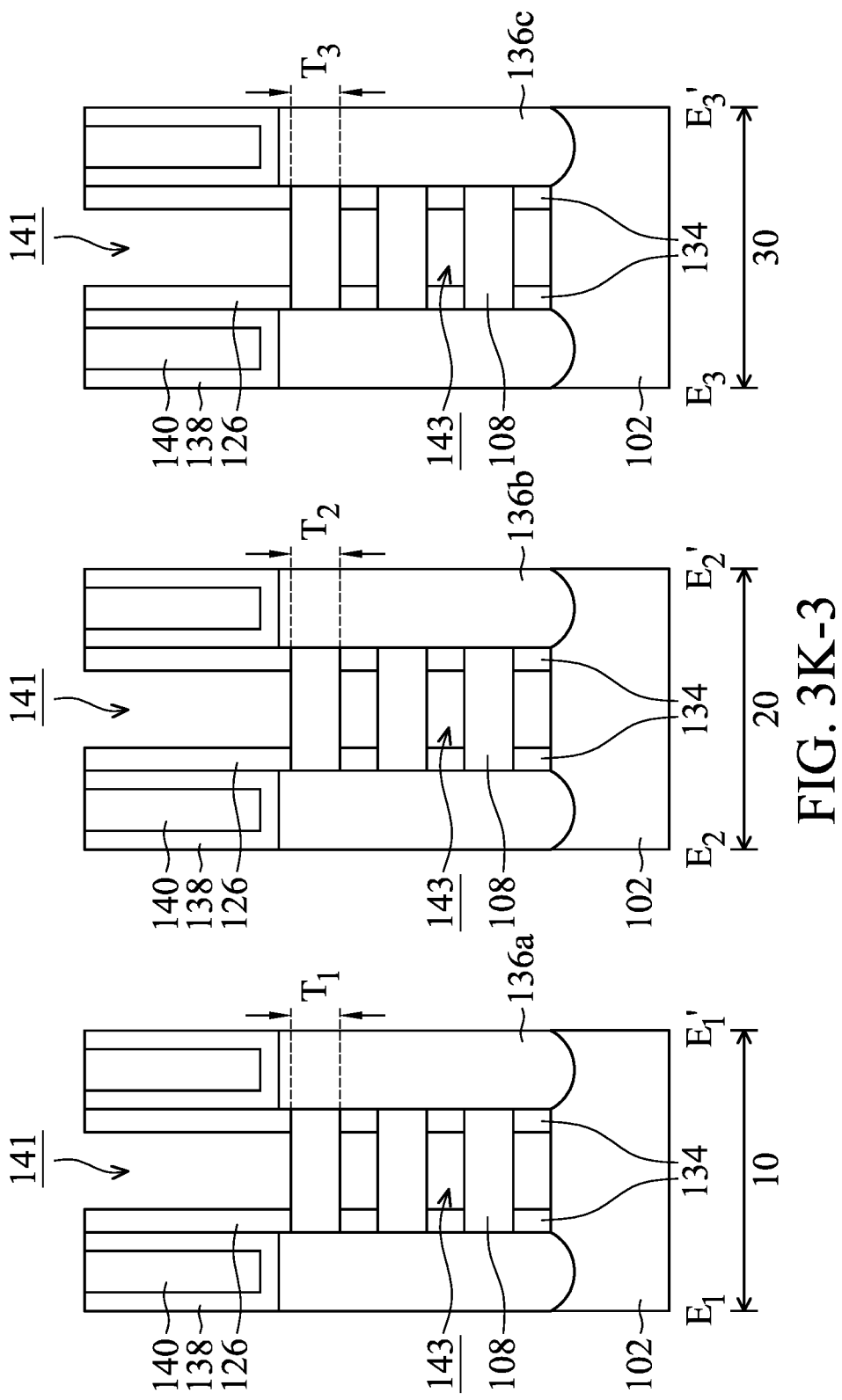
Figures 1, 3L:
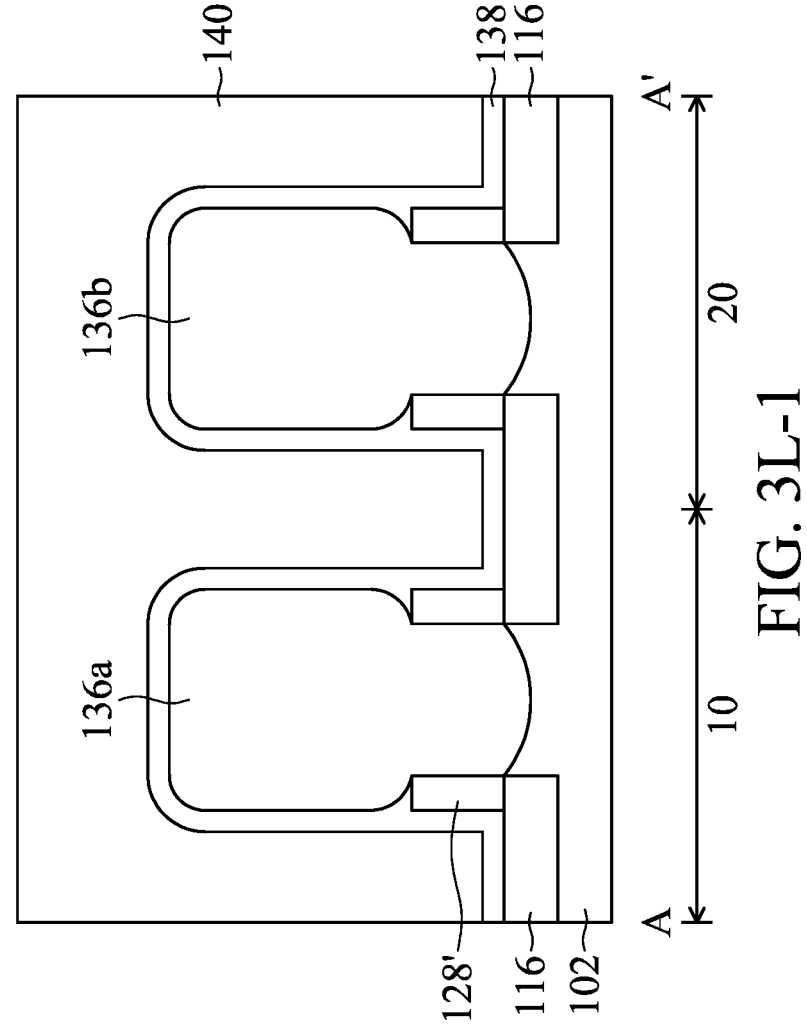
Figures 2, 3L:
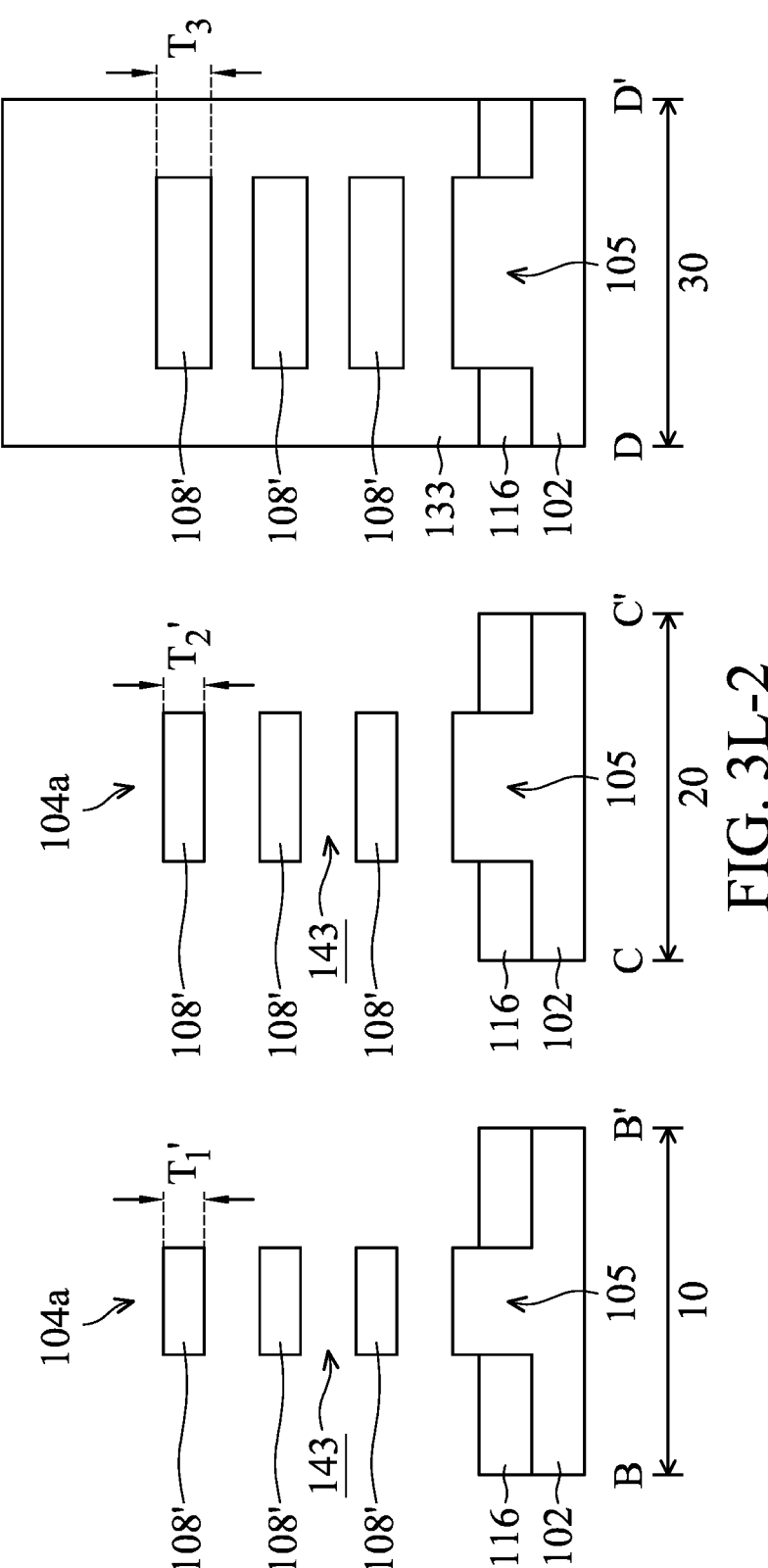
Figures 3, 3L:
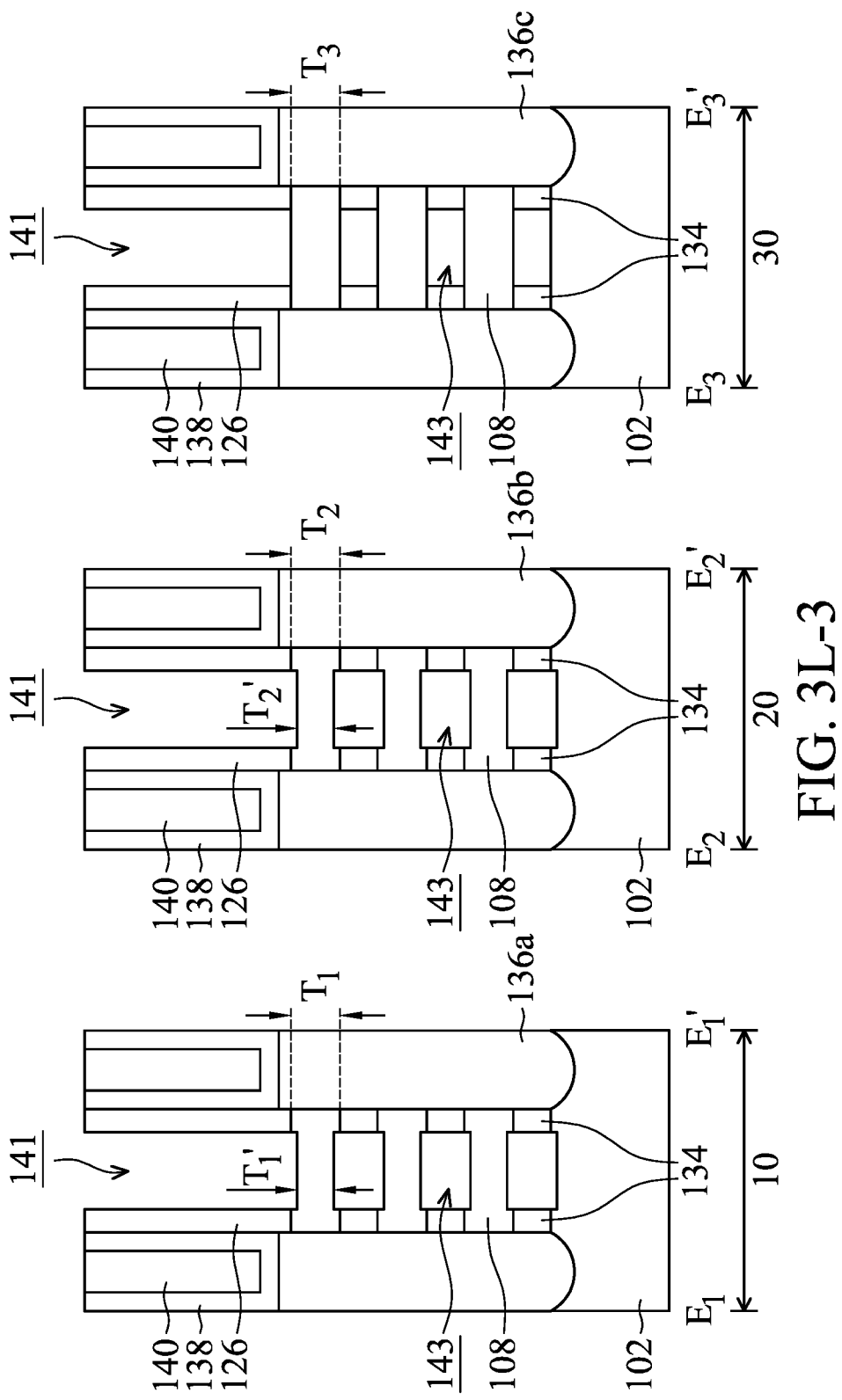
Figures 1, 3M:
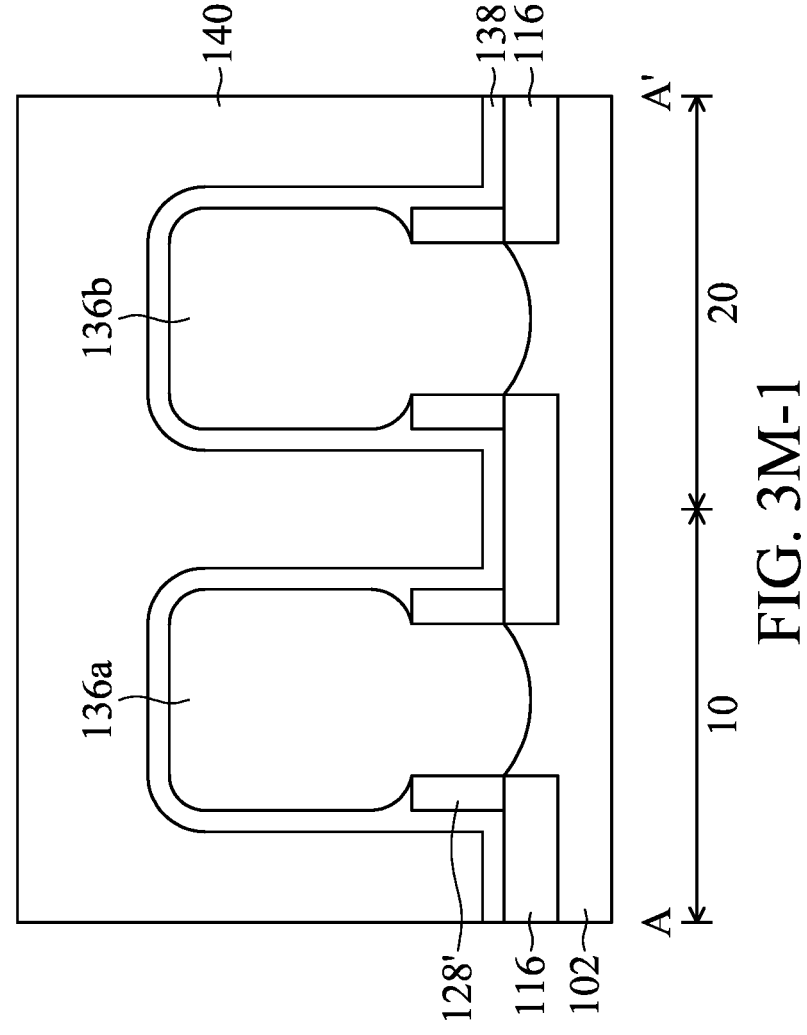
Figures 2, 3M:
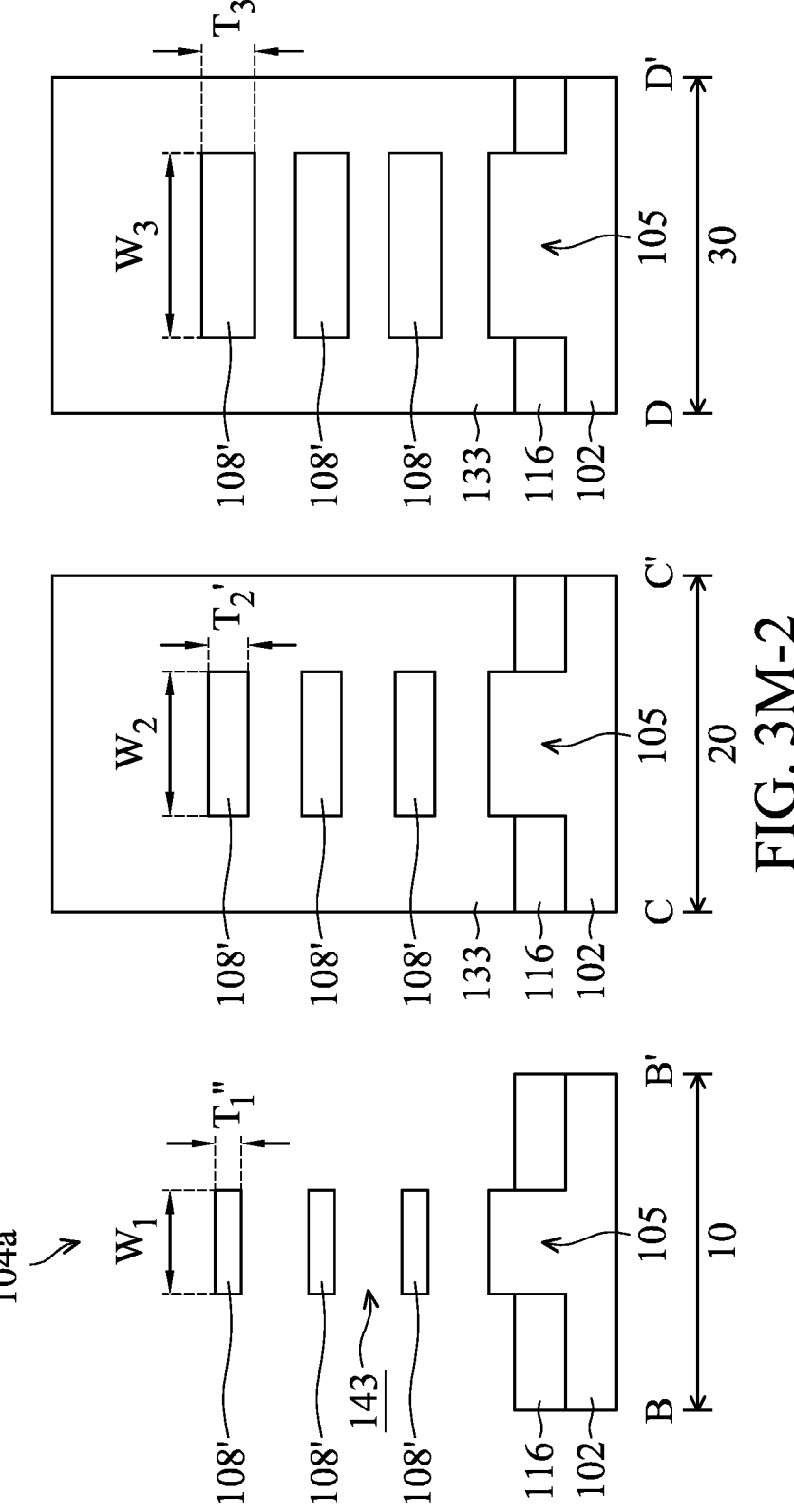
Figures 3, 3M:
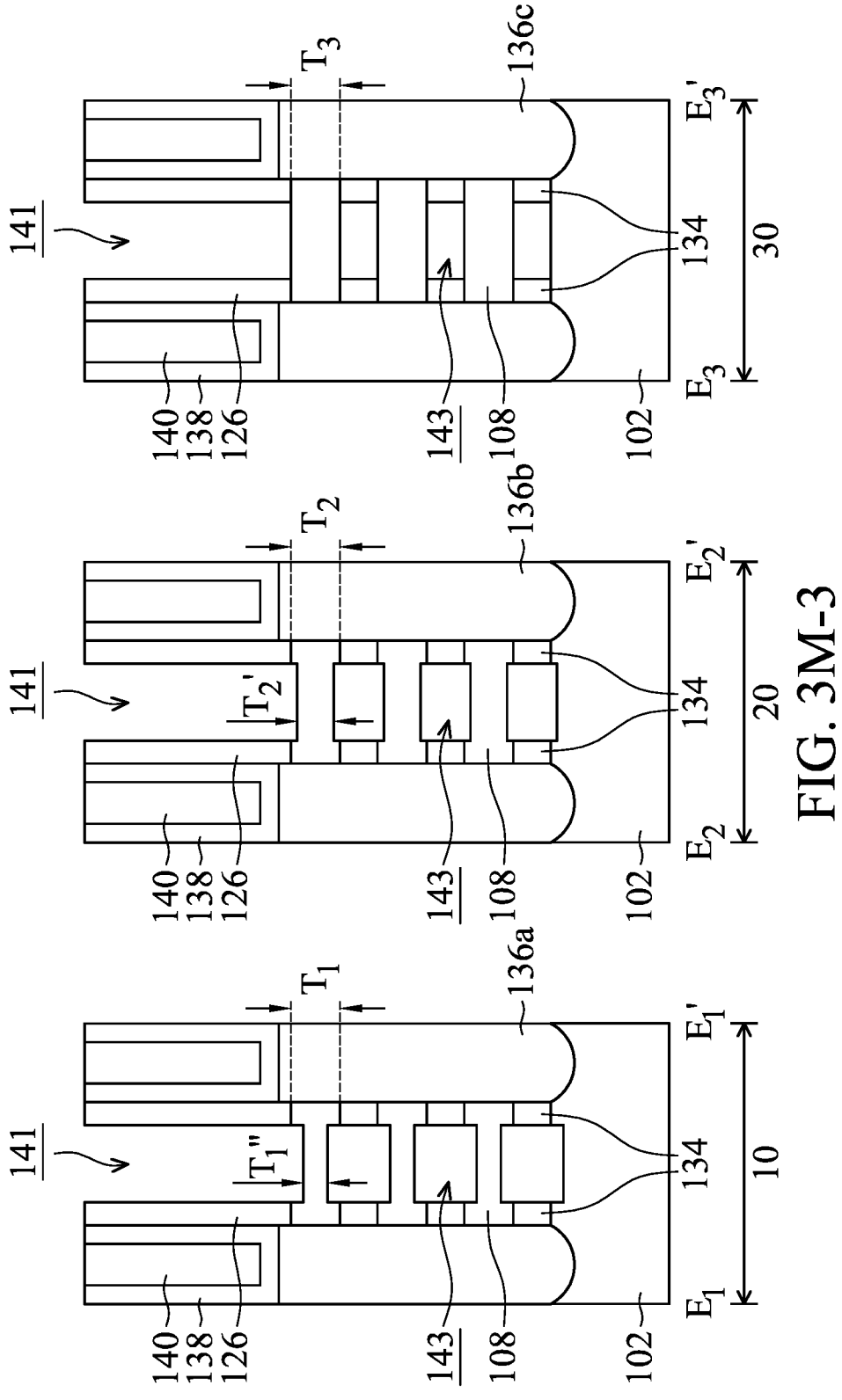
Figures 1, 3N:
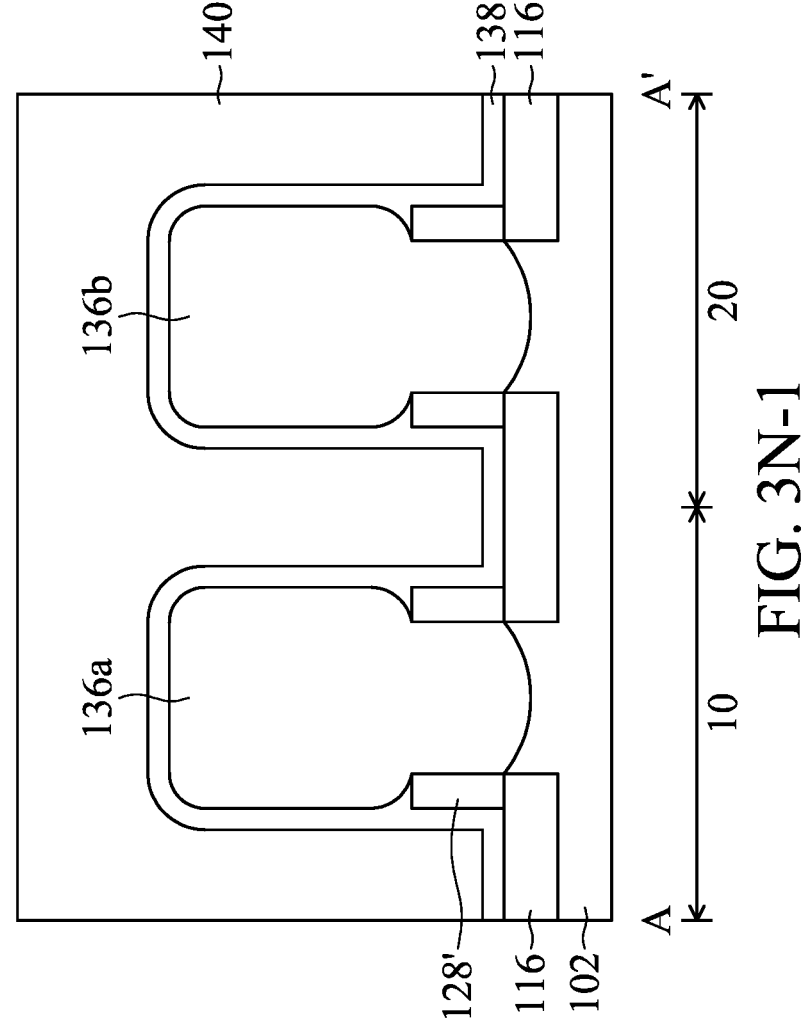
Figures 2, 3N:
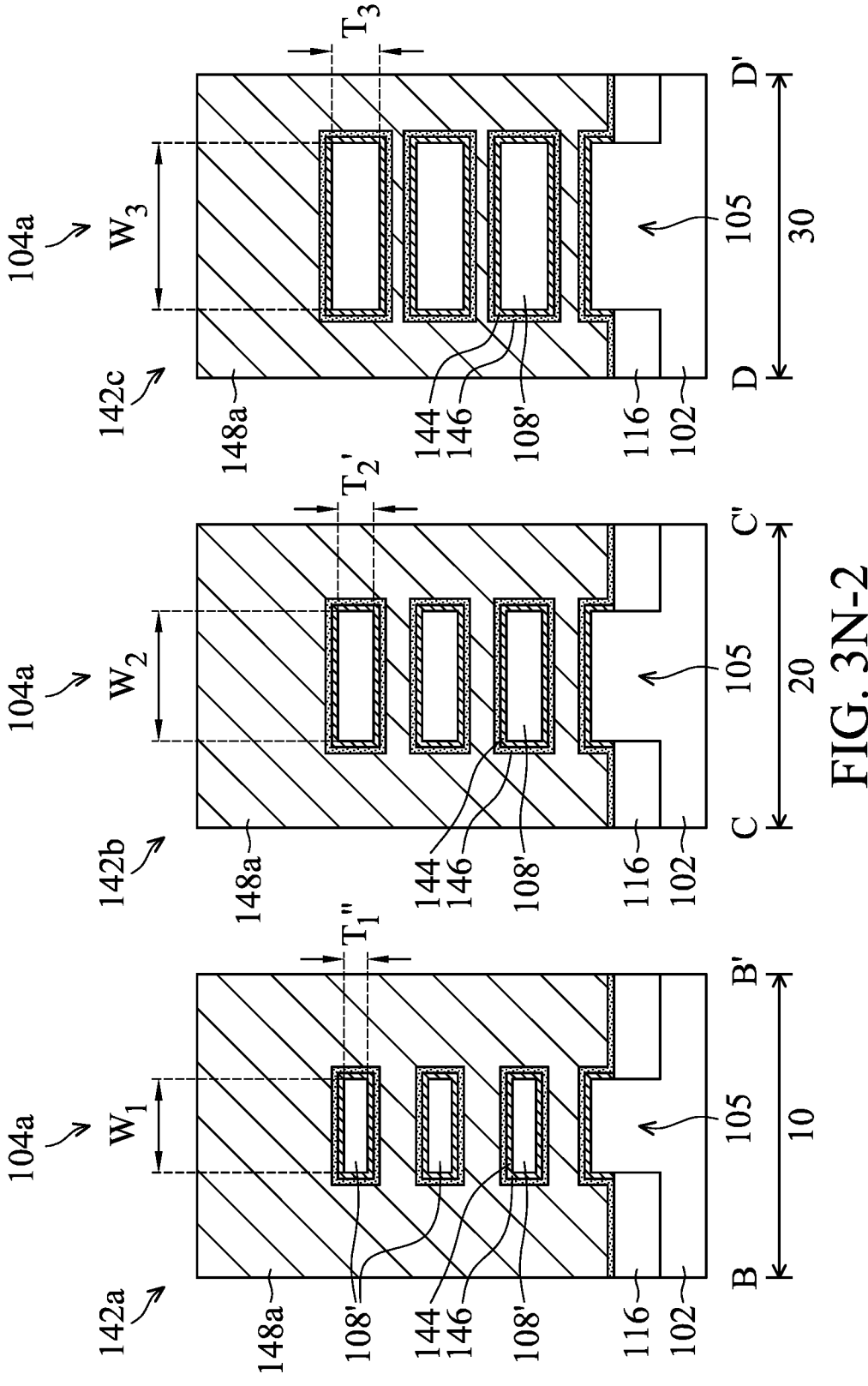
Figures 3, 3N:
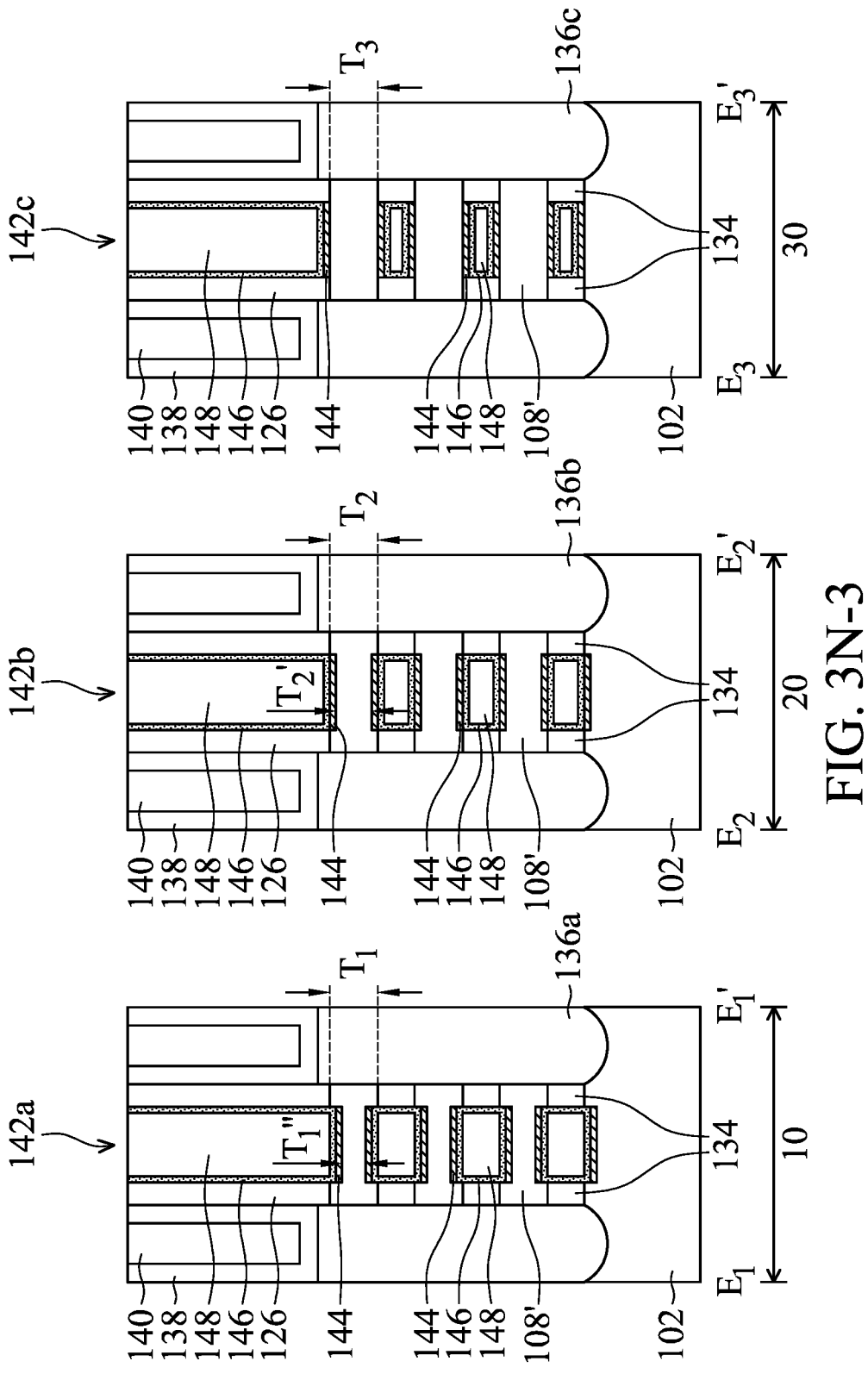
Figures 3, 3N, 4:
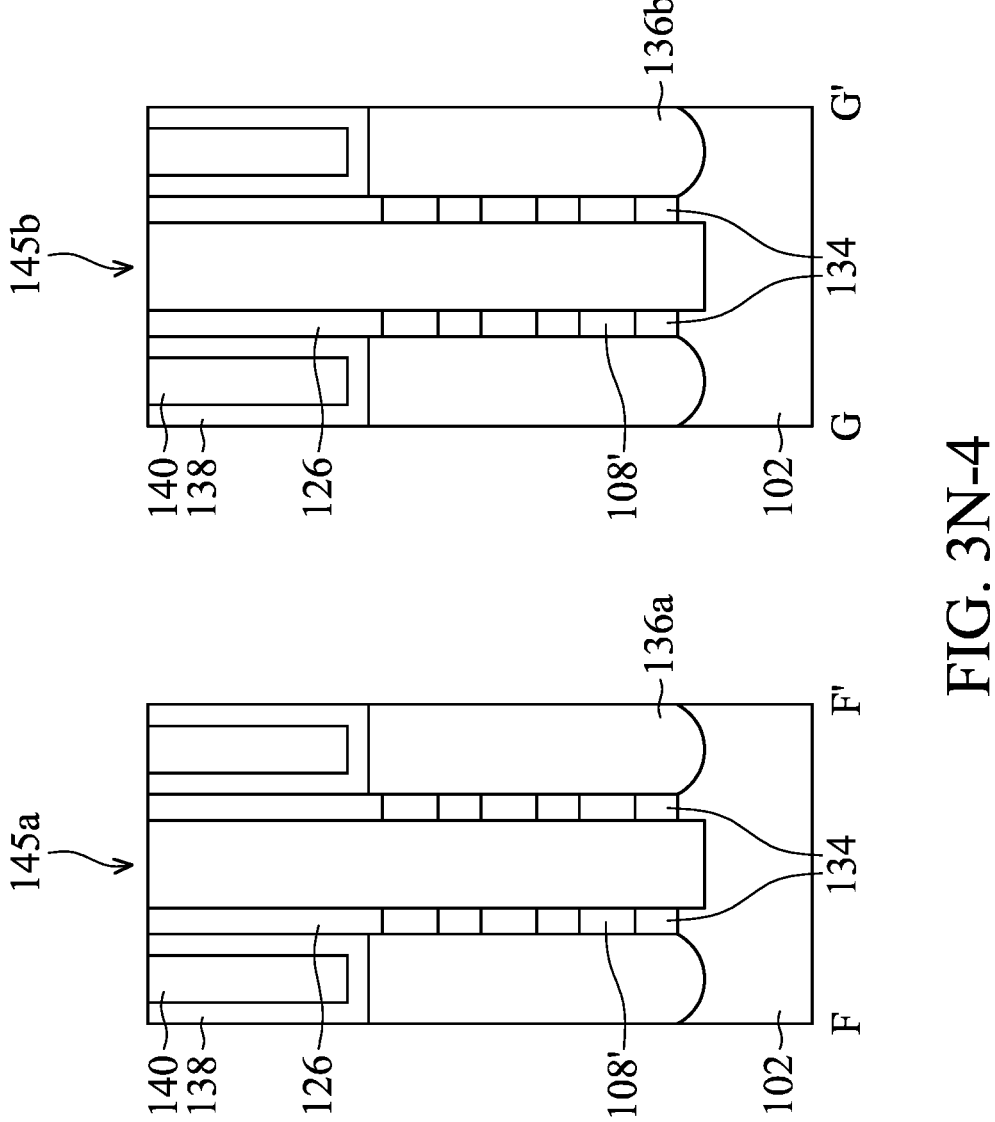
Figures 1, 3O:
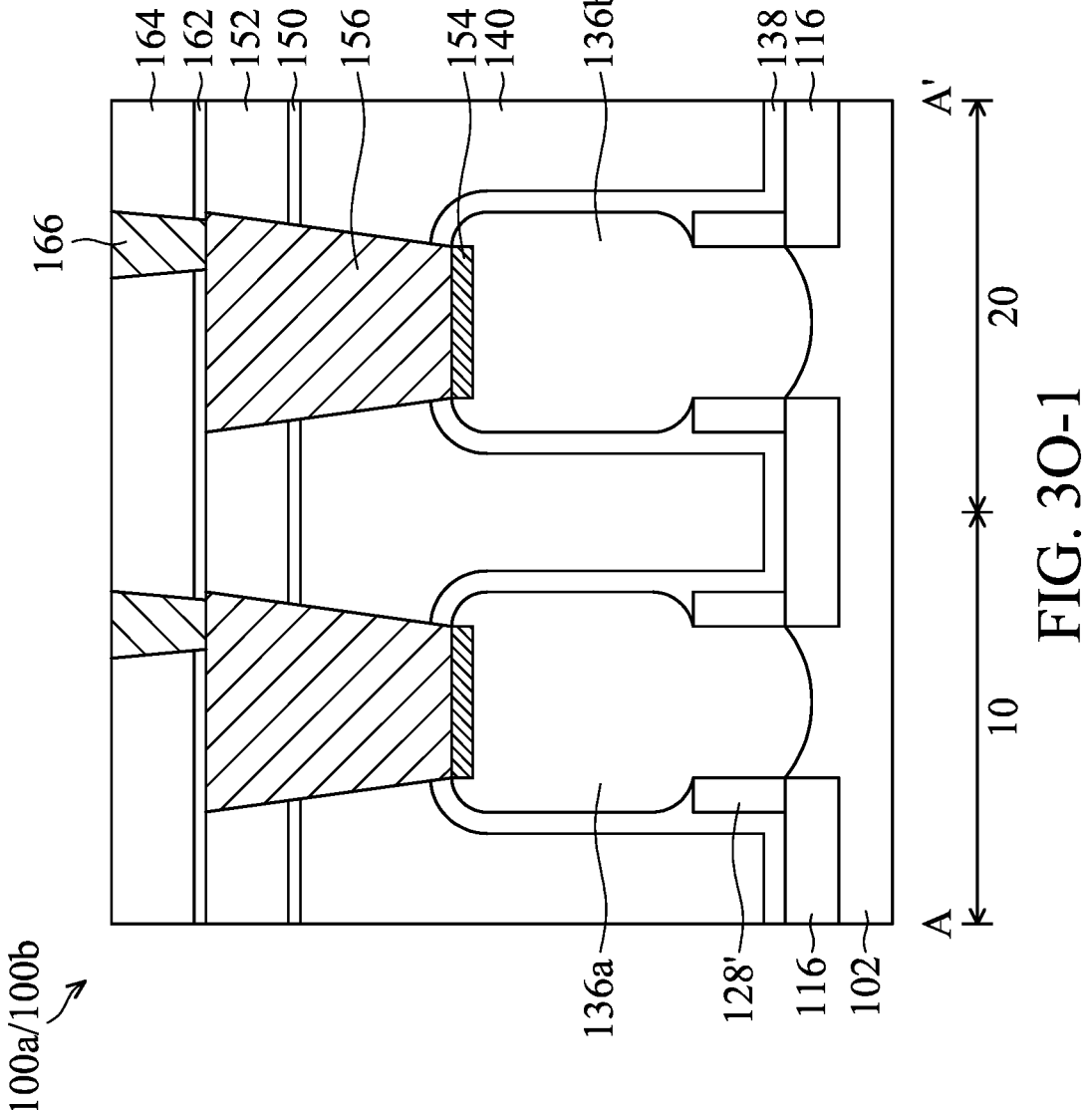
Figures 2, 3O:
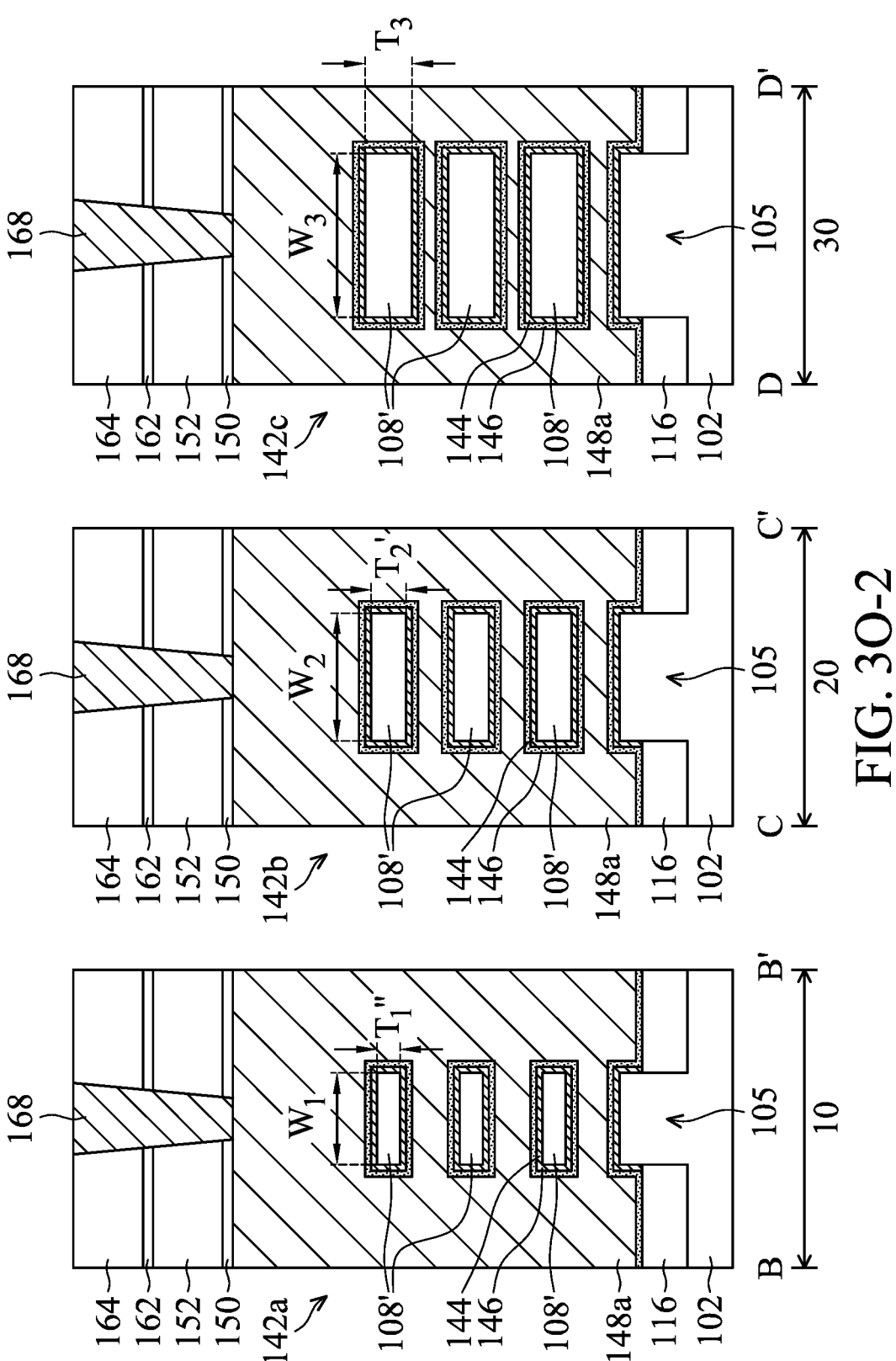
Figures 3, 3O:
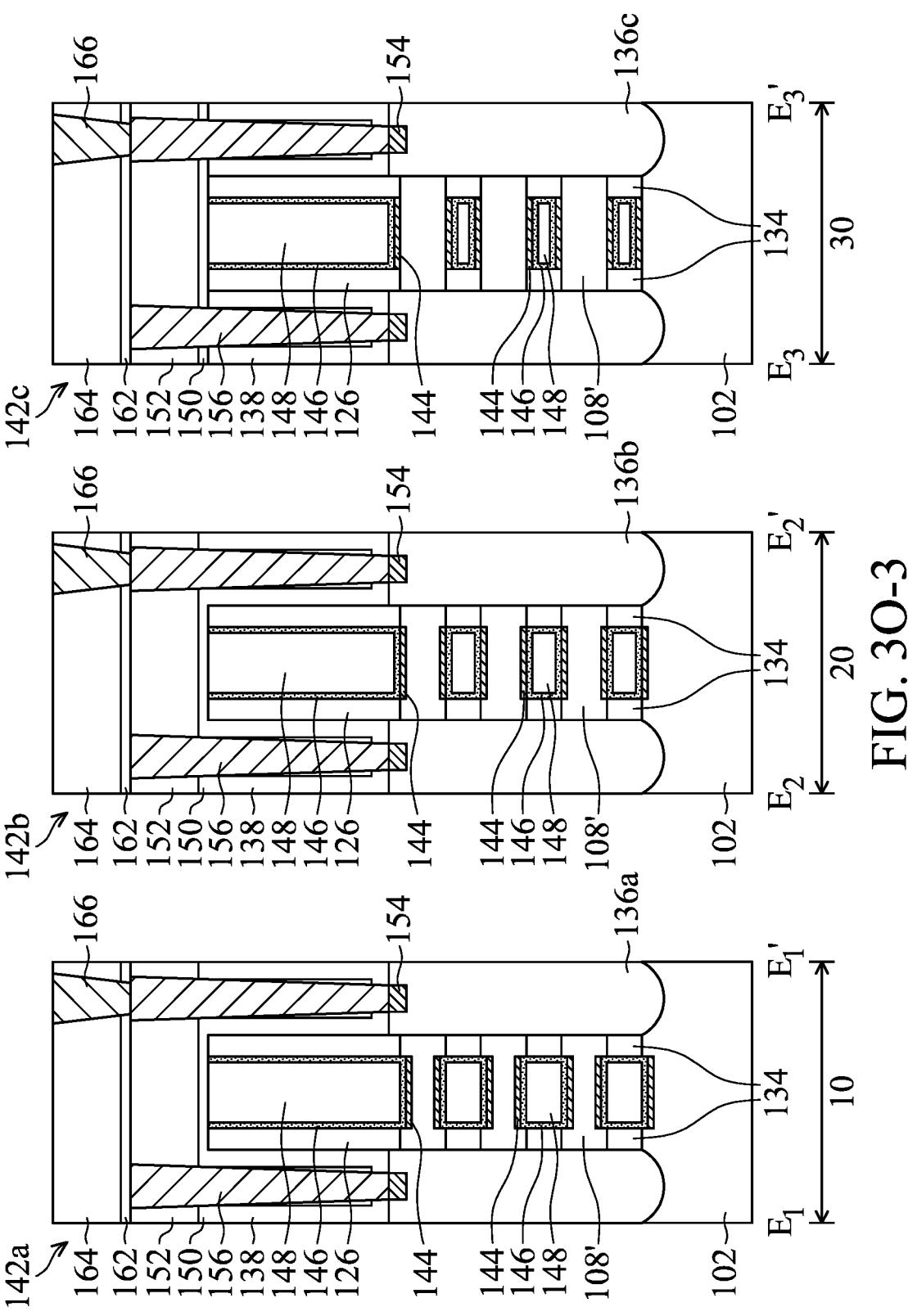
Figures 3, 3O, 4:
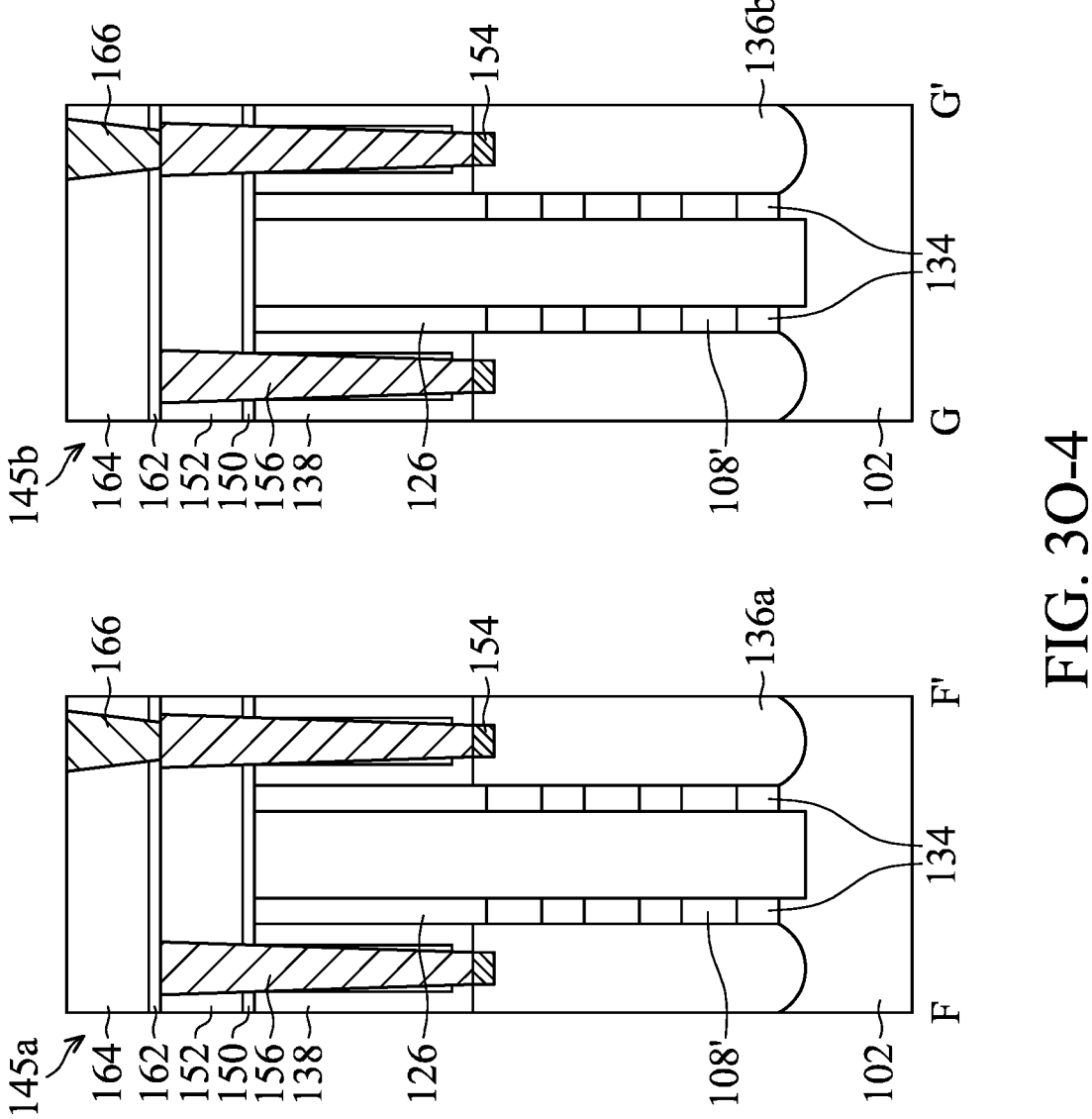
Figure 4:
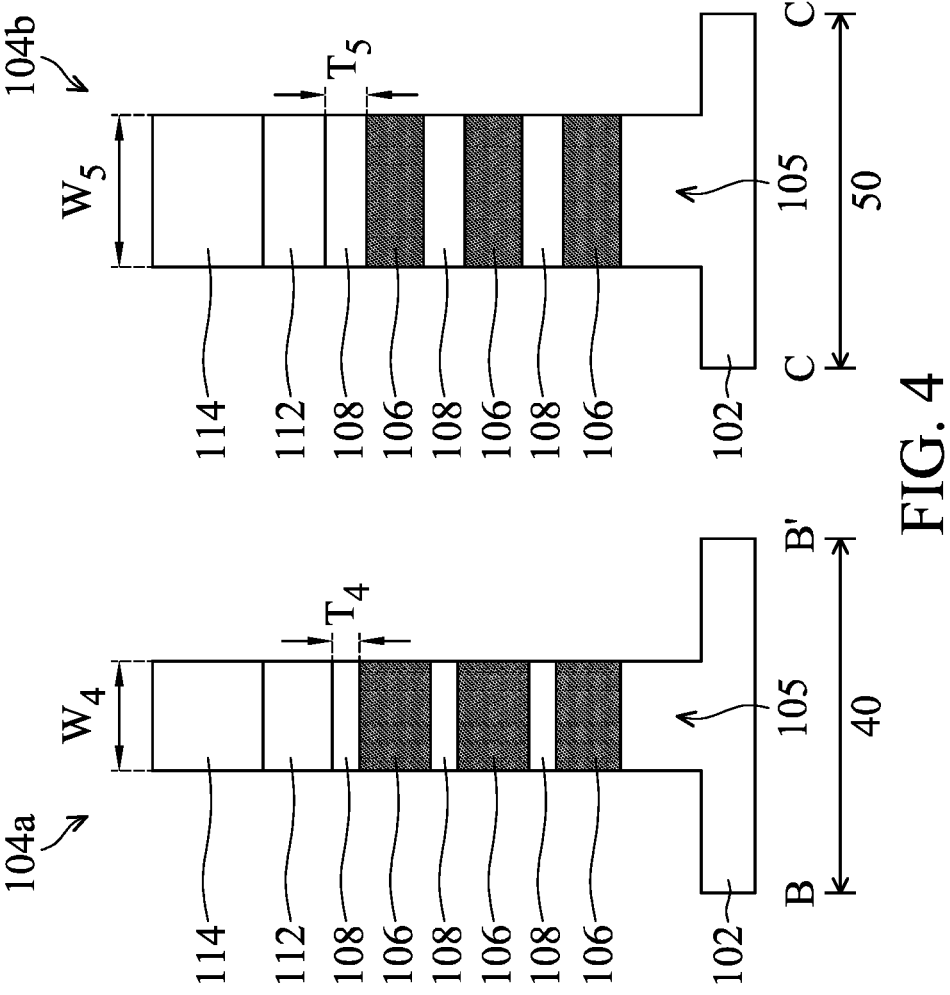

FIGS. 3A-1 to 3O-1 illustrate cross-sectional representations of various stages of manufacturing the semiconductor structure 100a or 100b shown along line A-A' in FIGS. 1E, 2A and 2B, in accordance with some embodiments. FIGS. 3A-2 to 3O-2 illustrate cross-sectional representations of various stages of manufacturing the semiconductor structure 100a or 100b shown along line B-B', C-C; and D-D' in FIGS. 1E, 2A and 2B, in accordance with some embodiments. FIGS. 3A-3 to 3O-3 illustrate cross-sectional representations of various stages of manufacturing the semiconductor structure 100a or 100b shown along line $E_1$-$E_1$', $E_2$-$E_2$' and $E_3$-$E_3$' in FIGS. 1E, 2A and 2B, in accordance with some embodiments. FIGS. 3N-4 to 3O-4 illustrate cross-sectional representations of various stages of manufacturing the semiconductor structure 100a shown along line F-F' and line G-G' in FIGS. 1E and 2A, in accordance with some embodiments.

More specifically, FIG. 3A-1 illustrates the cross-sectional representation shown along line A-A' in FIGS. 1E, 2A and 2B. FIG. 3A-2 illustrates the cross-sectional representation shown along line B-B', C-C; and D-D' in FIGS. 1E, 2A and 2B, in accordance with some embodiments. FIG. 3A-3 illustrates the cross-sectional representation shown along line $E_1$-$E_1$', $E_2$-$E_2$' and $E_3$-$E_3$' in FIGS. 1E, 2A and 2B.

Next, as shown in FIGS. 3B-1, 3B-2 and 3B-3, after the gate spacer layers 126 and the fin spacer layers 128 are formed, the source/drain (S/D) regions of the fin structure 104 are recessed to form source/drain (S/D) recesses 130, as shown in in accordance with some embodiments. More specifically, the first semiconductor material layers 106 and the second semiconductor material layers 108 not covered by the dummy gate structures 118 and the gate spacer layers 126 are removed, in accordance with some embodiments. In addition, some portions of the base fin structure 105 are also recessed to form curved top surfaces, as shown in FIG. 3B-1 in accordance with some embodiments.

In some embodiments, the first fin structure 104a and the second fin structure 104b are recessed by performing an etching process. The etching process may be an anisotropic etching process, such as dry plasma etching, and the first dummy gate structure 118a, the second dummy gate structure 118b and the gate spacer layers 126 are used as etching masks during the etching process. In some embodiments, the fin spacer layers 128 are also recessed to form lowered fin spacer layers 128'.

Afterwards, as shown in FIGS. 3C-1, 3C-2 and 3C-3, after the source/drain (S/D) recesses 130 are formed, the first semiconductor material layers 106 exposed by the source/drain recesses 130 are laterally recessed to form notches 132, in accordance with some embodiments.

In some embodiments, an etching process is performed on the semiconductor structure 100a to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a Next, as shown in FIGS. 3D-1, 3D-2 and 3D-3, inner spacers 134 are formed in the notches 132 between the second semiconductor material layers 108, in accordance with some embodiments. The inner spacers 134 are configured to separate the source/drain (S/D) structures and the gate structures formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Afterwards, as shown in FIGS. 3E-1, 3E-2 and 3E-3, after the inner spacers 134 are formed, a hard mask layer 129 is formed on the lowered fin spacer layers 128', the first fin structure 104a, the second fin structure 104b, and isolation structure 116, in accordance with some embodiments. Next, a photoresist layer 131 is formed over a portion of the hard mask layer 129. The photoresist layer 131 is patterned to form a patterned photoresist layer 131 to transfer the pattern to the hard mask layer 129. The patterned photoresist layer 131 is formed in the second region 20.

The lowered fin spacer layers 128 have a high etching selectivity with respect to the hard mask layer 129. When the hard mask layer 129 is removed, the lowered fin spacer layers 128 are rarely removed. In some embodiments, the hard mask layer 129 is made of nitride or oxide, such as silicon nitride or aluminum oxide ($Al_2O_3$) or another applicable material. In some embodiments, the hard mask layer 129 is formed by chemical vapor deposition (CVD), atomic vapor deposition (ALD), physical vapor deposition (PVD), another suitable method, or a combination thereof.

Afterwards, as shown in FIGS. 3F-1, 3F-2 and 3F-3, a portion of the hard mask layer 129 in the first region 10 which is not coved by the photoresist layer 131 is removed to expose the first S/D recess 130, and then the photoresist layer 131 is removed, and a first source/drain (S/D) structure 136a is formed in the S/D recesses 130, in accordance with some embodiments.

In some embodiments, the first source/drain (S/D) structure 136a is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the first source/drain (S/D)

structure 136a is made of any applicable material, such as Ge, Si, GaAs, AlGaAs, SiGe, GaAsP, SiP, SiC, SiCP, or a combination thereof.

In some embodiments, the first source/drain (S/D) structure 136a is in-situ doped during the epitaxial growth process. For example, the first source/drain (S/D) structure 136a may be the epitaxially grown SiGe doped with boron (B). For example, the first source/drain (S/D) structure 136a may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the first source/drain (S/D) structure 136a is doped in one or more implantation processes after the epitaxial growth process.

Next, as shown in FIGS. 3G-1, 3G-2 and 3G-3, after the first source/drain (S/D) structure 136a formed, the hard mask layer 129 is again formed on the lowered fin spacer layers 128', the isolation structure 116 and the first S/D structure 136a, in accordance with some embodiments. Next, the photoresist layer 131 is formed over a portion of the hard mask layer 129 in the first region 10, and the photoresist layer 131 is patterned to form a patterned photoresist layer 131. The patterned photoresist layer 131 is in the first region 10.

Next, a portion of the hard mask layer 129 is removed to expose the second S/D recess 130 in the second region 20. The remaining hard mask layer 129 is used to protect the first S/D structure 136a. Next, the photoresist layer 131 is removed.

Afterwards, as shown in FIGS. 3H-1, 3H-2 and 3H-3, a second S/D structure 136b is formed in the second S/D recess 130 in the second region 20. Next, the hard mask layer 129 is removed after the second S/D structure 136b is formed.

In some embodiments, the second S/D structures 136b is made of any applicable material, such as Ge, Si, GaAs, AlGaAs, SiGe, GaAsP, SiP, SiC, SiCP, or a combination thereof. In some embodiments, the second S/D structure 136b is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof.

In some embodiments, the second S/D structure 136b is in-situ doped during the epitaxial growth process. For example, the second S/D structure 136b may be the epitaxially grown SiGe doped with boron (B). For example, the second S/D structure 136b may be the epitaxially grown Si doped with carbon to form silicon:carbon (Si:C) source/drain features, phosphorous to form silicon: phosphor (Si:P) source/drain features, or both carbon and phosphorous to form silicon carbon phosphor (SiCP) source/drain features. In some embodiments, the second S/D structures 136b are doped in one or more implantation processes after the epitaxial growth process.

Afterwards, as shown in FIGS. 3I-1, 3I-2 and 3I-3, a contact etch stop layer (CESL) 138 is conformally formed to cover the first S/D structures 136a, the second S/D structure 136b and an interlayer dielectric (ILD) layer 140 is formed over the contact etch stop layers 138, in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the contact etch stop layer 138 and the ILD layer 140 are deposited, a planarization process such as CMP or an etch-back process may be performed until the gate electrode layers 120 of the dummy gate structures 118 are exposed, as shown in FIG. 3I-3 in accordance with some embodiments.

Afterwards, as shown in FIGS. 3J-1, 3J-2 and 3J-3, the first dummy gate structure 118a and the second dummy gate structure 118b are removed to form a trench 141, in accordance with some embodiments. As a result, the first fin structure 104a and the second fin structure 104b are exposed by the trench 141.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

Next, as shown in FIGS. 3K-1, 3K-2 and 3K-3, the first semiconductor material layers 106 are removed to form nanostructures 108' (or channel layers 108') with the second semiconductor material layers 108, in accordance with some embodiments.

As shown in FIG. 3K-2, the nanostructures 108' (or channel layers 108') in the first region 10 has a first thickness $T_1$ along the vertical direction, the nanostructures 108' (or channel layers 108') in the second region 20 has a second thickness $T_2$ along the vertical direction, and the nanostructures 108' (or channel layers 108') in the third region 30 has a third thickness $T_3$ along the vertical direction. In some embodiments, the first thickness $T_1$ is substantially equal to the second thickness $T_2$, and the second thickness $T_2$ is substantially equal to the third thickness $T_3$.

The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Afterwards, as shown in FIGS. 3L-1, 3L-2 and 3L-3, the nanostructures 108' (or channel layers 108') in the third region 30 are covered by a mask layer 133, and nanostructures 108' (or channel layers 108') in the first region 10 and the second region 20 directly below the trench 141 are exposed, in accordance with some embodiments. Next, a first etching process is performed on the exposed nanostructures 108' in the first region 10 and the second region 20, and therefore a portion of each of the nanostructures 108' in the first region 10 is removed to form a thinned first thickness $T_1'$, and a portion of each of the nanostructures 108' in the second region 20 is also removed to form a thinned second thickness $T_2'$. In some embodiments, the thinned first thickness $T_1'$ is substantially equal to the thinned second thickness $T_2'$.

Note that a portion of the nanostructures 108' directly below the trench 141 is exposed, but another portion of the nanostructures 108' directly below the gate spacer layer 126 is not removed.

Next, as shown in FIGS. 3M-1, 3M-2 and 3M-3, after the first etching process is performed, the nanostructures 108' in the second region 20 is covered by the mask layer 133, and a second etching process is performed on the exposed nanostructures 108' in the first region 10, in accordance with some embodiments. As a result, a portion of each of the nanostructures 108' in the first region 10 is removed again to form a thinned first thickness $T_1''$. The thinned first thickness $T_1''$ is smaller than the thinned first thickness $T_1'$. In some embodiments, the thinned first thickness $T_1''$ is smaller than the thinned second thickness $T_2'$, and the thinned second thickness $T_2'$ is smaller than the third thickness T3. In some embodiments, the difference between the thinned first thickness $T_1''$ and the thinned second thickness $T_2'$ is in a range from about 0.5 nm to about 5 nm. In some embodiments, the difference between the thinned second thickness $T_2'$ and the third thickness $T_3$ is in a range from about 0.5 nm to about 5 nm.

Afterwards, as shown in FIGS. 3N-1, 3N-2 and 3N-3, after the second etching process, a first gate structure 142a, a second gate structure 142b and a third gate structure 142c are formed to surround the nanostructures 108' and over the isolation structure 116, in accordance with some embodiments.

After the nanostructures 108' are formed, the first gate structure 142a, the second gate structure 142b and the third gate structure 142c are formed wrapped around the nanostructures 108'. The first gate structure 142a, the second gate structure 142b and the third gate structure 142c wrap around the nanostructures 108' to form gate-all-around transistor structures (GAA) in accordance with some embodiments.

In the first region 10, the first gate structure 142a has a continuous sidewall surface in direct contact with the gate spacer layer 126, and the bottom surface of the continuous sidewall surface of the first gate structure 142a is lower than the bottom surface of the gate spacer layer 126. In addition, the continuous sidewall surface of the first gate structure 142a is in direct contact with the topmost nanostructure 108a'.

In the second region 20, the second gate structure 142b has a continuous sidewall surface in direct contact with the gate spacer layer 126, and the bottom surface of the continuous sidewall surface of the second gate structure 142b is lower than the bottom surface of the gate spacer layer 126. In addition, the continuous sidewall surface of the second gate structure 142b is in direct contact with the topmost nanostructure 108a'.

In some embodiments, the first gate structure 142a includes an interfacial layer 144, a gate dielectric layer 146, and a first gate electrode layer 148a. In some embodiments, the second gate structure 142b includes an interfacial layer 144, a gate dielectric layer 146, and a second gate electrode layer 148b. In some embodiments, the third gate structure 142c includes an interfacial layer 144, a gate dielectric layer 146, and a third gate electrode layer 148c.

In some embodiments, the interfacial layers 144 are oxide layers formed around the nanostructures 108' and on the top of the base fin structure 105. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a In some embodiments, the first gate structure 142a and the second gate structure 142b are formed on the gate dielectric layer 146. In some embodiments, the first gate structure 142a and the second gate structure 142b are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the first gate structure 142a and the second gate structure 142b are formed using chemical vapor deposition (CVD), atomic layer deposition (ALD), electroplating, another applicable method, or a combination thereof. Other conductive layers, such as work function metal layers, may also be formed in the first gate structure 142a and the second gate structure 142b, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, and first gate structure 142a and the second gate structure 142b are formed, a planarization process such as CMP or an etch-back process may be performed until ILD layer 140 is exposed.

FIGS. 3N-4 to 3O-4 illustrate cross-sectional representations of various stages of manufacturing the semiconductor structure 100a shown along line F-F' and line G-G' in FIGS. 1E and 2A, in accordance with some embodiments.

As shown in FIG. 3N-4, the first dielectric structure 145a is formed between the second region 20 and the third region 30, and the second dielectric structure 145b is formed between the third region 30 and the fourth region 40. The first dielectric structure 145a is between the first gate structure 142a and the second gate structure 142b. The second dielectric structure 145b is between the second gate structure 142b and the third gate structure 142c.

The first dielectric structure 145a is in parallel to the first gate structure 142a. The second dielectric structure 145b is in parallel to the third gate structure 142c. The first dielectric structure 145a and the second dielectric structure 145b are used to reduce the leakage of two adjacent semiconductor devices.

The first dielectric structure 145a is formed by following steps. The second semiconductor material layers 108' directly below the fourth dummy gate structure 148*d* are removed to form a trench, and then a dielectric material is formed in the trench to form the first dielectric structure 145*a*. The bottom surface of the first dielectric structure 145*a* is lower than the bottom surface of first S/D structure 136*a*. The bottom surface of the first dielectric structure 145*a* is lower than the bottommost surface of the first gate structure 142*a*. In addition, the first dielectric structure 145*a* is in direct contact with the inner spacer layer 134 and the gate spacer layer 126.

Afterwards, as shown in FIGS. 3O-1, 3O-2 and 3O-3, an etch stop layer 150 is formed over the first gate structure 142*a*, the second gate structure 142*b* and the third gate structure 142*c*, and a dielectric layer 152 is formed over the etch stop layer 150, in accordance with some embodiments.

In some embodiments, the etch stop layer 150 is made of a dielectric materials, such as silicon nitride, silicon oxide, silicon oxynitride, another suitable dielectric material, or a combination thereof. The dielectric material for the etch stop layers 150 may be conformally deposited over the semiconductor structure by performing chemical vapor deposition (CVD), ALD, other application methods, or a combination thereof.

The dielectric layer 152 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 152 may be formed by chemical vapor deposition (CVD), physical vapor deposition, (PVD), atomic layer deposition (ALD), or other applicable processes.

Next, a silicide layer 154 and an S/D contact structure 156 are formed over the first S/D structure 136*a* and the second S/D structure 136*b*, in accordance with some embodiments.

In some embodiments, the contact openings may be formed through the contact etch stop layer 138, the interlayer dielectric layer 140, the etch stop layer 150 and the dielectric layer 152 to expose the top surfaces of the first S/D structures 136*a* and the second S/D structure 136*b*, and then the silicide layers 154 and the S/D contact structure 156 may be formed in the contact openings. The contact openings may be formed using a photolithography process and an etching process. In addition, some portions of the first S/D structure 136*a* and second S/D structure 136*b* exposed by the contact openings may also be etched during the etching process.

The silicide layers 154 may be formed by forming a metal layer over the top surfaces of the first S/D structure 136*a* and the second S/D structure 136*b* and annealing the metal layer so the metal layer reacts with the first S/D structure 136*a* and the second S/D structure 136*b* to form the silicide layers 154. The unreacted metal layer may be removed after the silicide layers 154 are formed.

The S/D contact structure 156 may include a barrier layer and a conductive layer. In some other embodiments, the S/D contact structure 156 does not include a barrier layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or other applicable processes.

After the S/D contact structure 156 are formed, an etch stop layer 162 is formed over the S/D contact structure 156, and a dielectric layer 164 is formed over the etch stop layer 162, in accordance with some embodiments. Next, a S/D conductive via 166 is formed over the S/D contact structure 156, and a gate conductive plug 168 is formed over the first gate structure 142*a* and the second gate structure 142*b*.

In some embodiments, the etch stop layer 162 is made of a dielectric materials, such as silicon nitride, silicon oxide, silicon oxynitride, another suitable dielectric material, or a combination thereof. The dielectric material for the contact etch stop layers 162 may be conformally deposited over the semiconductor structure by performing chemical vapor deposition (CVD), atomic layer deposition (ALD), other application methods, or a combination thereof.

The dielectric layer 164 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 164 may be formed by chemical vapor deposition (CVD), physical vapor deposition, (PVD), atomic layer deposition (ALD), or other applicable processes.

In some embodiments, the S/D conductive via 166 is made of conductive material, such as tungsten (W), ruthenium (Ru), molybdenum (Mo), or the like. In some embodiments, the S/D conductive via 166 is formed by performing a deposition process, such as chemical vapor deposition (CVD), physical vapor deposition, (PVD), atomic layer deposition (ALD), or other applicable processes.

In some embodiments, the gate conductive plug 168 is made of conductive material, such as tungsten (W), ruthenium (Ru), molybdenum (Mo), or the like. In some embodiments, the gate conductive plug 168 is formed by performing a deposition process, such as chemical vapor deposition (CVD), physical vapor deposition, (PVD), atomic layer deposition (ALD), or other applicable processes.

It should be noted that the thinned first thickness $T_1''$ of the nanostructures 108' directly below the first gate structure 142*a* is smaller than the thinned second thickness $T_2'$ of the nanostructures 108' directly below the second gate structure 142*b*. In addition, the thinned second thickness $T_2'$ of the nanostructures 108' directly below the second gate structure 142*b* is smaller than the third thickness $T_3$ of the nanostructures 108' directly below the third gate structure 142*c*. Each of the nanostructures 108' in the first region 10 directly below the first gate structure 142*a* has a first width $W_1$ along the second direction, each of the nanostructures 108' in the second region 20 directly below the second gate structure 142*b* has a second width $W_2$ along the second direction, and each of the nanostructures 108' in the third region 30 directly below the third gate structure 142*c* has a third width $W_3$ along the second direction. In some embodiments, the first width $W_1$ is smaller than the second width $W_2$, and the second width $W_2$ is smaller than the third width $W_3$.

It should be noted that the thinned first thickness $T_1''$ of the nanostructures 108' directly below the first gate structure 142*a* is smaller than the original thickness $T_1$ of the nanostructures 108' directly below the gate spacer layer 126 in the first region 10. The thinned second thickness $T_2'$ of the nanostructures 108' directly below the second gate structure 142*a* is smaller than the original second thickness $T_2$ of the nanostructures 108' directly below the gate spacer layer 126 in the second region 20. The third thickness $T_3$ of the nanostructures 108' directly below the third gate structure 142a is substantially equal to the third thickness $T_3$ of the nanostructures 108' directly below the gate spacer layer 126 in the third region 30.

It should be noted that one of the nanostructures 108' in the first region 10 has a dumbbell shaped structure with two end portions having thickness $T_1$ and a middle portion having thinned thickness $T_1$". The thinned thickness $T_1$" of the middle portion is smaller than the thickness $T_1$ of each of end portions. In the second region 20, one of the nanostructures 108' also has a dumbbell shaped structure with two end portions having thickness $T_2$ and a middle portion having thinned thickness $T_2$". The thinned thickness $T_2$" of the middle portion is smaller than the thickness $T_2$ of each of end portions.

In order to fulfill different needs in a region, the first gate structure 142a in the first region 10 is formed for power efficiency than the second gate structure 142b and the third gate structure 142c. The third gate structure 142c in the third region 30 is formed for high speed performance than the first gate structure 142a and the second gate structure 142b. The first gate structure 142a, second gate structure 142b and the third gate structure with different widths and thicknesses co-exist to achieve multi-nanostructures for speed performance and power efficiency.

Figure 5:
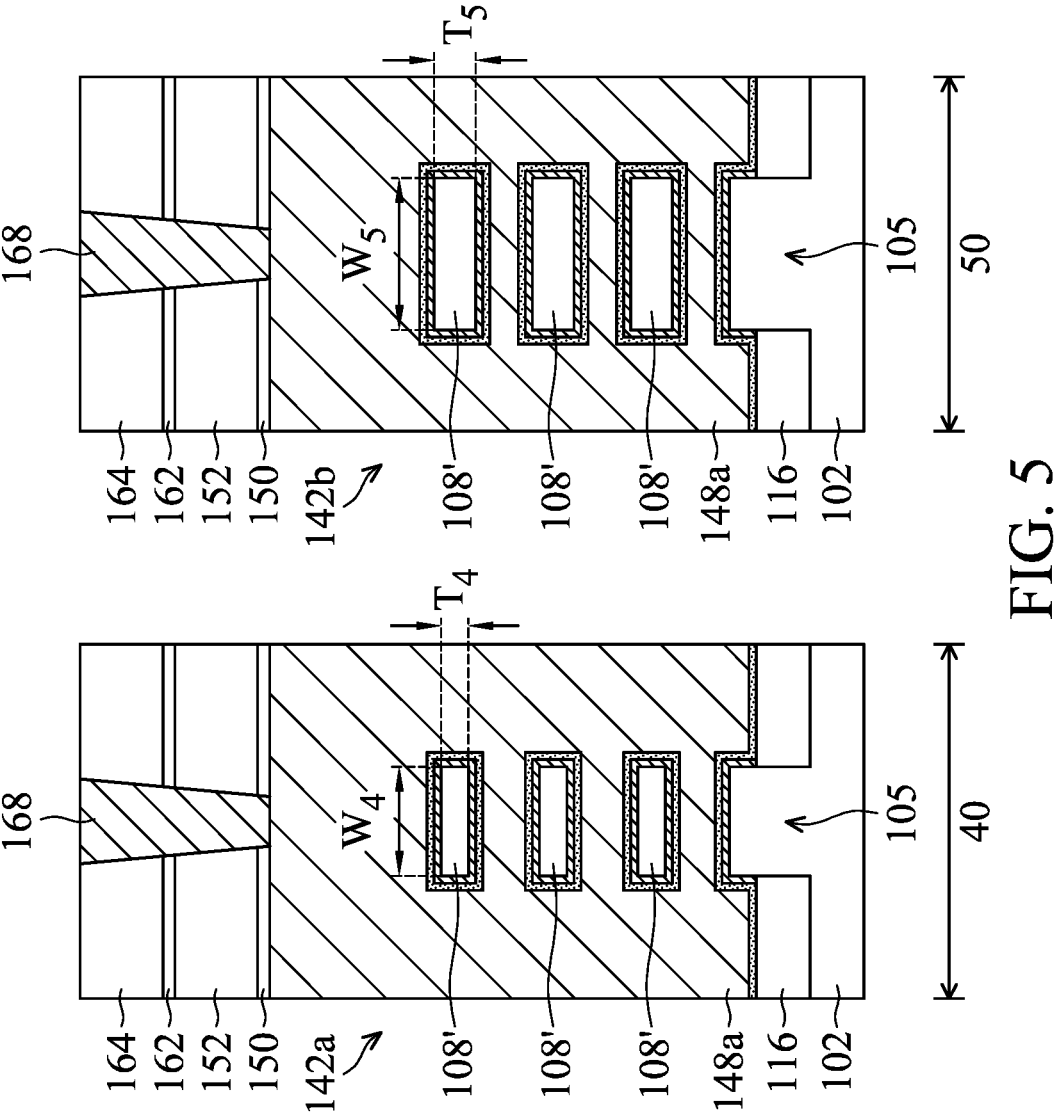

FIGS. 4 and 5 illustrate cross-sectional representations of various stages of manufacturing a semiconductor structure 100c, in accordance with some embodiments. The semiconductor structure 100c of FIG. 4 includes elements that are similar to, or the same as, elements of the semiconductor structure 100a of FIG. 1B. The difference between the FIG. 4 and FIG. 1B is that the thickness of each of the second semiconductor material layers 108 of the first fin structure 104a is different the thickness of each of the second semiconductor material layers 108 of the second fin structure 104b.

As shown in FIG. 4, the first semiconductor material layers 106 and second semiconductor material layers 108 are formed over the substrate 102. The substrate 102 includes a fourth region 40 and a fifth region 50. The first fin structure 104a is formed in the fourth region 40, and the second fin structure 104b is formed in the fifth region 50. Each of the second semiconductor material layers 108 of the first fin structure 104a has a fourth thickness $T_4$. Each of the second semiconductor material layers 108 of the second fin structure 104b has a fifth thickness $T_5$. In some embodiments, the fourth thickness $T_4$ is smaller than the fifth thickness $T_5$. The first fin structure 104a and the second fin structure 104b are formed in different steps to have different thicknesses.

Each of the second semiconductor material layers 108 of the first fin structure 104a has a fourth width $W_4$ along the second direction (e.g. Y-axis). Each of the second semiconductor material layers 108 of the second fin structure 104b has a fifth width $W_5$ along the second direction (e.g. Y-axis). In some embodiments, the fourth width $W_4$ is smaller than the fifth width $W_5$.

Afterwards, after the steps as described in FIGS. 3A-1 to 3N-1, 3B-1 to 3N-2 and 3A-3 to 3N-3, as shown in FIG. 5, the etch stop layer 150 is formed over the first gate structure 142a and the second gate structure 142b, and the dielectric layer 152 is formed over the etch stop layer 150, in accordance with some embodiments. Next, the etch stop layer 162 is formed over the S/D contact structure 156, and the dielectric layer 164 is formed over the etch stop layer 162. Afterwards, the gate conductive plug 168 is formed over the first gate structure 142a and the second gate structure 142b.

Figure 6A:
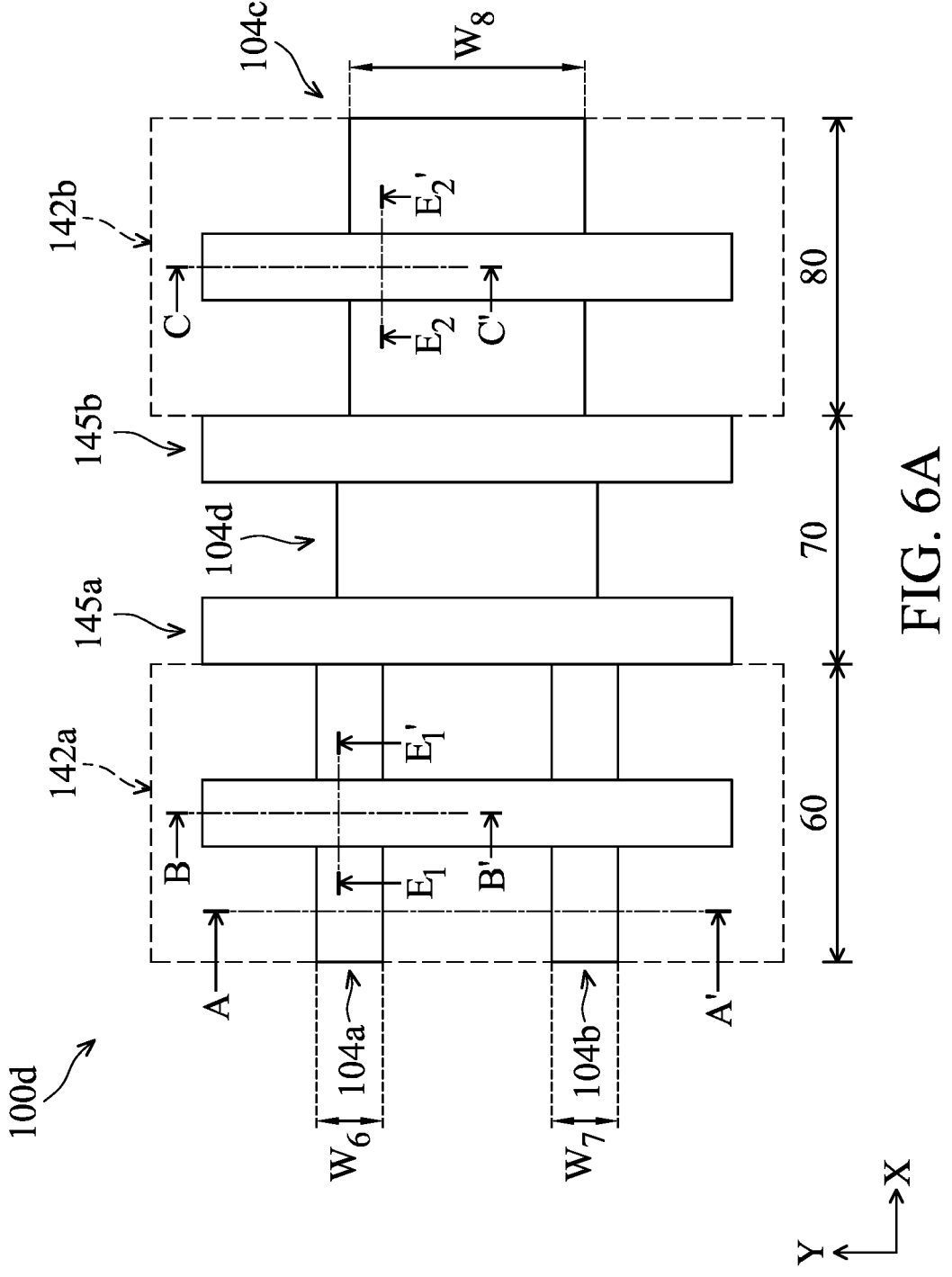
FIG. 6A shows a top-view representation of a semiconductor structure, in accordance with some embodiments.

FIG. 6A shows a top-view representation of a semiconductor structure 100d, in accordance with some embodiments.

As shown in FIG. 6A, the substrate 102 includes a sixth region 60, a seventh region 70 and an eighth region 80. The seven region 70 is between the sixth region 60 and the eighth region 80. The first fin structure 104a is formed in the sixth region 60 along the first direction (e.g. X-axis), and the second fin structure 104b is also formed in the sixth region 60 along the first direction (e.g. X-axis). The third fin structure 104c is formed in the eighth region 80 along the first direction (e.g. X-axis). The fourth fin structure 104d is formed in the seventh region 70 along the first direction (e.g. X-axis).

The first gate structure 142a and the second gate structure 142b are formed along the second direction (e.g. Y-axis). The first dielectric structure 142a and the second dielectric structure 145b are formed along the second direction (e.g. Y-axis). The first dielectric structure 145a and the second dielectric structure 145b are formed between the first gate structure 142a and the second gate structure 142b. Note that there is no gate structure in the seventh region 70, and there are two dielectric structures 145a/145b between the first gate structure 142a and the second gate structure 142b to reduce the leakage from the first gate structure 142a and the second gate structure 142b.

The first fin structure 104a has a sixth width $W_6$ along the second direction, the second fin structure 104b has a seventh width $W_7$ along the second direction, and the third fin structure 104c has an eighth $W_8$ along the second direction. In some embodiments, the sixth width $W_6$ is substantially equal to the seventh width $W_7$. In some embodiments, the sixth width $W_6$ is smaller the eighth $W_8$. In some embodiments, the seventh width $W_7$ is smaller the eighth $W_8$.

Figure 6B:
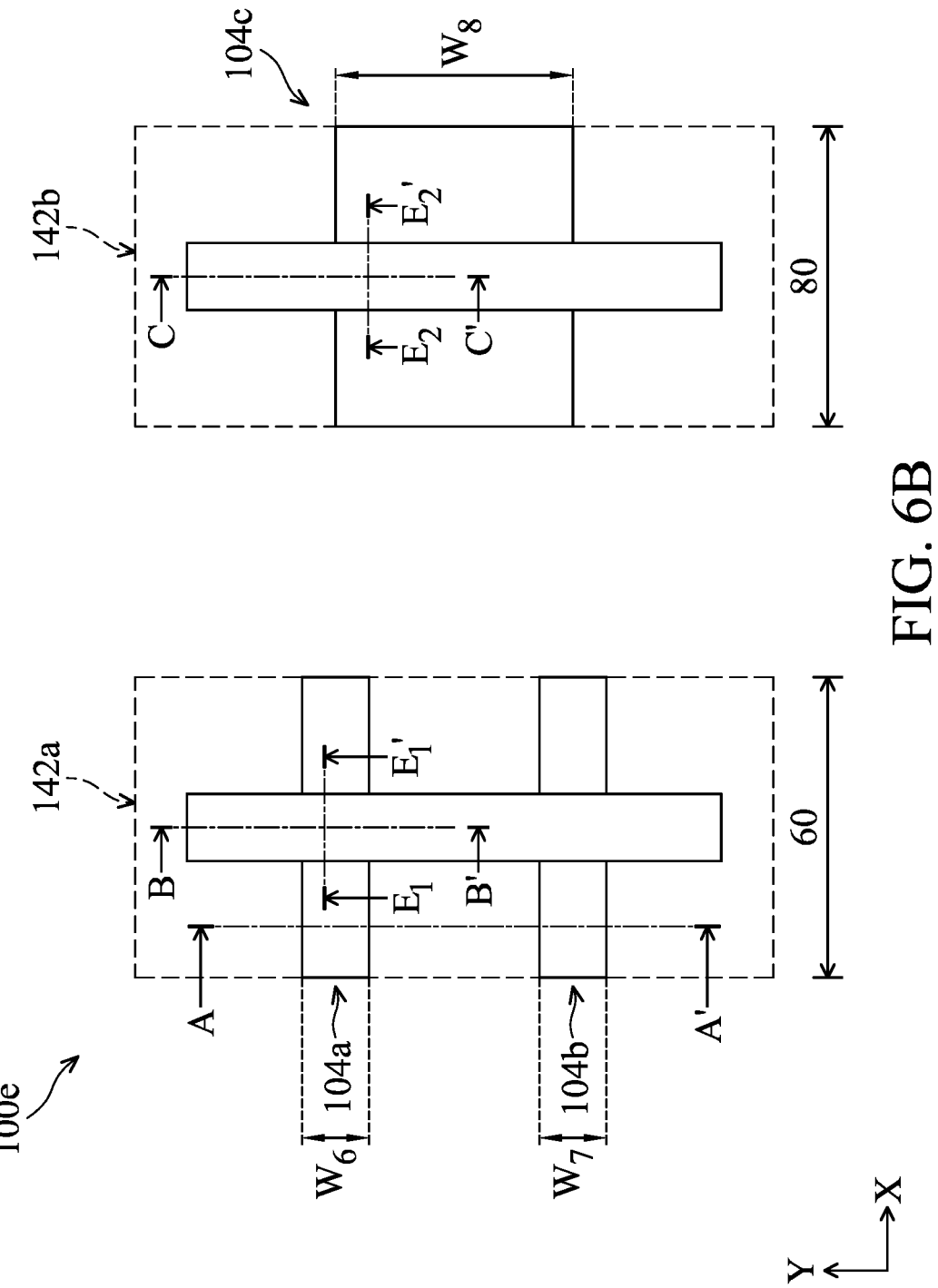
FIG. 6B shows a top-view representation of a semiconductor structure, in accordance with some embodiments.

FIG. 6B shows a top-view representation of a semiconductor structure 100e, in accordance with some embodiments. The semiconductor structure 100e of FIG. 6B includes elements that are similar to, or the same as, elements of the semiconductor structure 100d of FIG. 6A. The difference between the FIG. 6B and FIG. 6A is that the sixth region 60 and the eighth region 80 are separated from each other. Furthermore, no fin structure and no dielectric structure are between the first gate structure 142a and the second gate structure 142b.

Figure 7A:
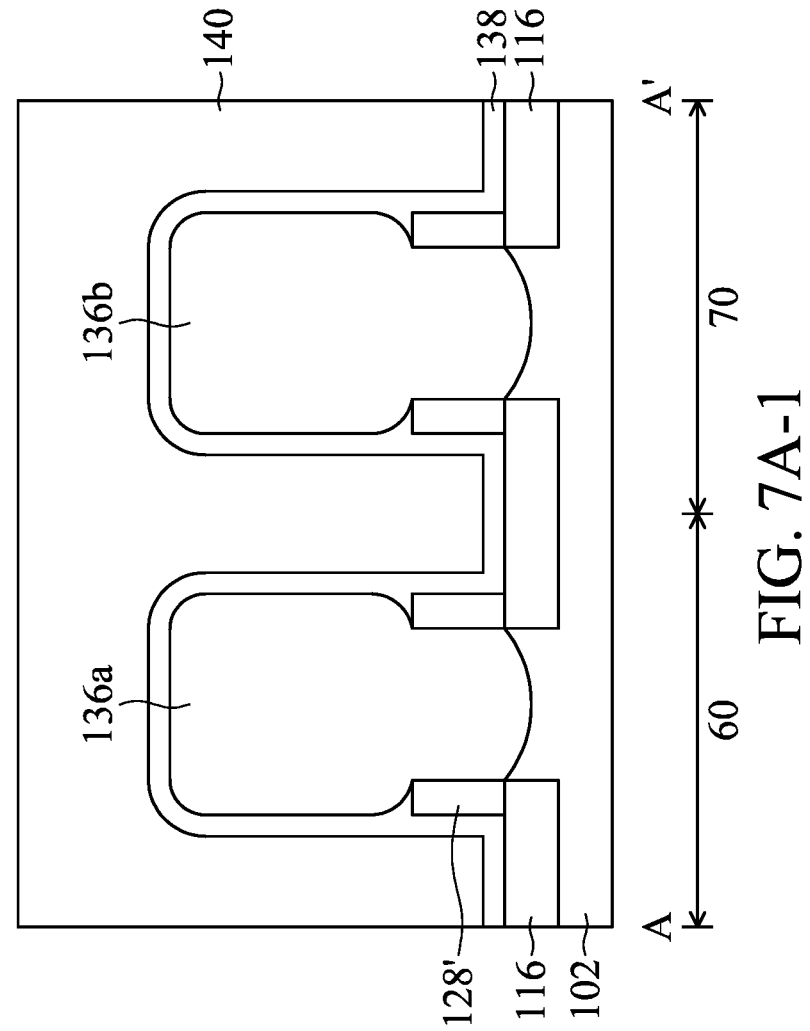
Figure 1:
Figures 2, 3, 7A:
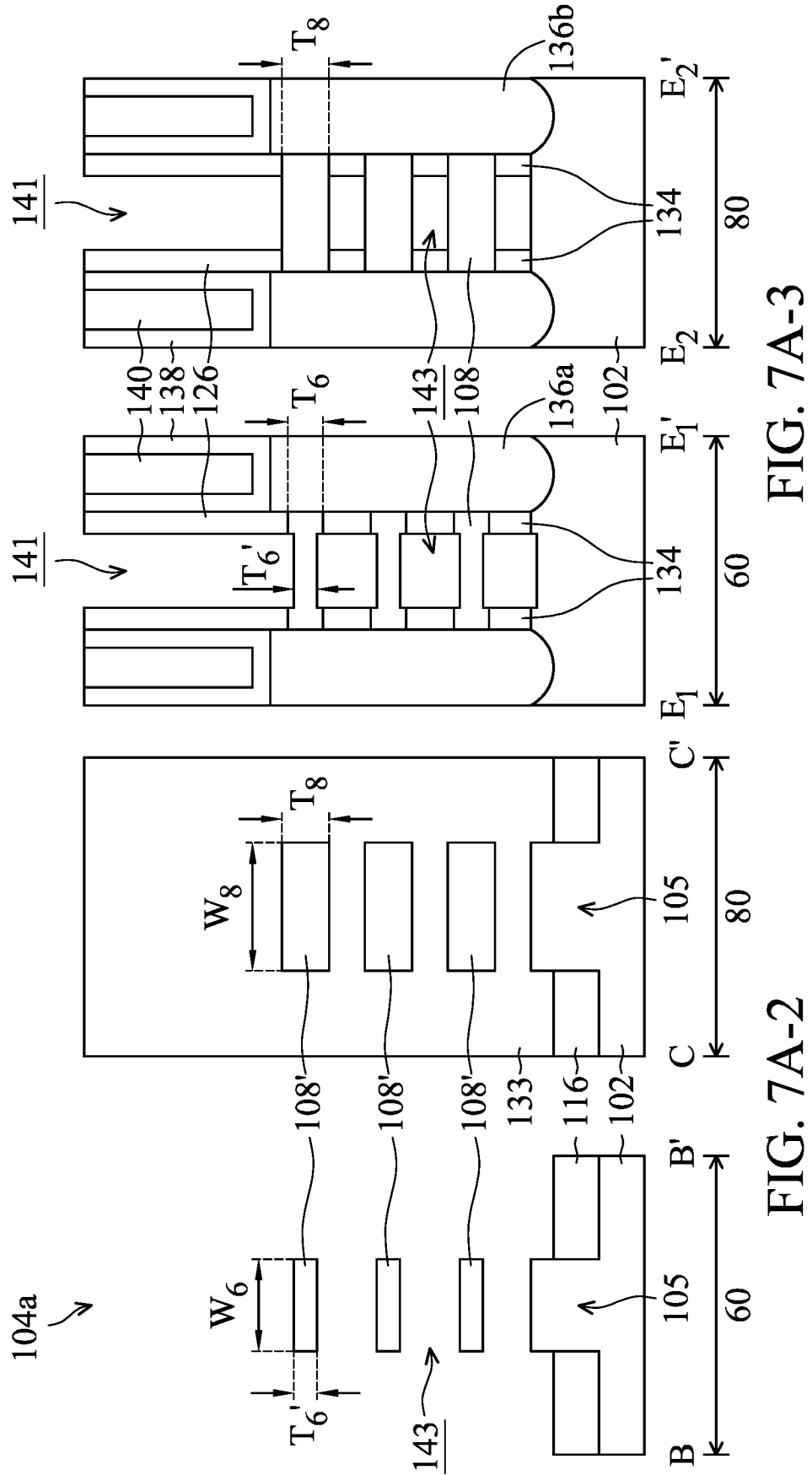
Figures 1, 7B:
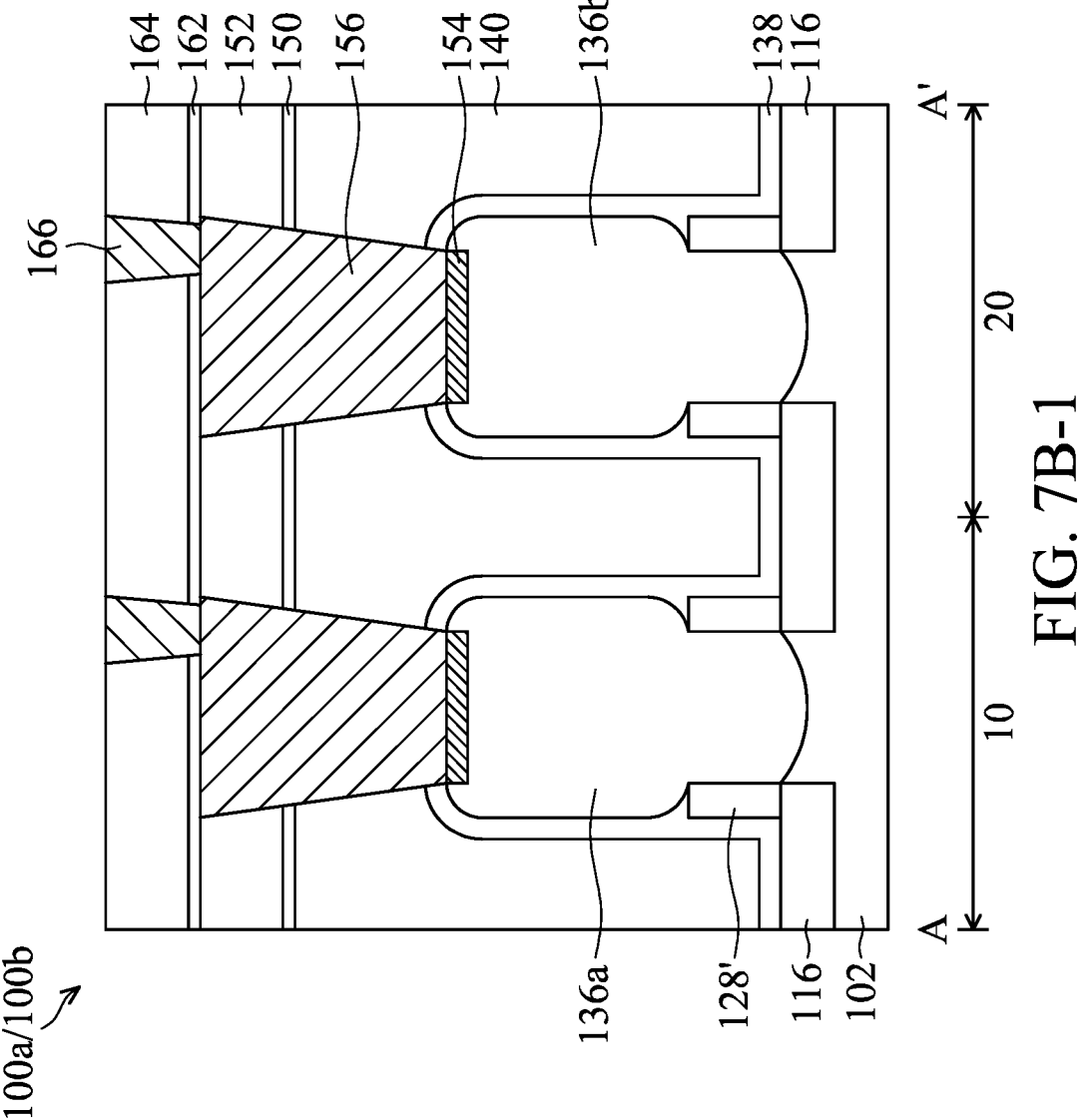
Figures 2, 3, 7B:
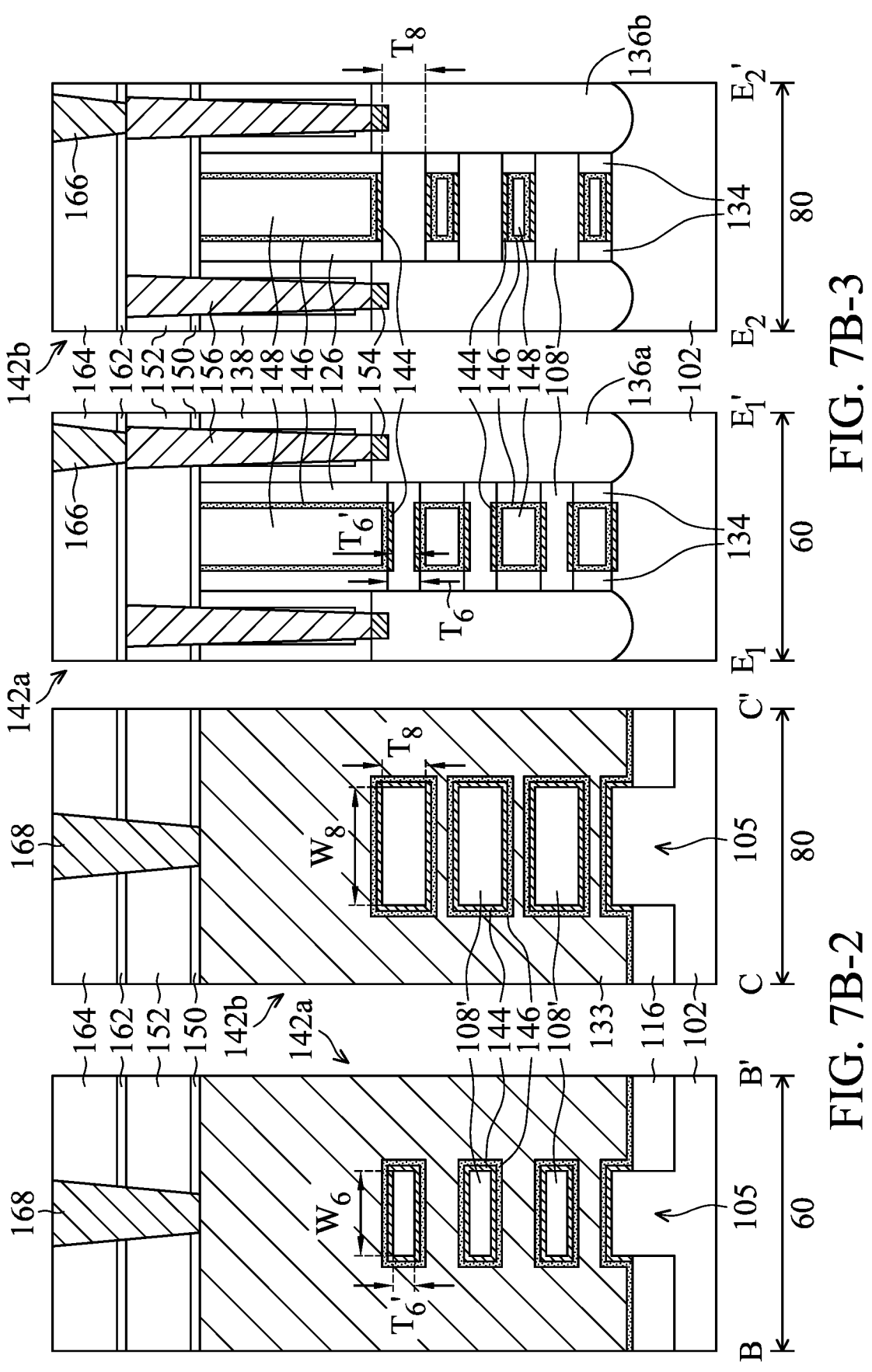

FIGS. 7A-1 to 7B-1 illustrate cross-sectional representations of various stages of manufacturing the semiconductor structure 100d or the semiconductor structure 100e shown along line A-A' in FIG. 6A and in FIG. 6B, in accordance with some embodiments. FIGS. 7A-2 to 7B-2 illustrate cross-sectional representations of various stages of manufacturing the semiconductor structure 100d or the semiconductor structure 100e shown along line B-B' and line C-C' in FIG. 6A and in FIG. 6B, in accordance with some embodiments. FIGS. 7A-3 to 7B-3 illustrate cross-sectional representations of various stages of manufacturing the semiconductor structure 100d or the semiconductor structure 100e shown along line $E_1$-$E_1$' and $E_2$-$E_2$' in FIG. 6A and in FIG. 6B, in accordance with some embodiments.

The semiconductor structure 100d or the semiconductor structure 100e in FIGS. 7A-1, 7A-2 and 7A-3 includes elements that are similar to, or the same as, elements of the semiconductor structure 100a of FIGS. 3M-1, 3M-2 and 3M-3.

As shown in FIG. 7A-2, the nanostructures 108' in the eighth region 80 are covered by the mask layer 133, a portion of each of the nanostructures 108' in the sixth region 60 is removed by an etching process. As a result, each of the nanostructures 108' in the sixth region 60 has a thinned sixth thickness $T_6'$, and each of the nanostructures 108' in the eighth region 80 has an eighth thickness $T_8$. In some embodiments, the sixth thickness T6 is smaller than the eighth thickness $T_8$.

Afterwards, as shown in FIGS. 7B-1, 7B-2 and 7B-3, the first gate structure 142a and the second gate structure 142b are formed to surround the nanostructures 108' and over the isolation structure 116, in accordance with some embodiments. Next, the etch stop layer 150 is formed over the first gate structure 142a and the second gate structure 142b, and the dielectric layer 152 is formed over the etch stop layer 150. Afterwards, the etch stop layer 162 is formed over the S/D contact structure 156, and the dielectric layer 164 is formed over the etch stop layer 162. Afterwards, the gate conductive plug 168 is formed over the first gate structure 142a and the second gate structure 142b.

Figures 8, 9:
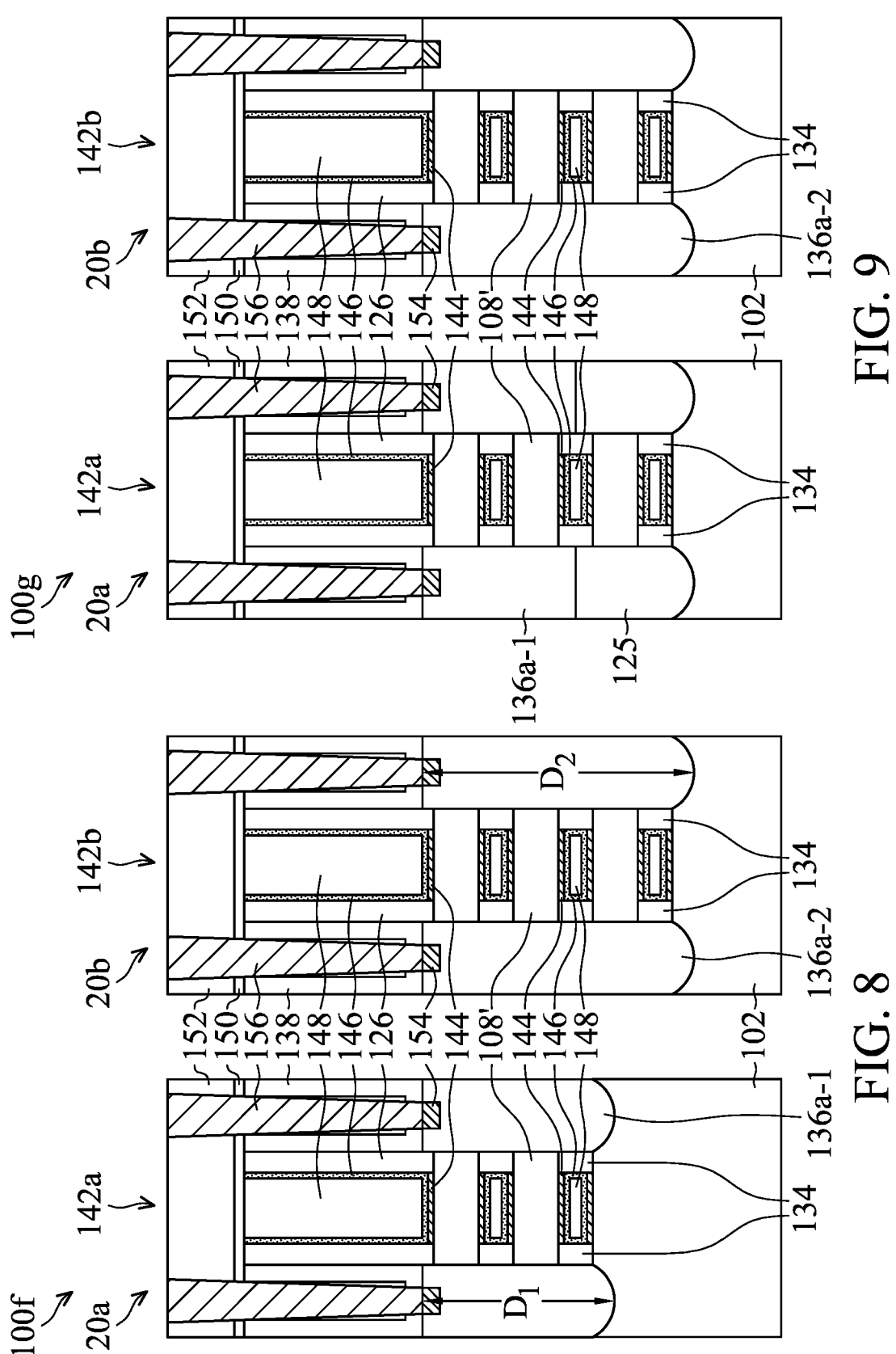
FIG. 8 illustrates a cross-sectional representation of a semiconductor structure, in accordance with some embodiments.
FIG. 9 illustrates a cross-sectional representation of a semiconductor structure, in accordance with some embodiments.

FIG. 8 illustrates a cross-sectional representation of a semiconductor structure 100f, in accordance with some embodiments. The semiconductor structure 100f in FIG. 8 includes elements that are similar to, or the same as, elements of the semiconductor structure 100a of FIGS. 3O-3. The semiconductor structure 100f includes a first device 20a and a second device 20b. The first device 20a may be formed in the first region 10 or the second region 20 of FIG. 2A or FIG. 2B, or in the sixth region 60 of FIG. 6A or FIG. 6B. The second device 20b may be formed in the second region 20 or the third region 30 of FIG. 2A or FIG. 2B, or in the eighth region 80 of FIG. 6A or FIG. 6B.

As shown in FIG. 8, the number of nanostructures 108' of the first device 20a is smaller than the number of nanostructures 108' of the second device 20b. In some embodiments, the number of nanostructures 108' of the first device 20a is two, and the number of nanostructures 108' of the second device 20b is three. The number of channel layers 108' of the first device 20a is smaller than the number of channel layers 108' of the second device 20b.

Furthermore, the first S/D structure 136a-1 in the first device 20a has a first depth $D_1$, and the first S/D structure 136a-2 in the second device 20b has a second depth $D_2$. In some embodiments, the first depth D1 is smaller than the second depth $D_2$.

More nanostructures (e.g. three nanostructures 108' in the second device 20b) can provide large effective width $(W_{eff})$ of the channel layer. The large effective width $(W_{eff})$ of channel layer can provide high speed of the second device 20b. However, the larger effective width of the channel layer consumes more power. For high speed performance consideration, larger effective width $(W_{eff})$ is formed by having more nanostructures. For power efficiency, a smaller effective width $(W_{eff})$ is formed by having fewer nanostructures.

In order to fulfill different needs in a region, the first gate structure 142a in the first device 20a is formed for power efficiency, and the second gate structure 142b in the second device 20b is formed for high speed performance. The first gate structure 142a and second gate structure 142b co-exist to achieve multi-nanostructures for speed performance and power efficiency.

FIG. 9 illustrates a cross-sectional representation of a semiconductor structure 100g, in accordance with some embodiments. The semiconductor structure 100g in FIG. 9 includes elements that are similar to, or the same as, elements of the semiconductor structure 100a of FIGS. 3O-3. The semiconductor structure 100g includes the first device 20a and the second device 20b. The first device 20a may be formed in the first region 10 or the second region 20 of FIG. 2A or FIG. 2B, or in the sixth region 60 of FIG. 6A or FIG.

6B. The second device 20b may be formed in the second region 20 or the third region 30 of FIG. 2A or FIG. 2B, or in the eighth region 80 of FIG. 6A or FIG. 6B.

As shown in FIG. 9, a lightly doped structure 125 is directly below the first S/D structure 136a-1 in the first device 20a. Since the top surface of the lightly doped structure 125 is higher than the top surface of the bottommost nanostructure 108' in the first device 20a, the bottommost nanostructures 108' become inactive. Therefore, the effective number of first device 20a becomes two. The effective number of nanostructures 108' in the first device 20a is smaller than the effective number of nanostructures 108' in the second device 20b.

More specifically, the top surface of the lightly doped structure 125 is higher than the top surface of the bottommost inner spacer layer 134. The doped concentration of the lightly doped structure 125 is lower than the doped concentration of the first S/D structure 136a-1. The effective number of the nanostructures 108' directly below the first gate structure 142a in the first device 20a is smaller than the effective number of nanostructures 108' directly below the second gate structure 142b in the second device 20a.

Figures 10, 11:
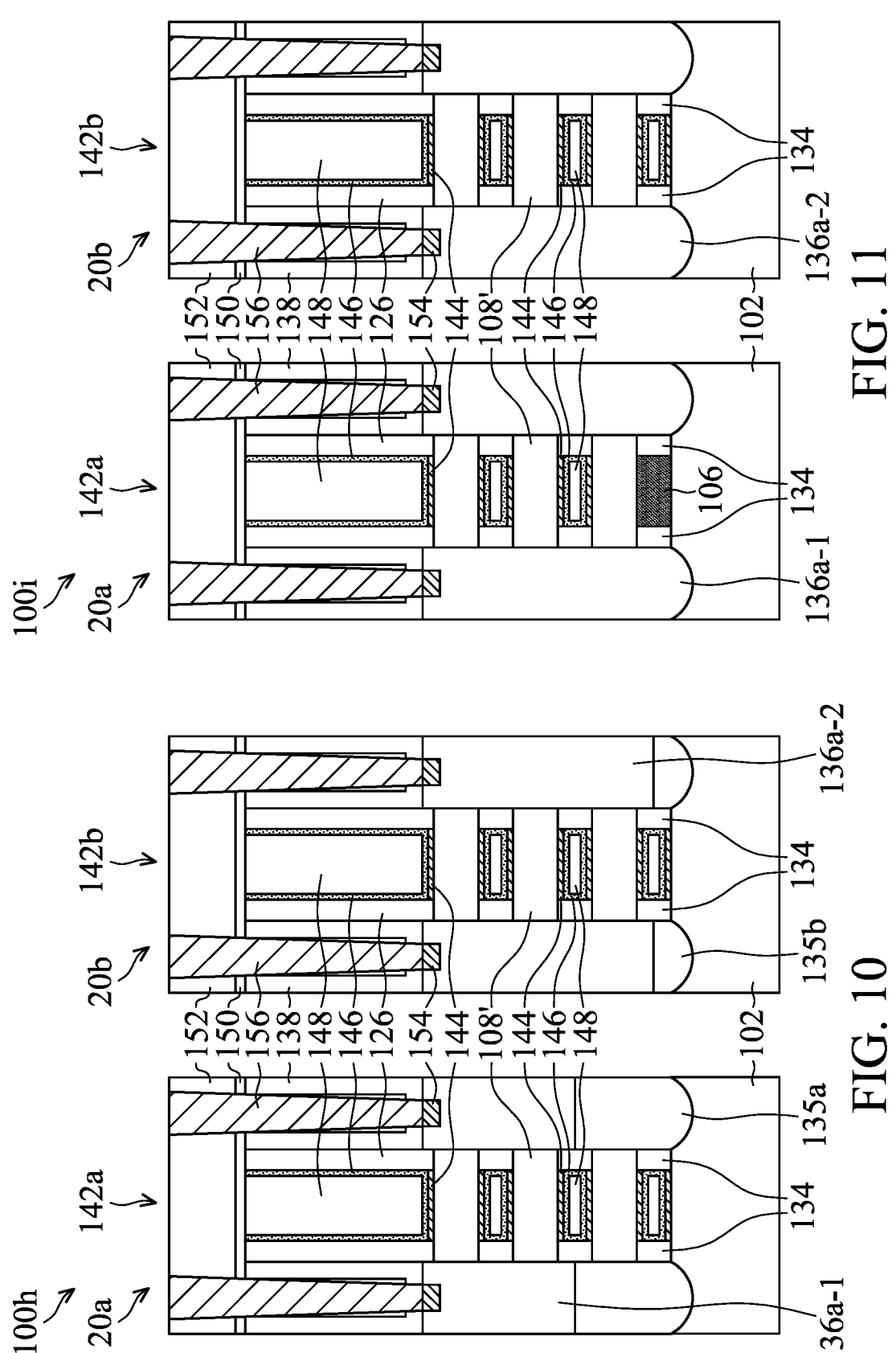
FIG. 10 illustrates a cross-sectional representation of a semiconductor structure, in accordance with some embodiments.
FIG. 11 illustrates a cross-sectional representation of a semiconductor structure, in accordance with some embodiments.

FIG. 10 illustrates a cross-sectional representation of a semiconductor structure 100h, in accordance with some embodiments. The semiconductor structure 100h in FIG. 10 includes elements that are similar to, or the same as, elements of the semiconductor structure 100a of FIGS. 3O-3. The semiconductor structure 100h includes the first device 20a and the second device 20b. The first device 20a may be formed in the first region 10 or the second region 20 of FIG. 2A or FIG. 2B, or in the sixth region 60 of FIG. 6A or FIG. 6B. The second device 20b may be formed in the second region 20 or the third region 30 of FIG. 2A or FIG. 2B, or in the eighth region 80 of FIG. 6A or FIG. 6B.

As shown in FIG. 10, a first bottom isolation layer 135a is formed below the first source/drain (S/D) structure 136a-1 and a second bottom isolation layer 135b is formed below the first S/D structure 136a-2. The first bottom isolation layer 135a and the second bottom isolation layer 135b are used to reduce the leakage of the semiconductor structure 100h. The top surface of the first bottom isolation layer 135a is higher than the top surface of the second bottom isolation layer 135b. The top surface of the first bottom isolation layer 135a is higher than the top surface of the bottommost nanostructure 108' in the first device 20a. The top surface of the second bottom isolation layer 135b is lower than the top surface of the bottommost nanostructure 108' in the second device 20b. Therefore, the effective number of nanostructures 108' in the first device 20a becomes two. The effective number of nanostructures 108' in the second device 20 is still three. The effective number of nanostructures 108' in the first device 20a is smaller than the effective number of nanostructures 108' in the second device 20b.

In some embodiments, the bottom isolation layer 135a or the second bottom isolation layer 135b includes un-doped Si, un-doped SiGe or a combination thereof. In some embodiments, the first bottom isolation layer 135a or the second bottom isolation layer 135b is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

FIG. 11 illustrates a cross-sectional representation of a semiconductor structure 100i, in accordance with some embodiments. The semiconductor structure 100i in FIG. 11 includes elements that are similar to, or the same as, elements of the semiconductor structure 100*a* of FIGS. 3O-3. The semiconductor structure 100*i* includes the first device 20*a* and the second device 20*b*. The first device 20*a* may be formed in the first region 10 or the second region 20 of FIG. 2A or FIG. 2B, or in the sixth region 60 of FIG. 6A or FIG. 6B. The second device 20*b* may be formed in the second region 20 or the third region 30 of FIG. 2A or FIG. 2B, or in the eighth region 80 of FIG. 6A or FIG. 6B.

As shown in FIG. 11, the bottommost first semiconductor material layer 106 of the first device 20*a* is not removed, and therefore the effective number of nanostructures 108' in the first device 20*a* is smaller than the effective number of nanostructures 108' in the second device 20*b*. It should be noted that the remaining bottommost first semiconductor material layer 106 of the first device 20*a* and the nanostructures 108' are made of different materials. In some embodiments, the nanostructures 108' is made of Si, and the remaining bottommost first semiconductor material layer 106 is made of the SiGe.

Figure 12:
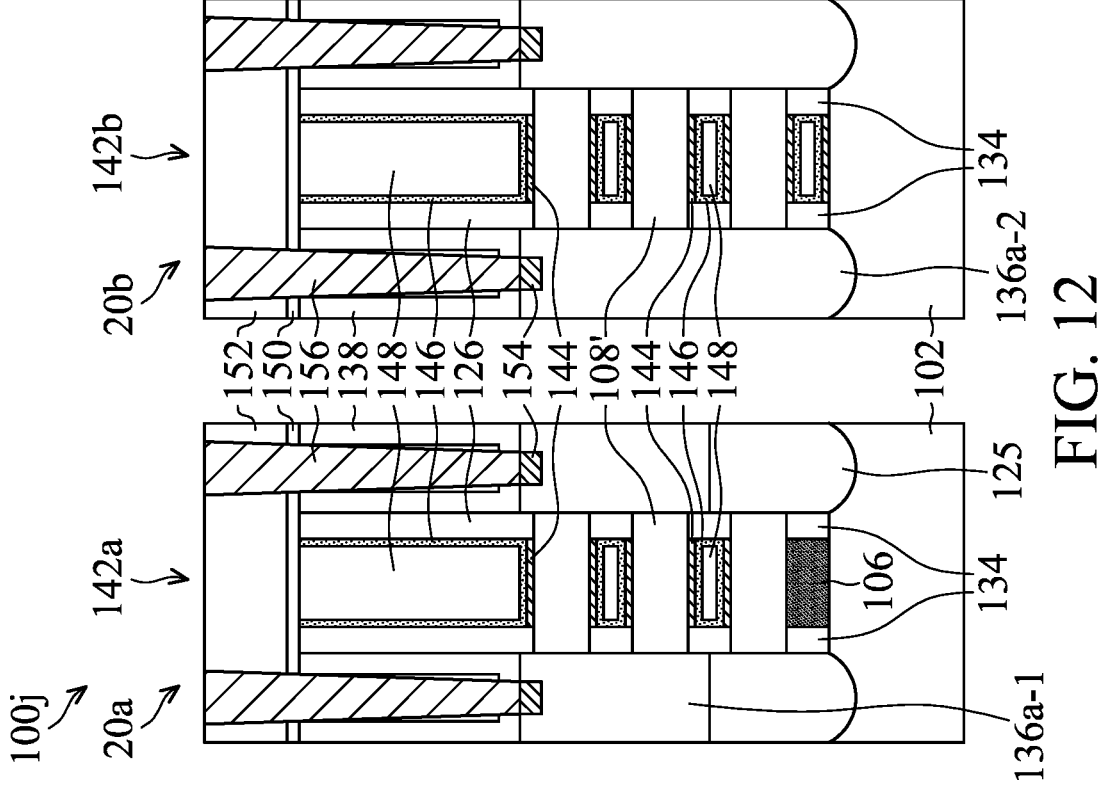
FIG. 12 illustrates a cross-sectional representation of a semiconductor structure, in accordance with some embodiments.

FIG. 12 illustrates a cross-sectional representation of a semiconductor structure 100*j*, in accordance with some embodiments. The semiconductor structure 100*j* in FIG. 12 includes elements that are similar to, or the same as, elements of the semiconductor structure 100*a* of FIGS. 3O-3. The semiconductor structure 100*j* includes the first device 20*a* and the second device 20*b*. The first device 20*a* may be formed in the first region 10 or the second region 20 of FIG. 2A or FIG. 2B, or in the sixth region 60 of FIG. 6A or FIG. 6B. The second device 20*b* may be formed in the second region 20 or the third region 30 of FIG. 2A or FIG. 2B, or in the eighth region 80 of FIG. 6A or FIG. 6B.

As shown in FIG. 12, the bottommost first semiconductor material layer 106 of the first device 20*a* is not removed, and the lightly doped structure 125 is directly below the first S/D structure 136*a*-1 in the first device 20*a*. Therefore, the effective number of nanostructures 108' in the first device 20*a* is smaller than the effective number of nanostructures 108' in the second device 20*b*.

Figure 13A:
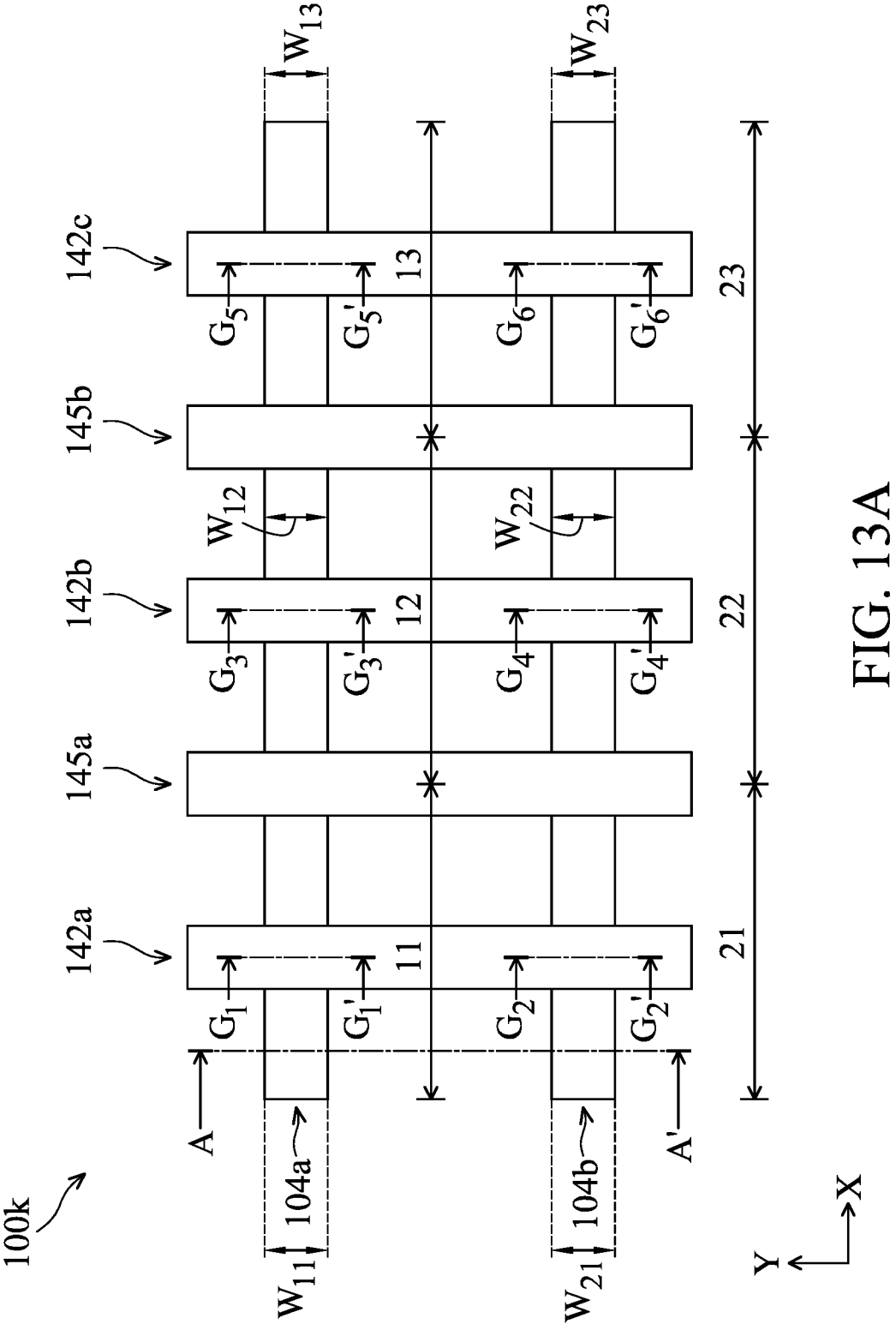
FIG. 13A shows a top-view representation of a semiconductor structure, in accordance with some embodiments.
Figures 13B, 13C:
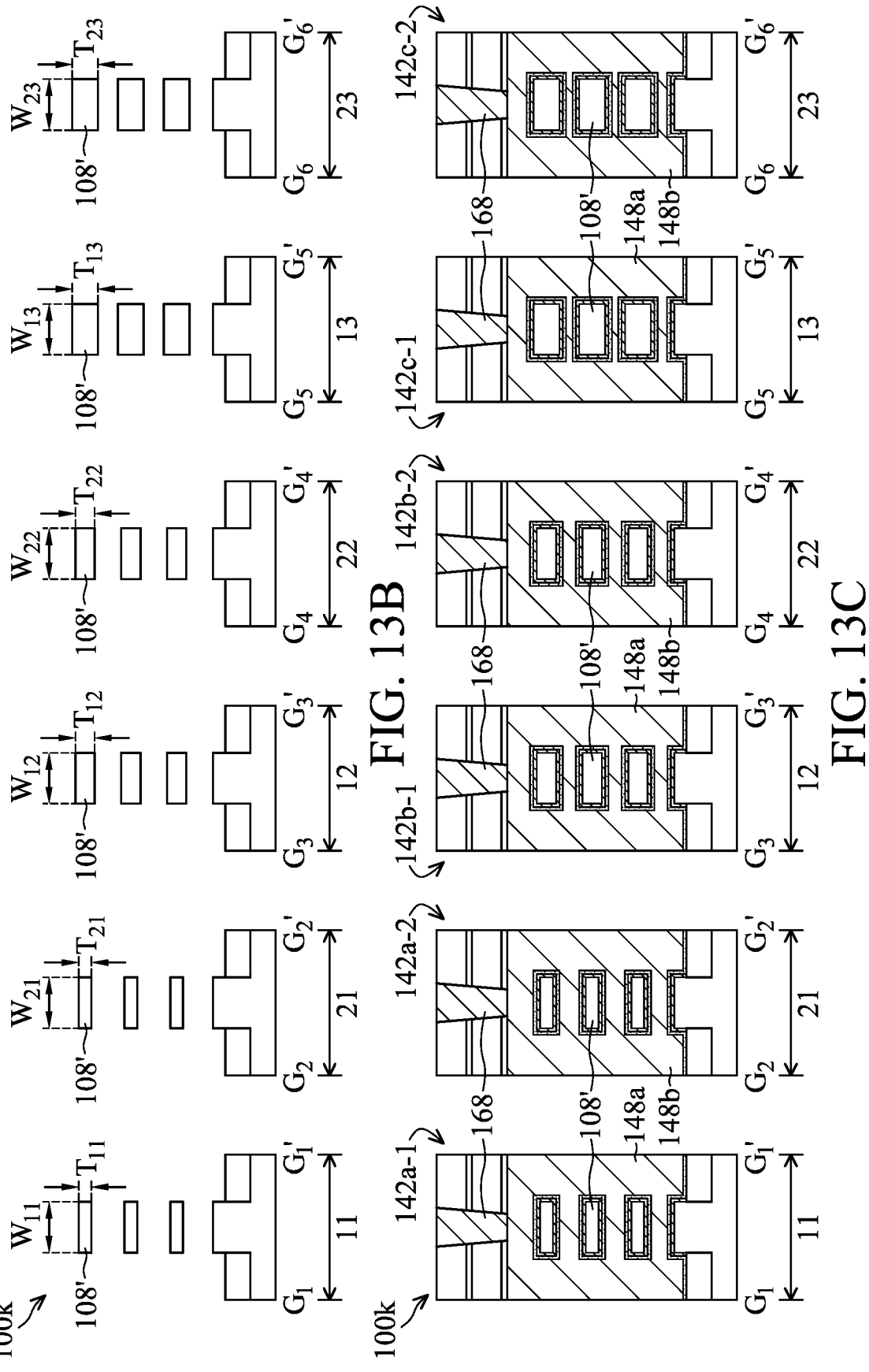
FIGS. 13B to 13C illustrates a cross-sectional representation of various stages of manufacturing of a semiconductor shown along line $G_1$-$G_1$', $G_2$-$G_2$', $G_3$-$G_3$', $G_4$-$G_4$', $G_5$-$G_5$, and $G_6$-$G_6$' in FIG. 13A, in accordance with some embodiments.

FIG. 13A shows a top-view representation of a semiconductor structure 100*k*, in accordance with some embodiments. FIGS. 13B to 13C illustrates a cross-sectional representation of various stages of manufacturing of a semiconductor 100*k* shown along line $G_1$-$G_1'$, $G_2$-$G_2'$, $G_3$-$G_3'$, $G_4$-$G_4'$, $G_5$-$G_5'$ and $G_6$-$G_6'$ in FIG. 13A, in accordance with some embodiments.

As shown in FIGS. 13A and 13B, the substrate 102 includes a first region 11, a second region 12, a third region 13, a fourth region 21, a fifth region 22 and a sixth region 23. The first fin structure 104*a* is formed along the first direction (e.g. X-axis), and the second fin structure 104*b* is also formed along the first direction (e.g. X-axis). The first fin structure 104*a* has a width $W_{11}$ in the first region 11 along the second direction, a width $W_{12}$ in the second region 12 along the second direction and a width $W_{13}$ in the third region 13 along the third direction. The second fin structure 104*b* has a width $W_{21}$ in the fourth region 21 along the second direction, a width $W_{22}$ in the fifth region 22 and a width $W_{23}$ in the sixth region 23. In some embodiments, the width $W_{11}$ is substantially equal to the width $W_{12}$, and the width $W_{12}$ is substantially equal to the width $W_{13}$. In some embodiments, the width $W_{21}$ is substantially equal to the width $W_{22}$, and the width $W_{22}$ is substantially equal to the width $W_{23}$.

In the first region 11, each of the nanostructures 108' has a thickness $T_{11}$. In the fourth region 21, each of the nanostructures 108' has a thickness $T_{21}$. The thickness $T_{11}$ is substantially equal to the thickness $T_{21}$.

In the second region 12, each of the nanostructures 108' has a thickness $T_{12}$. In the fourth region 21, each of the nanostructures 108' has a thickness $T_{22}$. The thickness $T_{11}$ is substantially equal to the thickness $T_{21}$.

In the third region 13, each of the nanostructures 108' has a thickness $T_{13}$. In the sixth region 23, each of the nanostructures 108' has a thickness $T_{23}$. The thickness $T_{13}$ is substantially equal to the thickness $T_{23}$. In some embodiments, the thickness $T_{21}$ is smaller than the thickness $T_{22}$, and the thickness $T_{22}$ is smaller than the thickness $T_{23}$. In some embodiments, the difference between the thickness $T_{22}$ and the thickness $T_{21}$ is in a range from about 0.5 nm to about 5 nm. In some embodiments, the difference between the thickness $T_{23}$ and the thickness $T_{22}$ is in a range from about 0.5 nm to about 5 nm.

Next, as shown in FIG. 13C, the first gate structure 142*a*-1 is formed in the first region 11 and the first gate structure 142*a*-2 is formed in the fourth region 21. In some embodiments, the first gate structure 142*a*-1 is a P-type structure, and the first gate structure 142*a*-2 is a N-type structure. In some other embodiments, the first gate structure 142*a*-1 is a N-type structure, and the first gate structure 142*a*-2 is a P-type structure.

In addition, the second gate structure 142*b*-1 is formed in the second region 12, and the second gate structure 142*b*-2 is formed in the fifth region 22. In some embodiments, the second gate structure 142*b*-1 is a P-type structure, and the second gate structure 142*b*-2 is a N-type structure. In some other embodiments, the second gate structure 142*b*-1 is a N-type structure, and the second gate structure 142*b*-2 is a P-type structure.

Furthermore, the third gate structure 142*c*-1 is formed in the third region 13, and the third gate structure 142*c*-2 is formed in the sixth region 23. In some embodiments, the third gate structure 142*c*-1 is a P-type structure, and the third gate structure 142*c*-2 is a N-type structure. In some other embodiments, the third gate structure 142*c*-1 is a N-type structure, and the third gate structure 142*c*-2 is a P-type structure.

Next, the etch stop layer 150 is formed over the first gate structure 142*a* and the second gate structure 142*b*, and the dielectric layer 152 is formed over the etch stop layer 150. Afterwards, the etch stop layer 162 is formed over the S/D contact structure 156, and the dielectric layer 164 is formed over the etch stop layer 162. Afterwards, the gate conductive plug 168 is formed over the first gate structure 142*a*, the second gate structure 142*b* and the third gate structure 142*c*.

Figure 14A:
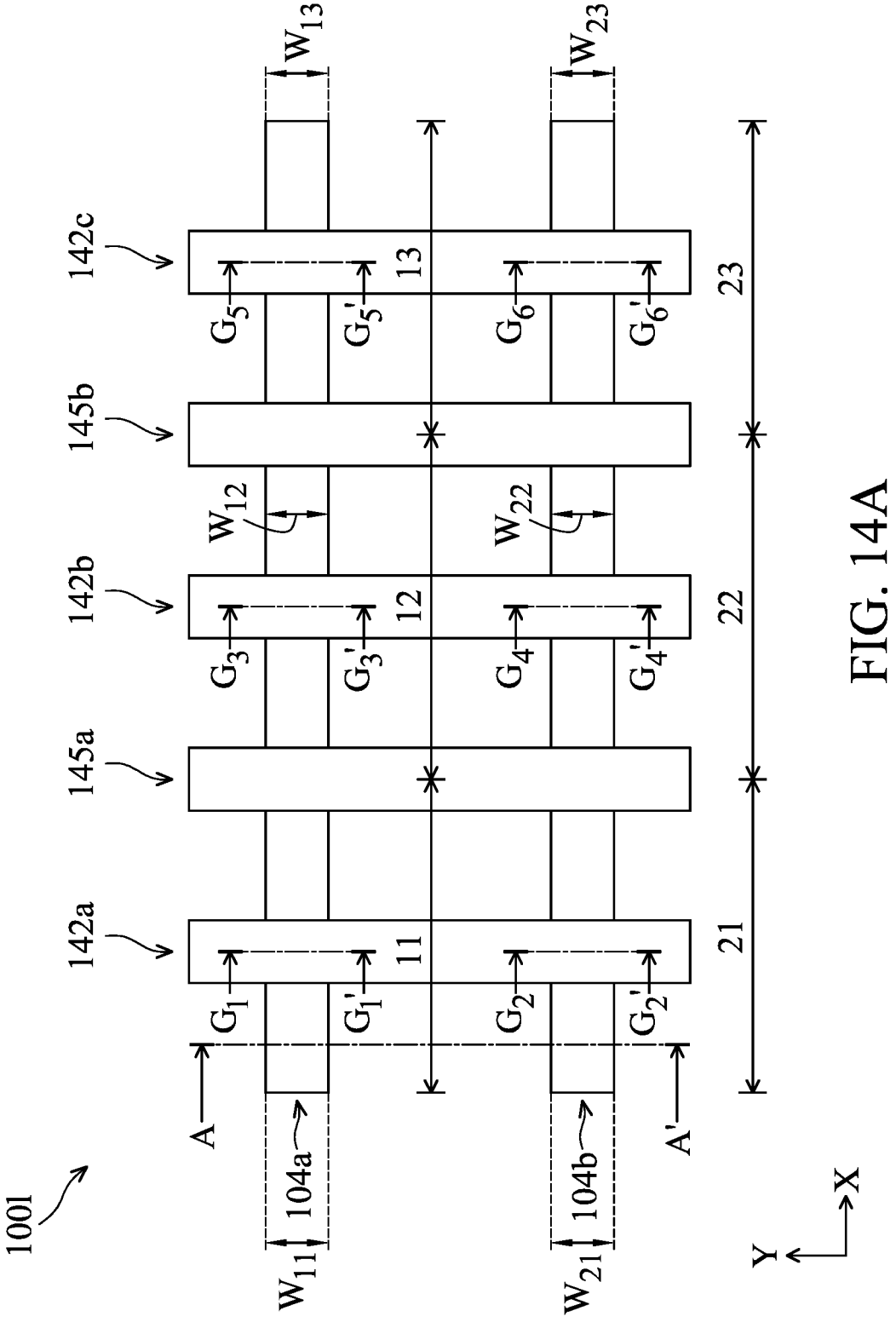
FIG. 14A shows a top-view representation of a semiconductor structure, in accordance with some embodiments.
Figures 14B, 14C:
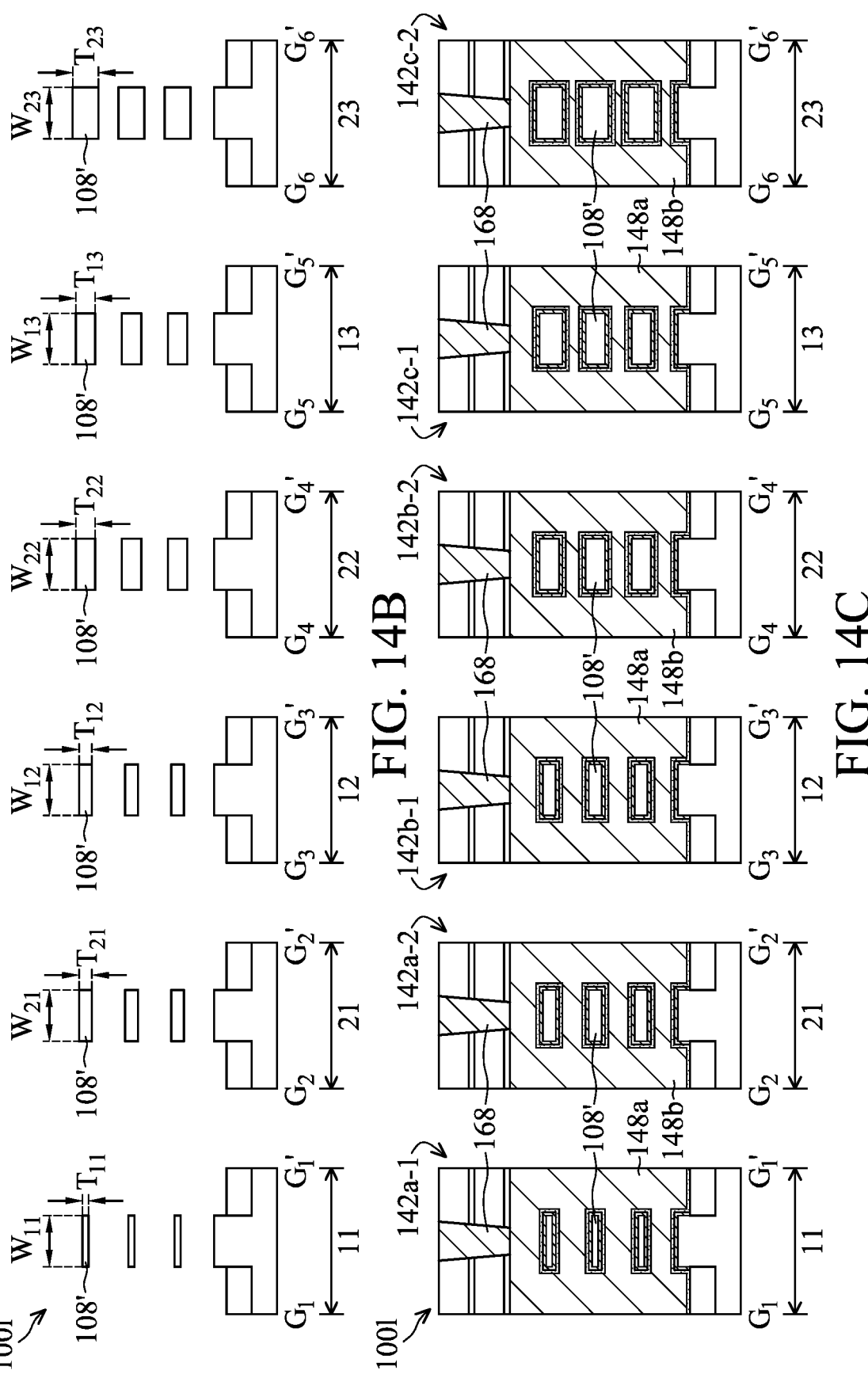
FIGS. 14B to 14C illustrates a cross-sectional representation of various stages of manufacturing of a semiconductor shown along line $G_1$-$G_1$', $G_2$-$G_2$', $G_3$-$G_3$', $G_4$-$G_4$', $G_5$-$G_5$, and $G_6$-$G_6$' in FIG. 14A, in accordance with some embodiments.

FIG. 14A shows a top-view representation of a semiconductor structure 1001, in accordance with some embodiments. FIGS. 14B to 14C illustrates a cross-sectional representation of various stages of manufacturing of the semiconductor 1001 shown along line $G_1$-$G_1'$, $G_2$-$G_2'$, $G_3$-$G_3'$, $G_4$-$G_4'$, $_5$-$G_5'$ and $G_6$-$G_6'$ in FIG. 14A, in accordance with some embodiments.

The semiconductor structure 1001 in FIGS. 14A to 14C includes elements that are similar to, or the same as, elements of the semiconductor structure 100*k* of FIGS. 13A to 13C. The difference between FIGS. 14A to 14C and FIGS. 13A to 13C is that thickness $T_{21}$ is greater than the thickness $T_{11}$, the thickness $T_{22}$ is greater than the thickness $T_{12}$, and the thickness $T_{23}$ is greater than the thickness $T_{13}$.

Figure 15A:
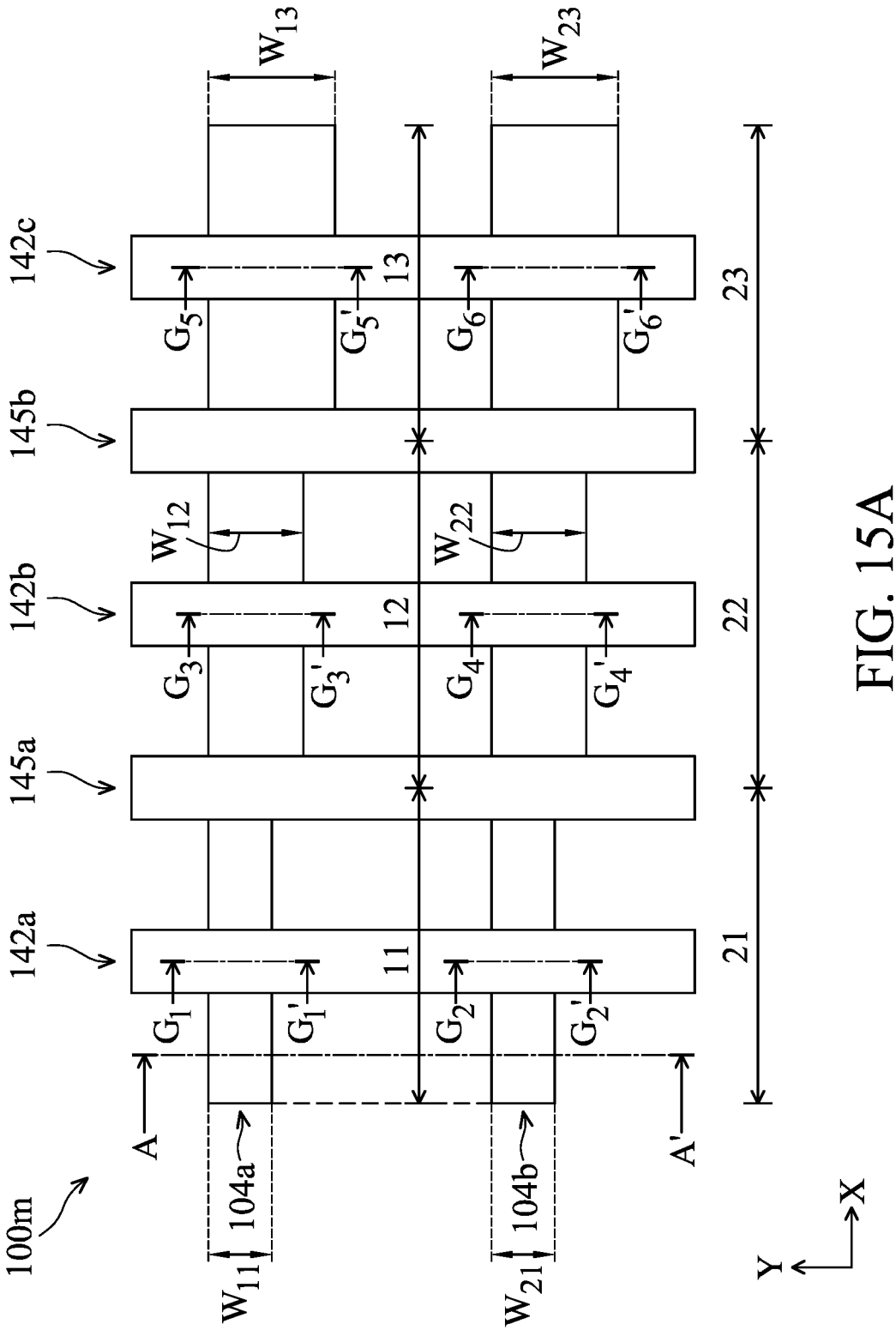
FIG. 15A shows a top-view representation of a semiconductor structure, in accordance with some embodiments.
Figures 15B, 15C:
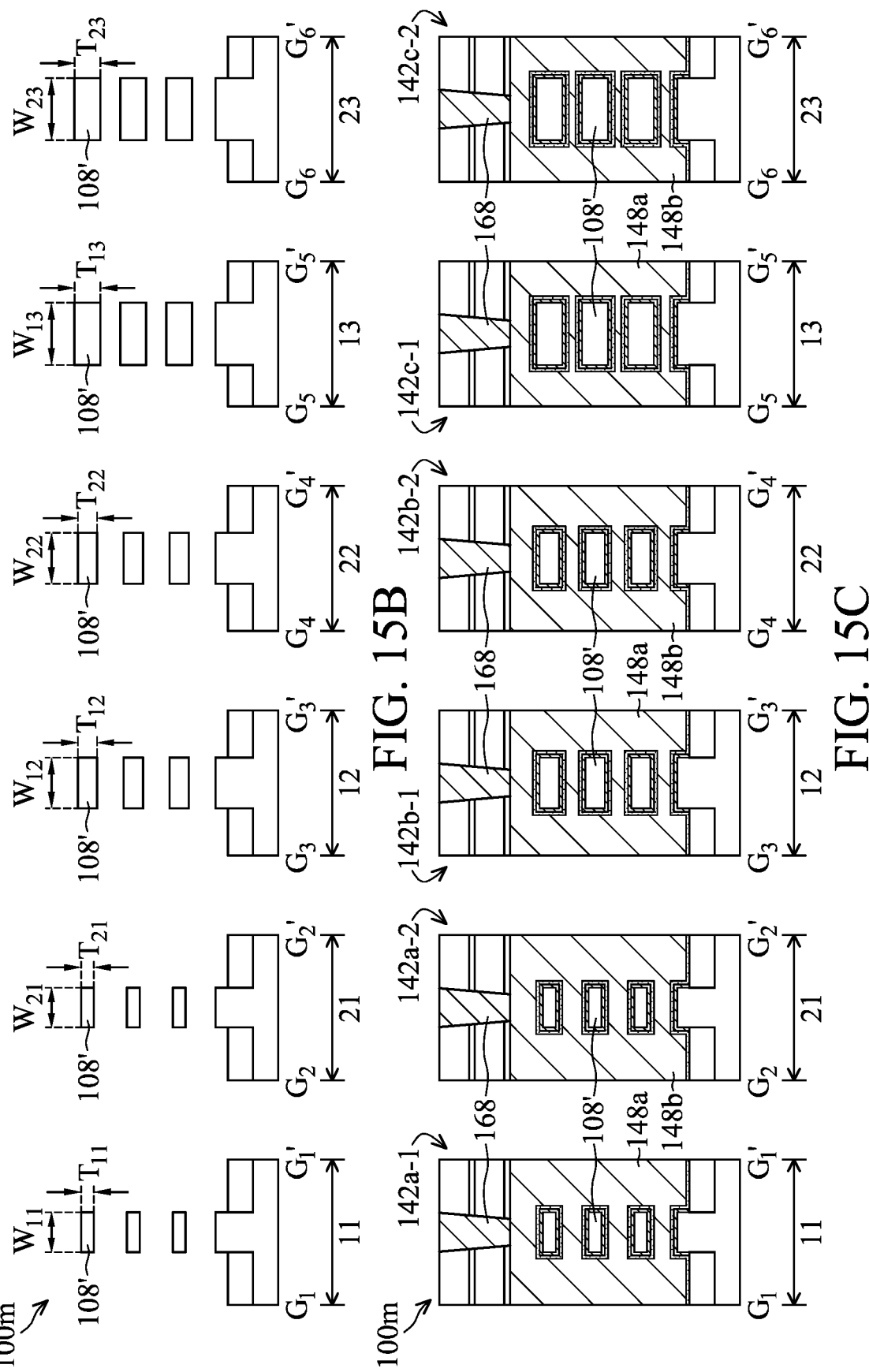
FIGS. 15B to 15C illustrates a cross-sectional representation of various stages of manufacturing of a semiconductor shown along line $G_1$-$G_1$', $G_2$-$G_2$', $G_3$-$G_3$', $G_4$-$G_4$', $G_5$-$G_5$, and $G_6$-$G_6$' in FIG. 15A, in accordance with some embodiments.

FIG. 15A shows a top-view representation of a semiconductor structure 100*m*, in accordance with some embodiments. FIGS. 15B to 15C illustrates a cross-sectional representation of various stages of manufacturing of the semiconductor 100*m* shown along line $G_1$-$G_1'$, $G_2$-$G_2'$, $G_3$-$G_3$', $G_4$-$G_4$', $G_5$-$G_5$, and $G_6$-$G_6$' in FIG. 15A, in accordance with some embodiments.

The semiconductor structure 100*m* in FIGS. 15A to 15C includes elements that are similar to, or the same as, elements of the semiconductor structure 100*m* of FIGS. 15A to 15C. The difference between FIGS. 15A to 15C and FIGS. 13A to 13C is that the width $W_{12}$ is greater than the width $W_{11}$, and the width $W_{13}$ is greater than the width $W_{12}$. In addition, the width $W_{22}$ is greater than the width $W_{21}$, and the width $W_{23}$ is greater than the width $W_{22}$. In some embodiments, the width Wni is substantially equal to the width $W_{21}$. In some embodiments, the width $W_{12}$ is substantially equal to the width $W_{22}$. In some embodiments, the width $W_{13}$ is substantially equal to the width $W_{23}$. In some embodiments, a ratio of the width $W_{12}$ to the width Wni is in a range from about 1.1 to about 3. In some embodiments, a ratio of the width $W_{13}$ to the width $W_{12}$ is in a range from about 1.1 to about 3.

Figure 16A:
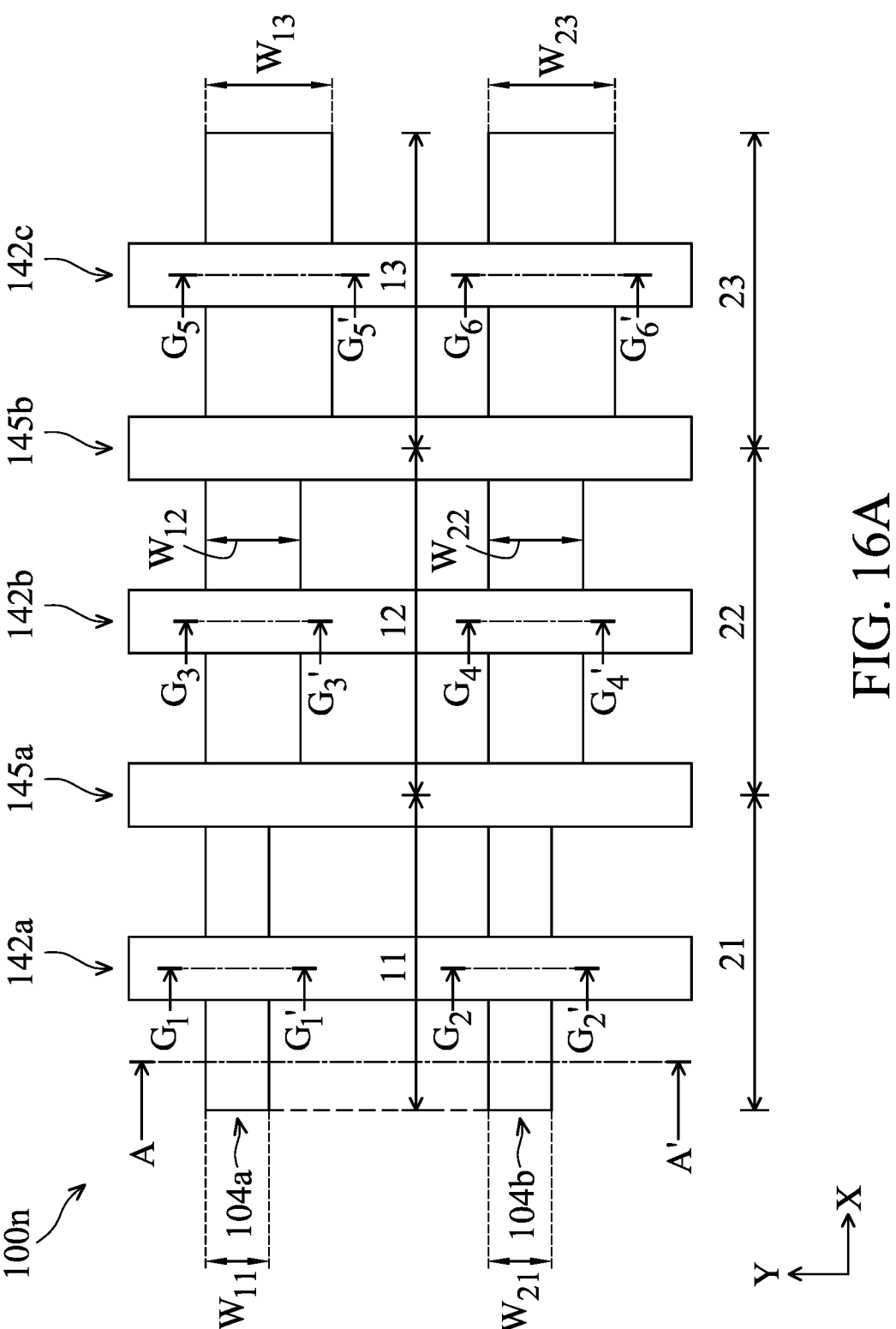
FIG. 16A shows a top-view representation of a semiconductor structure, in accordance with some embodiments.
Figures 16B, 16C:
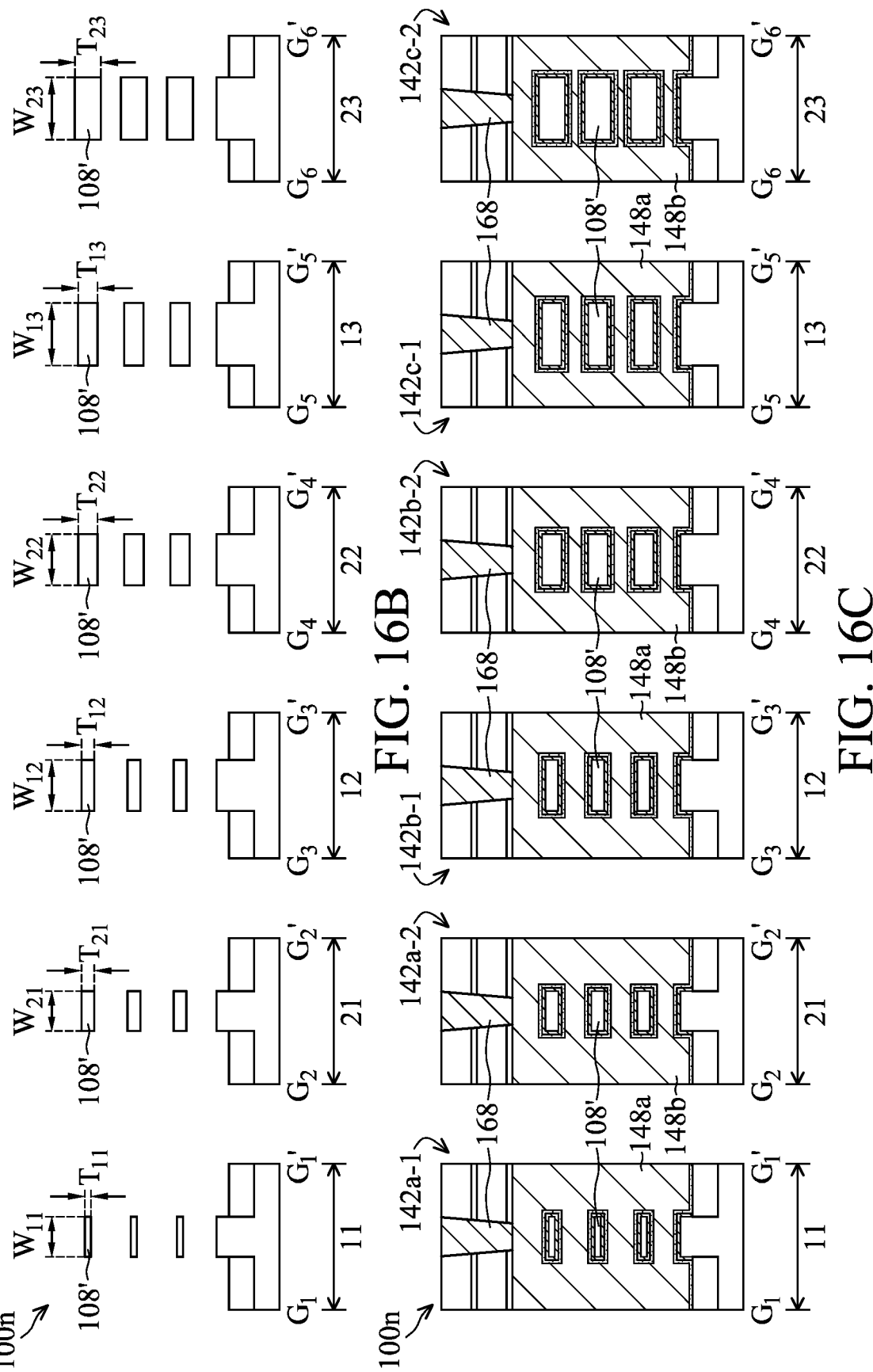
FIGS. 16B to 16C illustrates a cross-sectional representation of various stages of manufacturing of a semiconductor shown along line $G_1$-$G_1$', $G_2$-$G_2$', $G_3$-$G_3$', $G_4$-$G_4$', $G_5$-$G_5$, and $G_6$-$G_6$' in FIG. 16A, in accordance with some embodiments.

FIG. 16A shows a top-view representation of a semiconductor structure 100*n*, in accordance with some embodiments. FIGS. 16B to 16C illustrates a cross-sectional representation of various stages of manufacturing of the semiconductor 100*n* shown along line $G_1$-$G_1$', $G_2$-$G_2$', $G_3$-$G_3$', $G_4$-$G_4$', $G_5$-$G_5$, and $G_6$-$G_6$' in FIG. 16A, in accordance with some embodiments.

The semiconductor structure 100*n* in FIGS. 16A to 16C includes elements that are similar to, or the same as, elements of the semiconductor structure 1001 of FIGS. 14A to 14C. The difference between FIGS. 16A to 16C and FIGS. 14A to 14C is that the width $W_{12}$ is greater than the width $W_{11}$, and the width $W_{13}$ is greater than the width $W_{12}$. In addition, the width $W_{22}$ is greater than the width $W_{21}$, and the width $W_{23}$ is greater than the width $W_{22}$. In some embodiments, the width Wni is substantially equal to the width $W_{21}$. In some embodiments, the width $W_{12}$ is substantially equal to the width $W_{22}$. In some embodiments, the width $W_{13}$ is substantially equal to the width $W_{23}$. In some embodiments, the width $W_{13}$ is substantially equal to the width $W_{23}$. In some embodiments, a ratio of the width $W_{12}$ to the width Wni is in a range from about 1.1 to about 3. In some embodiments, a ratio of the width $W_{13}$ to the width $W_{12}$ is in a range from about 1.1 to about 3.

It should be appreciated that the semiconductor structures 100*a* to 100*n* having nanostructures 108' (or channel layers) in different region with different widths and different thicknesses for performing different functions described above may also be applied to FinFET devices, Forksheet devices or complementary field-effect transistor (or CFET) devices, although not shown in the figures. The first device may be GAA device, and the second device may be Forksheet device. The first device may be GAA device, and the second device may be complementary field-effect transistor (or CFET) device.

It should be noted that same elements in FIGS. 1A to 16C may be designated by the same numerals and may include similar or the same materials and may be formed by similar or the same processes; therefore such redundant details are omitted in the interest of brevity. In addition, although FIGS. 1A to 16C are described in relation to the method, it will be appreciated that the structures disclosed in FIGS. 1A to 16C are not limited to the method but may stand alone as structures independent of the method. Similarly, although the methods shown in FIGS. 1A to 16C are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes a first fin structure and a second fin structure formed over a substrate. The first fin structure includes first nanostructures, and the second fin structure includes second nanostructures along a first direction (e.g. x-axis). . A first gate structure formed over the first nanostructures and a first S/D structure adjacent to the first gate structure. A second gate structure formed over the second nanostructures along the second direction (e.g. y-axis). A gate spacer layer is adjacent to the first gate structure. One of the first nanostructures has a first thickness directly below the first gate structure along a vertical direction, and one of the second nanostructures has a second thickness directly below the second gate structure along the vertical direction. The first thickness is smaller than the second thickness. In addition, the first width of the first nanostructures along the second direction is smaller than the second width of the second nanostructures along the second direction. In order to fulfill different needs in different regions, the first gate structure is formed for power efficiency, and the second gate structure is formed for high speed performance. The first gate structure and second gate structure co-exist to achieve multi-nanostructures for speed performance and power efficiency. Therefore, the performance of the semiconductor structure is improved.

In some embodiments, a semiconductor structure is provided. The semiconductor structure includes first nanostructures formed over a substrate along a first direction, and second nanostructures adjacent to the first nanostructures along the first direction. The semiconductor structure includes a first gate structure formed over the first nanostructures along a second direction, and each of the first nanostructures has a first width along the second direction. The semiconductor structure includes a second gate structure formed over the second nanostructures along the second direction, and each of the second nanostructures has a second width along the second direction, and the first width is smaller than the second width, wherein each of the first nanostructures has a first thickness directly below the first gate structure along a vertical direction, and each of the second nanostructures has a second thickness directly below the second gate structure along the vertical direction, and the first thickness is smaller than the second thickness.

In some embodiments, a semiconductor provided. The semiconductor structure includes first channel layers formed over a substrate along a first direction, and second channel layers adjacent to the first channel layers and over the substrate. The semiconductor structure includes a first gate structure formed over the first channel layers along a second direction. The semiconductor structure also includes a first gate spacer layer formed adjacent to the first gate structure, and a first thickness of the first channel layers directly below the first gate structure is smaller than a second thickness of the second channel layers directly below the first gate spacer layer.

In some embodiments, a method for forming a semiconductor structure is provided. The method includes forming a first fin structure and a second fin structure over a first region and a second region of a substrate, respectively, and the first fin structure includes first semiconductor material layers and second semiconductor material layers alternately stacked, and the second fin structure includes first semiconductor material layers and second semiconductor material layers alternately stacked. The method includes forming a first dummy gate structure and a second dummy gate structure over the first fin structure and the second fin structure, and forming a first gate spacer layer adjacent to the first dummy gate structure. The method includes removing the first dummy gate structure and the second dummy gate structure to expose the first fin structure and the second fin structure, and removing the second semiconductor material layers to expose the first semiconductor material layers. The method includes removing portions of the first semiconductor material layers in the first region directly below the first dummy gate structure, and forming a first gate structure to surround the first semiconductor material layers. The method includes forming a second gate structure to surround the second semiconductor material layers, wherein each of the first semiconductor material layers has a first thickness directly below the first gate structure in the first region, each of the first semiconductor material layers directly below the second gate structure in the second region has a second thickness, and the first thickness is smaller than a second thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
first nanostructures formed over a substrate along a first direction;
second nanostructures adjacent to the first nanostructures along the first direction;
a first gate structure formed over the first nanostructures along a second direction, at least one of the first nanostructures comprising:
a first portion underlying the first gate structure; and
a second portion extending outward from the first gate structure along the first direction; and
a second gate structure formed over the second nanostructures along the second direction, at least one of the second nanostructures comprising:
a third portion underlying the second gate structure; and a fourth portion extending outward from the second gate structure along the first direction;
wherein the first portion has a first thickness along a vertical direction, the second portion has a second thickness along the vertical direction, the third portion has a third thickness along the vertical direction, the fourth portion has a fourth thickness along the vertical direction, and the first thickness is smaller than the second thickness, the third thickness, and the fourth thickness.

2. The semiconductor structure as claimed in claim 1, further comprising:
a first gate spacer layer adjacent to the first gate structure, wherein each of the first nanostructures has the second thickness directly below the first gate spacer layer.

3. The semiconductor structure as claimed in claim 2, wherein the first gate structure has a continuous sidewall surface in direct contact with the gate spacer layer, and a bottom surface of the continuous sidewall surface of the first gate structure is lower than a bottom surface of the first gate spacer layer.

4. The semiconductor structure as claimed in claim 1, wherein a first number of the first nanostructures directly below the first gate structure is smaller than a second number of the second nanostructures directly below the second gate structure.

5. The semiconductor structure as claimed in claim 1, further comprising:
third nanostructures formed adjacent to the second nanostructures, wherein each of the third nanostructures has a third width along the second direction, and the second width is smaller than the third width.

6. The semiconductor structure as claimed in claim 5, wherein:
at least one of the third nanostructures comprises:
a fifth portion underlying a third gate structure and having a fifth thickness; and
a sixth portion extending outward from the third gate structure along the first direction and having a sixth thickness;
wherein the third thickness is smaller than the fifth thickness.

7. The semiconductor structure as claimed in claim 1, further comprising:
a dielectric structure formed between the first gate structure and the second gate structure, wherein a bottom surface of the dielectric structure is lower than a bottommost surface of the first gate structure.

8. The semiconductor structure as claimed in claim 1, further comprising:
a first S/D structure formed adjacent to the first gate structure; and
a second S/D structure formed adjacent to the second gate structure, wherein the first S/D structure has a first depth, the second S/D structure has a second depth, and the first depth is smaller than the second depth.

9. The semiconductor structure as claimed in claim 1, further comprising:
a semiconductor material layer formed below a bottommost first nanostructure, wherein the semiconductor material layer and the first bottommost first nanostructure are made of different materials.

10. A semiconductor structure, comprising:
first channel layers positioned over a substrate along a first direction;
second channel layers positioned over the substrate and adjacent to the first channel layers;

a first gate structure formed over the first channel layers along a second direction;

a second gate structure over the second channel layers along the second direction;

a first gate spacer layer formed adjacent to the first gate structure, wherein a first thickness of a first channel layer of the first channel layers underlying the first gate structure is smaller than a second thickness of the first channel layer underlying the first gate spacer layer; and a second gate spacer layer adjacent to the second gate structure, wherein the first thickness of the first channel layer is smaller than a third thickness of a second channel layer of the second channel layers underlying the second gate structure and is smaller than a fourth thickness of the second channel layer underlying the second gate spacer layer.

11. The semiconductor structure as claimed in claim 10, wherein each of the first channel layers has a first width along the second direction, each of the second channel layers has a second width along the second direction, and the first width is smaller than the second width.

12. The semiconductor structure as claimed in claim 11, further comprising:

third channel layers adjacent to the second channel layers, wherein each of the third channel layers has a third width along the second direction, and the second width is smaller than the third width.

13. The semiconductor structure as claimed in claim 10, wherein the first gate structure has a continuous sidewall surface in direct contact with the first gate spacer layer, and a bottom surface of the continuous sidewall surface of the first gate structure is lower than a bottom surface of the gate spacer layer.

14. The semiconductor structure as claimed in claim 10, further comprising:

a first S/D structure formed adjacent to the first channel layers; and a second S/D structure formed adjacent to the second channel layers, wherein the first S/D structure has a first depth, the second S/D structure has a second depth, and the first depth is smaller than the second depth.

15. The semiconductor structure as claimed in claim 10, further comprising:

a first dielectric structure and a second dielectric structure formed between the first gate structure and the second gate structure, wherein a bottom surface of the first dielectric structure is lower than a bottommost surface of the first gate structure.

16. The semiconductor structure as claimed in claim 10, further comprising:

a semiconductor material layer formed below a bottommost first channel layer, wherein the semiconductor material layer and the bottommost first channel layer are made of different materials.

17. The semiconductor structure as claimed in claim 10, wherein a first number of the first channel layers is smaller than a second number of the second channel layers.

18. A method for forming a semiconductor structure, comprising:

forming a first fin structure over a first region of a substrate, the first fin structure comprising first semiconductor material layers and second semiconductor material layers alternately stacked;

forming a second fin structure over a second region of the substrate, the second fin structure comprising third semiconductor material layers and fourth semiconductor material layers alternately stacked;

forming a first dummy gate structure over the first fin structure;

forming a second dummy gate structure over the second fin structure;

forming a first gate spacer layer adjacent to the first dummy gate structure;

removing the first dummy gate structure and the second dummy gate structure to expose the first fin structure and the second fin structure;

removing the second semiconductor material layers to form a first opening exposing the first semiconductor material layers;

removing the fourth semiconductor material layers to form a second opening exposing the third semiconductor material layers;

forming a mask covering the third semiconductor material layers and exposing the first semiconductor material layers;

removing portions of the first semiconductor material layers in the first region through the mask to form an expanded first opening;

forming a first gate structure in the expanded first opening to surround the first semiconductor material layers; and forming a second gate structure in the second opening to surround the third semiconductor material layers, wherein each of the first semiconductor material layers has a first thickness underlying the first gate structure in the first region, each of the third semiconductor material layers has a second thickness underlying the second gate structure in the second region, and the first thickness is smaller than the second thickness.

19. The method for forming the semiconductor structure as claimed in claim 18, wherein each of the first semiconductor material layers has a third thickness underlying the first gate spacer layer, and the third thickness is greater than the first thickness.

20. The method for forming the semiconductor structure as claimed in claim 18, further comprising:

forming a first S/D structure adjacent to the first dummy gate structure in the first region; and forming a second S/D structure adjacent to the second dummy gate structure in the second region, wherein the first S/D structure has a first depth, the second S/D structure has a second depth, and the first depth is smaller than the second depth.

* * * * *